(12) United States Patent
Yeh et al.

(10) Patent No.: US 10,134,847 B2
(45) Date of Patent: Nov. 20, 2018

(54) FINFET STRUCTURES AND METHODS OF FORMING THE SAME

(71) Applicant: Taiwan Semiconductor Manufacturing Company, Ltd., Hsinchu (TW)

(72) Inventors: Chih Chieh Yeh, Taipei (TW); Cheng-Yi Peng, Taipei (TW); Tsung-Lin Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/589,788

(22) Filed: May 8, 2017

(65) Prior Publication Data

US 2017/0243941 A1    Aug. 24, 2017

Related U.S. Application Data

(62) Division of application No. 14/739,928, filed on Jun. 15, 2015, now Pat. No. 9,647,071.

(51) Int. Cl.
*H01L 29/66* (2006.01)
*H01L 29/15* (2006.01)
(Continued)

(52) U.S. Cl.
CPC ...... *H01L 29/155* (2013.01); *H01L 21/30604* (2013.01); *H01L 21/76224* (2013.01);
(Continued)

(58) Field of Classification Search
CPC ............ H01L 29/155; H01L 29/66545; H01L 21/30604; H01L 29/7851; H01L 29/1054; H01L 27/0886
See application file for complete search history.

(56) References Cited

U.S. PATENT DOCUMENTS 7,002,207 B2    2/2006    Kim et al.
7,425,740 B2    9/2008    Liu et al.
(Continued)

FOREIGN PATENT DOCUMENTS

JP        2010283343 A    12/2010
KR    1020140097521 A     8/2014
(Continued)

*Primary Examiner* — David Vu
(74) *Attorney, Agent, or Firm* — Slater Matsil, LLP

(57) ABSTRACT

FinFETs and methods of forming finFETs are described. According to some embodiments, a structure includes a channel region, first and second source/drain regions, a dielectric layer, and a gate electrode. The channel region includes semiconductor layers above a substrate. Each of the semiconductor layers is separated from neighboring ones of the semiconductor layers, and each of the semiconductor layers has first and second sidewalls. The first and second sidewalls are aligned along a first and second plane, respectively, extending perpendicularly to the substrate. The first and second source/drain regions are disposed on opposite sides of the channel region. The semiconductor layers extend from the first source/drain region to the second source/drain region. The dielectric layer contacts the first and second sidewalls of the semiconductor layers, and the dielectric layer extends into a region between the first plane and the second plane. The gate electrode is over the dielectric layer.

20 Claims, 84 Drawing Sheets

(51) Int. Cl.

| | |
|---|---|
| *H01L 21/306* | (2006.01) |
| *H01L 27/088* | (2006.01) |
| *H01L 29/10* | (2006.01) |
| *H01L 29/78* | (2006.01) |
| *H01L 21/8238* | (2006.01) |
| *H01L 21/762* | (2006.01) |
| *H01L 27/092* | (2006.01) |
| *H01L 29/08* | (2006.01) |

(52) U.S. Cl.
CPC ........ *H01L 21/823807* (2013.01); *H01L 21/823821* (2013.01); *H01L 21/823878* (2013.01); *H01L 27/0886* (2013.01); *H01L 27/0924* (2013.01); *H01L 29/0847* (2013.01); *H01L 29/1054* (2013.01); *H01L 29/6656* (2013.01); *H01L 29/66545* (2013.01); *H01L 29/66636* (2013.01); *H01L 29/66795* (2013.01); *H01L 29/7842* (2013.01); *H01L 29/7851* (2013.01)

(56) References Cited

U.S. PATENT DOCUMENTS

| | | | |
|---|---|---|---|
| 7,518,195 B2 * | 4/2009 | Ernst | H01L 29/42384 257/347 |
| 7,667,271 B2 | 2/2010 | Yu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,415,718 B2 | 4/2013 | Xu | |
| 8,440,517 B2 | 5/2013 | Lin et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,680,576 B2 | 3/2014 | Ching et al. | |
| 8,703,565 B2 | 4/2014 | Chang et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,064,944 B2 | 6/2015 | Kim et al. | |
| 9,391,176 B2 * | 7/2016 | Flachowsky | H01L 29/66818 |
| 9,431,512 B2 | 8/2016 | Koh et al. | |
| 2006/0292765 A1 | 12/2006 | Blanchard et al. | |
| 2010/0295024 A1 | 11/2010 | Pernel et al. | |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0183600 A1 | 7/2014 | Huang et al. | |
| 2014/0225065 A1 | 8/2014 | Rachmady et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2015/0069327 A1 | 3/2015 | Cheng et al. | |
| 2016/0079422 A1 | 3/2016 | Rachmady et al. | |
| 2016/0190345 A1 | 6/2016 | Le et al. | |

FOREIGN PATENT DOCUMENTS

| | | |
|---|---|---|
| TW | 201342602 A | 10/2013 |
| TW | 201347046 A | 11/2013 |

* cited by examiner

FINFET STRUCTURES AND METHODS OF FORMING THE SAME

This application is a divisional application of U.S. patent application Ser. No. 14/739,928, filed on Jun. 15, 2015, entitled "FINFET Structures and Methods of Forming the Same," which application is incorporated herein by reference in its entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (finFETs) or multiple gate transistors are being researched and implemented. However, with this new device structure and the continuous shrinking of even finFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 27A, 27B, and 27C are various 3D and cross-sectional views of a result of a fourth example etch step of FIG. 20 in accordance with some embodiments.

FIGS. 35A, 35B, and 35C are various 3D and cross-sectional views of a result of an eighth example etch step of FIG. 20 in accordance with some embodiments.

DETAILED DESCRIPTION

Figure 1A:
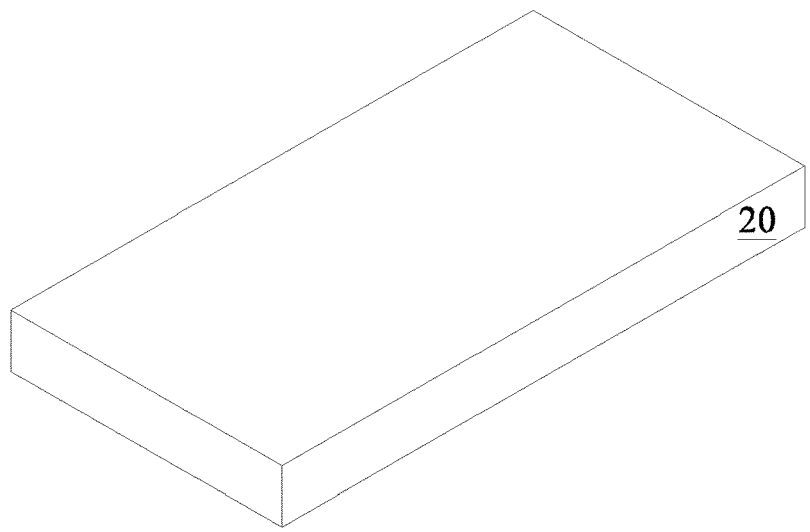
FIGS. 1A, 1B, 2A, 2B, 3A, 3B, 4A, and 4B are various three-dimensional (3D) and cross-sectional views of intermediate stages in the manufacturing of a fin, which comprises a superlattice, for a fin Field-Effect Transistor (finFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (finFETs) and methods of forming the same are provided in accordance with various embodiments. Intermediate stages of forming finFETs are illustrated. Some embodiments discussed herein are discussed in the context of finFETs formed using a gate-last process. Some embodiments contemplate aspects used in a gate-first process. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Some embodiments contemplate both n-type devices, such as n-type finFETs, and p-type devices, such as p-type finFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIGS. 1A, 2A, 3A, and 4A are various three-dimensional (3D) views of intermediate stages in the manufacturing of a fin, which comprises a superlattice that may include strained layers, for a finFET in accordance with some embodiments, and FIGS. 1B, 2B, 3B, and 4B are respective cross-sectional views of the 3D views of FIGS. 1A, 2A, 3A, and 4A, respectively. FIG. 5 is a process flow chart of the manufacturing of the fin.

Figure 1B:
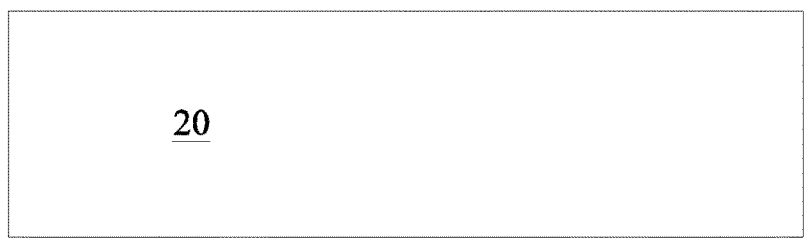

In FIGS. 1A and 1B and step 100 of FIG. 4, a substrate 20 is provided. The substrate 20 may be a semiconductor substrate, such as a bulk semiconductor substrate, a semiconductor-on-insulator (SOI) substrate, a multi-layered or gradient substrate, or the like. The substrate 20 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 20 may be doped or un-doped. In a specific example, the substrate 20 is a bulk silicon substrate, which may be a wafer.

Figure 2A:
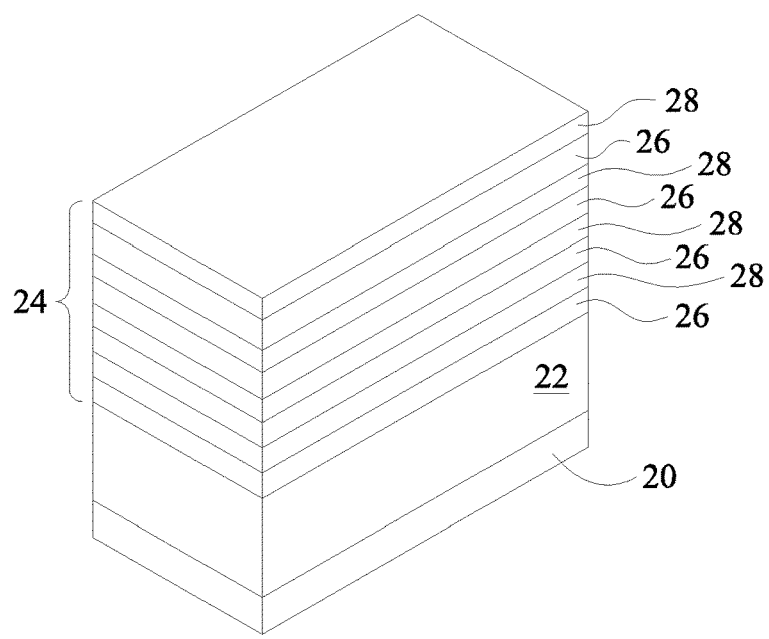
Figure 2B:
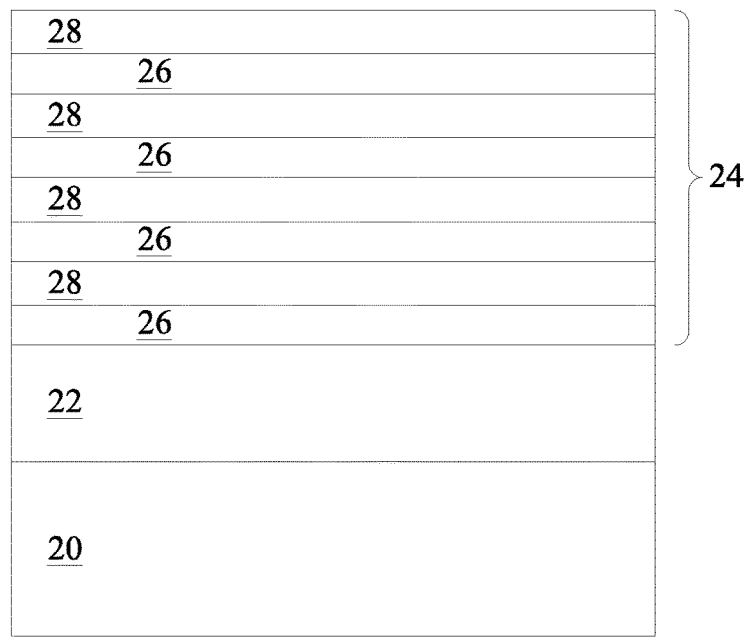

In FIGS. 2A and 2B and step 102 of FIG. 5, a buffer layer 22 is formed on the substrate 20 in a 3D and cross-sectional view, respectively. The buffer layer 22, in some embodiments, is epitaxially grown on the substrate 20. The epitaxial growth can use Metal-Organic Chemical Vapor Deposition (MOCVD), Molecular Beam Epitaxy (MBE), Liquid Phase Epitaxy (LPE), Vapor Phase Epitaxy (VPE), Ultra-High-Vacuum Chemical Vapor Deposition (UHVCVD), the like, or a combination thereof. The buffer layer 22 can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like. The buffer layer 22 can be a crystalline material and can have a natural lattice constant that is mismatched to the natural lattice constant of the crystalline material of the substrate 20 on which the buffer layer 22 is grown. The buffer layer 22 can be a relaxed material, which may result from plastic relaxation, for example. The buffer layer 22 can have a uniform composition or a varying composition, such as a graded composition. A graded composition may be substantially linearly graded or discrete-step graded. The buffer layer 22 can have a thickness greater than a critical thickness such that a surface of the buffer layer 22 distal from the substrate 20 includes a crystalline structure with a relaxed, natural lattice constant. The lattice constant at the surface of the buffer layer 22 distal from the substrate 20 can be as appropriate to induce stress in the superlattice 24, as will be discussed. In some embodiments, the buffer layer 22 can be omitted, such as if the substrate 20 is a crystalline material with a lattice constant appropriate to induce a desired stress in the superlattice 24. In the specific example referenced above, the buffer layer 22 is $Si_{0.75}Ge_{0.25}$ at the surface distal from the substrate 20, is relaxed, and has a thickness in a range from about 50 nm to about 500 nm, such as about 100 nm.

Although not specifically illustrated, appropriate wells may be formed in the buffer layer 22 and/or substrate 20. For example, a p-well may be formed in a first region of the substrate 20 where n-type devices, such as n-type finFETs, are to be formed, and an n-well may be formed in a second region of the substrate 20 where p-type devices, such as p-type finFETs, are to be formed.

For example, to form a p-well in the first region, a photoresist can formed over the buffer layer 22 in the second region of the substrate 20. The photoresist can be patterned to expose the first region of the substrate 20. The photoresist can be formed by using a spin-on technique and can be patterned using acceptable photolithography techniques. Once the photoresist is patterned, a p-type impurity implant can be performed in the first region, and the photoresist may act as a mask to substantially prevent p-type impurities from being implanted into the second region. The p-type impurities may be boron, $BF_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form an n-well in the second region, a photoresist can be formed over the buffer layer 22 in the first region of the substrate 20. The photoresist can be patterned to expose the second region of the substrate 20. The photoresist can be formed by using a spin-on technique and can be patterned using acceptable photolithography techniques. Once the photoresist is patterned, an n-type impurity implant may be performed in the second region, and the photoresist may act as a mask to substantially prevent n-type impurities from being implanted into the first region. The n-type impurities may be phosphorus, arsenic, or the like implanted in the second region to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form a p-well in the first region and an n-well in the second region.

In other embodiments, a p-well and an n-well may be formed in situ during the epitaxial growth of the buffer layer 22. The buffer layer 22 in the different regions where different wells are to be formed can be epitaxially grown in different growth steps to allow for the different doping types to be in the different regions.

Further in FIGS. 2A and 2B and step 104 of FIG. 5, a superlattice 24 is formed on the buffer layer 22. The superlattice 24 includes alternating first layers 26 and second layer 28. Each of the first layers 26 and the second layers 28, in some embodiments, is epitaxially grown on its underlying layer. The epitaxial growth can use MOCVD, MBE, LPE, VPE, UHVCVD, the like, or a combination thereof. Each of the first layers 26 and the second layers 28 can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like. The superlattice 24 can include any number of first layers 26 and any number of second layers 28. As illustrated, the superlattice 24 has four first layers 26 and four second layer 28.

Each of the first layers 26 and the second layers 28 can be a crystalline material. In some embodiments, a natural lattice constant of one respective group of the first layers 26 or the second layers 28 is larger than the lattice constant of the surface of the buffer layer 22 distal from the substrate 20 (or the substrate 20 if the buffer layer 22 is omitted), and a natural lattice constant of the other one respective group of the first layers 26 or the second layers 28 is smaller than the lattice constant of the surface of the buffer layer 22 distal from the substrate 20 (or the substrate 20 if the buffer layer 22 is omitted). Hence, in these embodiments, the first layers 26 can be strained a first strain type, and the second layers 28 are strained a second strain type opposite from the first strain type. Further in these embodiments, each of the first layers 26 and the second layers 28 can have a thickness less than a critical thickness, such as in a range from about 3 nm to 20 nm.

In some embodiments, a natural lattice constant of the crystalline material of the first layer 26 is larger than the lattice constant of the surface of the buffer layer 22 distal from the substrate 20 (or the substrate 20 if the buffer layer 22 is omitted), and a natural lattice constant of the crystalline material of the second layer 28 is smaller than the lattice constant of the surface of the buffer layer 22 distal from the substrate 20 (or the substrate 20 if the buffer layer 22 is omitted). Hence, in these embodiments, the first layers 26 can be compressively strained, and the second layers 28 can be tensilely strained.

In other embodiments, a natural lattice constant of the crystalline material of the first layer 26 is smaller than the lattice constant of the surface of the buffer layer 22 distal from the substrate 20 (or the substrate 20 if the buffer layer 22 is omitted), and a natural lattice constant of the crystalline material of the second layer 28 is larger than the lattice constant of the surface of the buffer layer 22 distal from the substrate 20 (or the substrate 20 if the buffer layer 22 is omitted). Hence, the first layers 26 can be tensilely strained, and the second layers 28 can be compressively strained.

In the specific example referenced above, each of the first layers 26 is a layer of $Si_{0.50}Ge_{0.50}$, which has a natural lattice constant larger than the $Si_{0.75}Ge_{0.25}$ of the buffer layer 22, having a thickness less than a critical thickness, such as in a range from about 3 nm to 20 nm. Hence, in the specific example, the first layers 26 are compressively strained. Further in the specific example referenced above, each of the second layers 28 is a layer of Si, which has a natural lattice constant smaller than the $Si_{0.75}Ge_{0.25}$ of the buffer layer 22, having a thickness less than a critical thickness, such as in a range from about 3 nm to 20 nm. Hence, in the specific example, the second layers 28 are tensilely strained.

In further embodiments, one or both of the groups of the first layers 26 or the second layers 28 have a natural lattice constant of the respective crystalline material that is substantially equal to the lattice constant of the surface of the buffer layer 22 distal from the substrate 20 (or the substrate 20 if the buffer layer 22 is omitted). Hence, one or both of the groups of the first layers 26 or the second layers 28 can be relaxed. In some embodiments, the first layers 26 are each relaxed, while the second layers 28 are compressively or tensilely strained. In other embodiments, the second layers 28 are each relaxed, while the first layers 26 are compressively or tensilely strained. In further embodiments, each of the first layers 26 and the second layers 28 is relaxed.

In some embodiments, the material of the first layers 26 is different from the material of the second layers 28. The difference in materials may allow for the different strains as described above, and/or may allow for an etch selectivity between the first layers 26 and second layers 28, as will be apparent below.

Figure 3A:
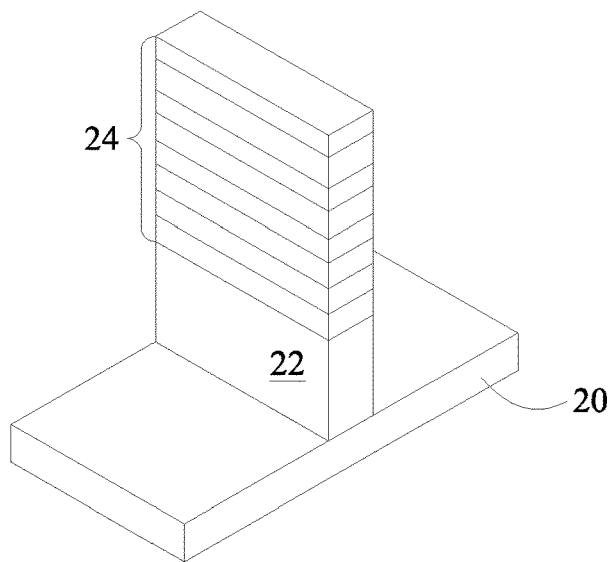
Figure 3B:
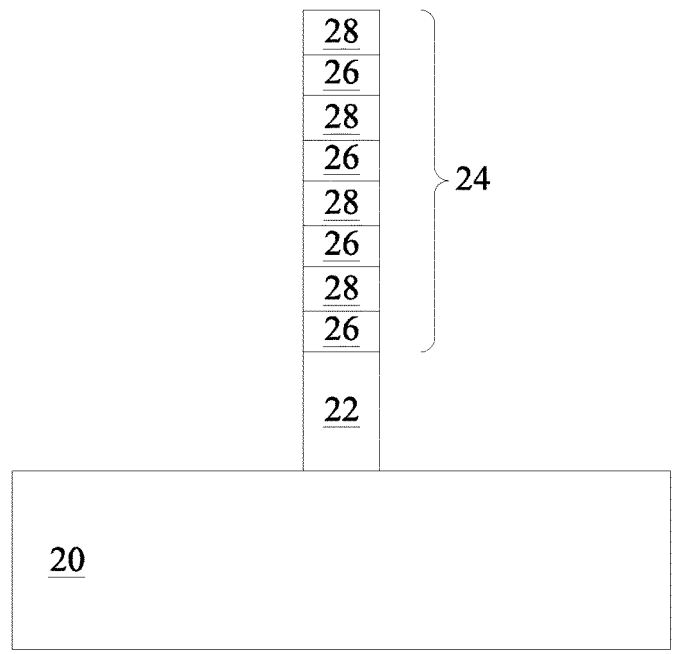

In FIGS. 3A, 3B, and step 106 in FIG. 5, a fin that includes the superlattice 24 is formed by forming trenches in the superlattice 24 and on opposing sides of the fin. In some embodiments, the fin may be formed by etching the trenches through the superlattice 24 and into the buffer layer 22, but not completely through the buffer layer 22. In some embodiments, the trenches can extend through the superlattice 24 and the buffer layer 22 but not into the substrate 20. In some embodiments, the trenches can extend through the superlattice 24 and the buffer layer 22 and into the substrate 20. The etching may be any acceptable etch process, such as a reactive ion etch (RIE), neutral beam etch (NBE), the like, or a combination thereof. The etch may be anisotropic.

Figure 4A:
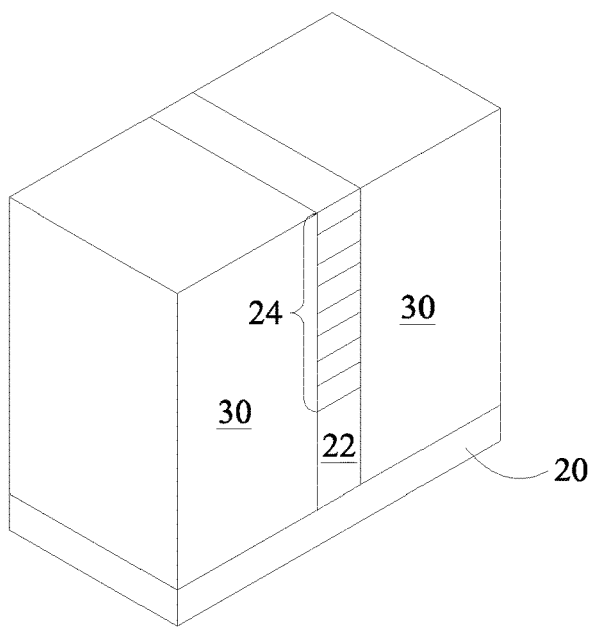
Figure 4B:
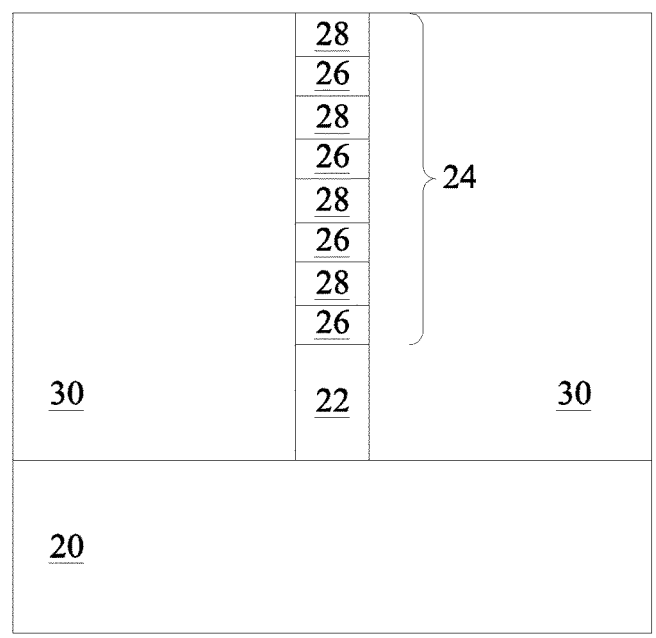
Figure 5:
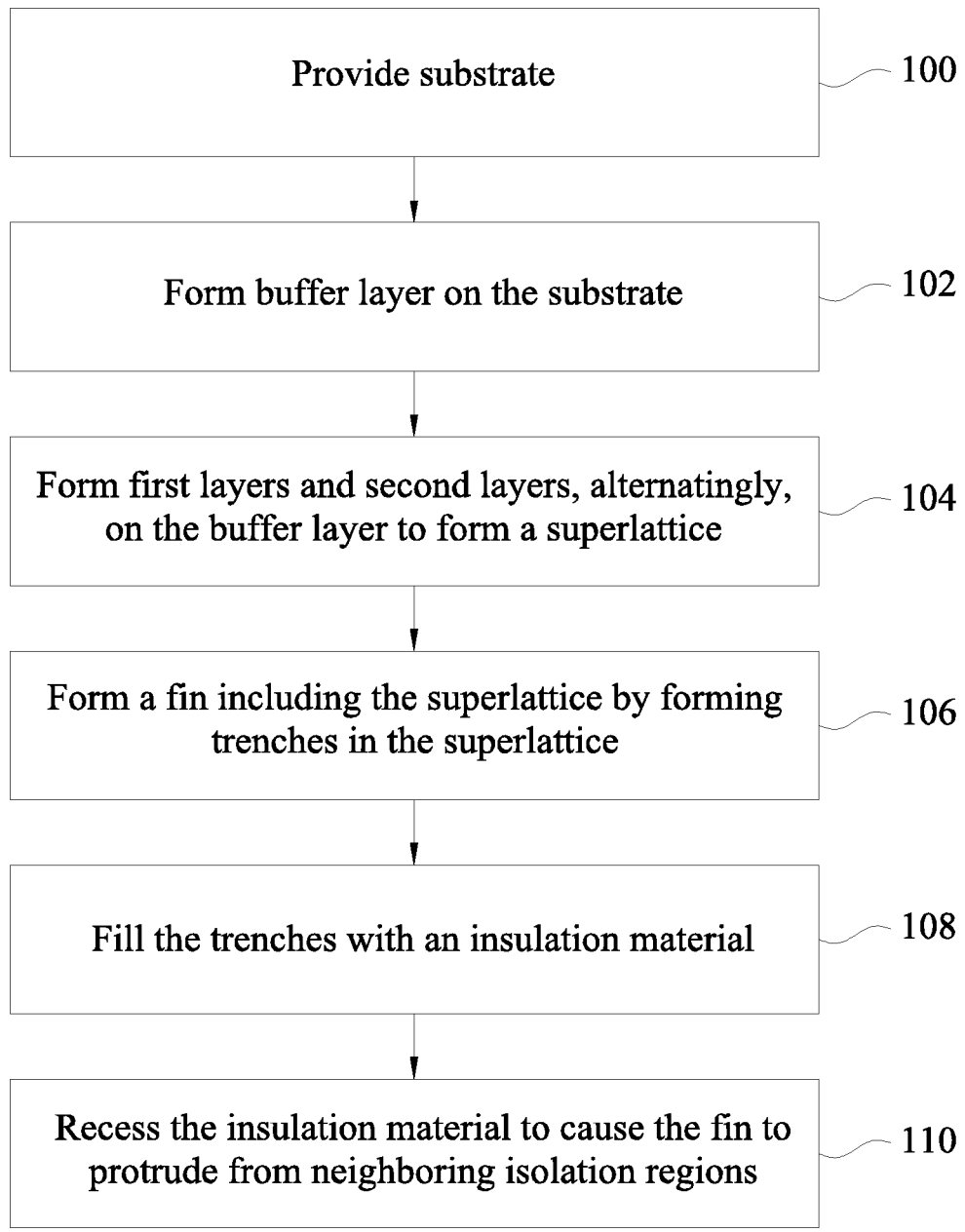
FIG. 5 is a process flow chart of the manufacturing of the fin manufactured in FIGS. 1A-B through 4A-B in accordance with some embodiments.

In FIGS. 4A, 4B, and step 108 in FIG. 5, the trenches are filled with an insulation material 30. The insulation material 30 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 30 is silicon oxide formed by a FCVD process. An anneal process may be performed once the insulation material 30 is formed. Further, a planarization process, such as a chemical mechanical polish (CMP), may remove any excess insulation material and form top surfaces of the insulation material 30 and a top surface of the fin that are co-planar.

Figure 11A:
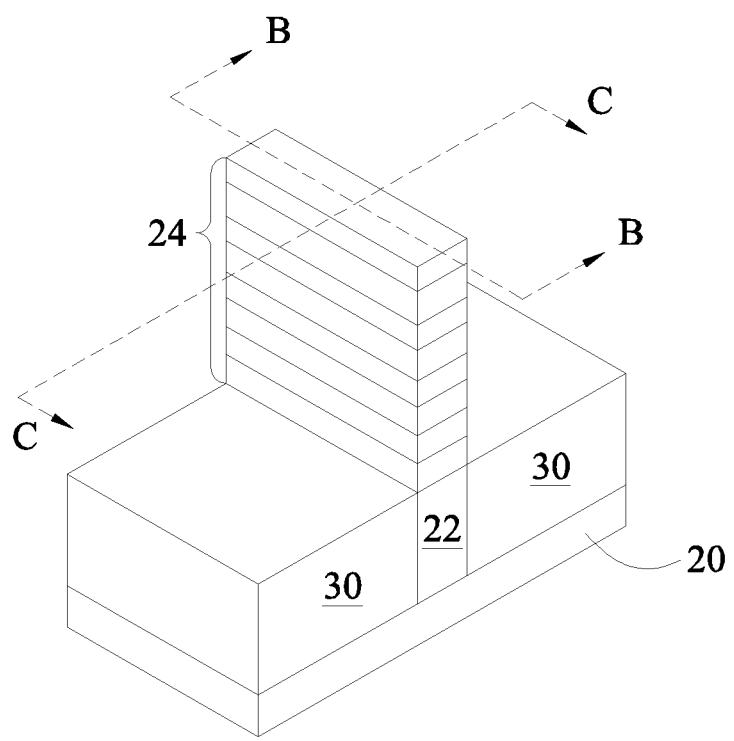
FIGS. 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, and 18C are various 3D and cross-sectional views of intermediate stages in the manufacturing of a finFET, which comprises a superlattice channel region, in accordance with some embodiments.
Figure 11B:
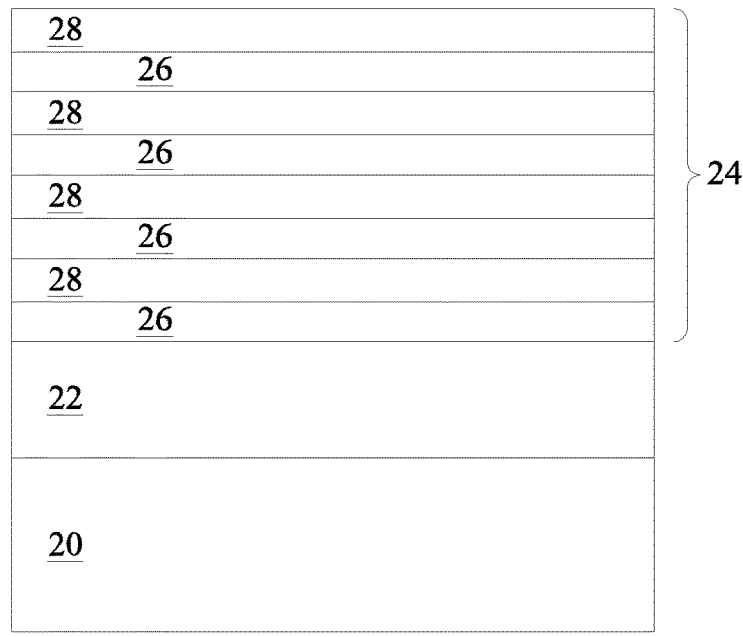
Figure 11C:
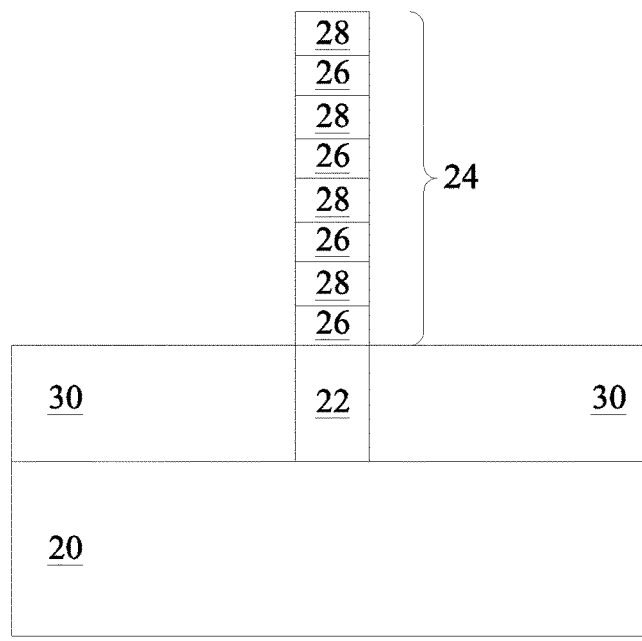

In step 110 of FIG. 5, and as will be illustrated in FIGS. 11A, 11B, and 11C, the insulation material 30 is recessed to cause the fin, e.g., one or more of the first layers 26 and second layers 28 of the superlattice 24, to protrude from between neighboring isolation regions 30, which may be referred to as Shallow Trench Isolation (STI) regions. The isolation regions 30 may be recessed using an acceptable etching process, such as one that is selective to the insulation material 30. For example, a chemical oxide removal using a CERTAS® etch or an Applied Materials SICONI tool or dilute hydrofluoric (dHF) acid may be used.

FIGS. 6A, 7A, 8A, and 9A are various 3D views of intermediate stages in the manufacturing of a fin, which comprises a superlattice that may include strained layers, for a finFET in accordance with other embodiments, and FIGS. 6B, 7B, 8B, and 9B are respective cross-sectional views of the 3D views of FIGS. 6A, 7A, 8A, and 9A, respectively. FIG. 10 is a process flow chart of the manufacturing of the fin.

Figure 6A:
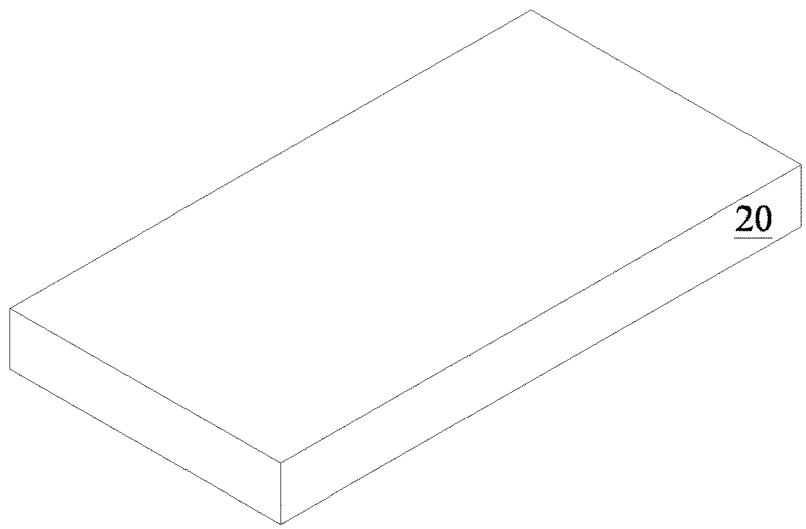
FIGS. 6A, 6B, 7A, 7B, 8A, 8B, 9A, and 9B are various 3D and cross-sectional views of intermediate stages in the manufacturing of a fin, which comprises a superlattice, for a finFET in accordance with some embodiments.
Figure 6B:
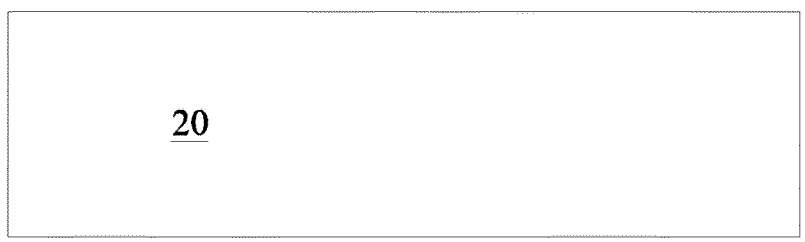
Figure 7A:
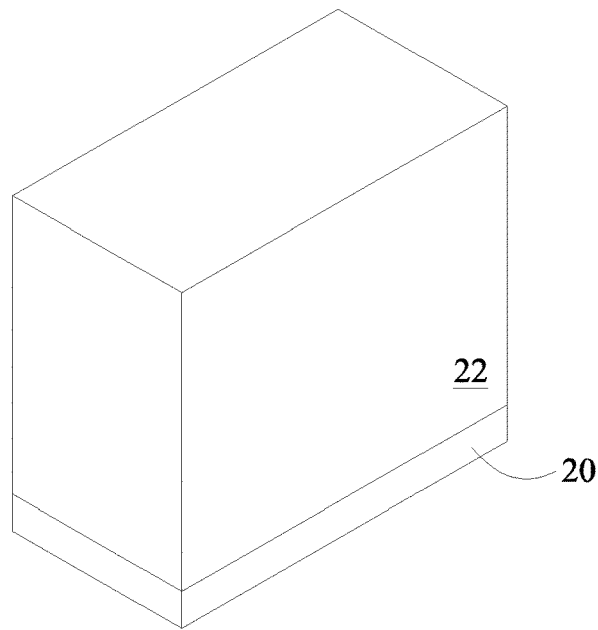
Figure 7B:
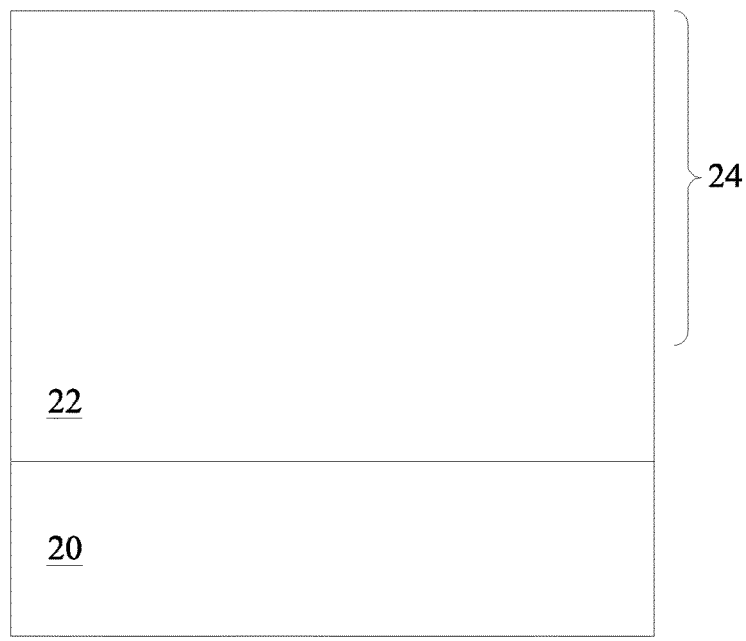

In FIGS. 6A and 6B and step 120 of FIG. 10, a substrate 20 is provided, as discussed above with respect to FIGS. 1A and 1B and step 100 of FIG. 5. In FIGS. 7A and 7B and step 122 of FIG. 10, a buffer layer 22 is formed on the substrate 20. The buffer layer 22 can be formed of by the processes and can include the materials as discussed above with respect to FIGS. 2A and 2B and step 102 of FIG. 5. The buffer layer 22, in this embodiment, has a lower portion that will remain as a portion of a fin and additionally includes an upper portion that will serve as a sacrificial fin, as will be described subsequently. The lower portion of the buffer layer 22 can have features as described for the buffer layer 22 with respect to FIGS. 2A and 2B. The upper portion of the buffer layer 22 can be any material composition, such as a same composition as the subsequently formed surface of the lower portion distal from the substrate 20. Although not specifically illustrated, appropriate wells may be formed in the buffer layer 22 and/or substrate 20, such as by implantation or in situ during growth, as previously discussed.

Figure 8A:
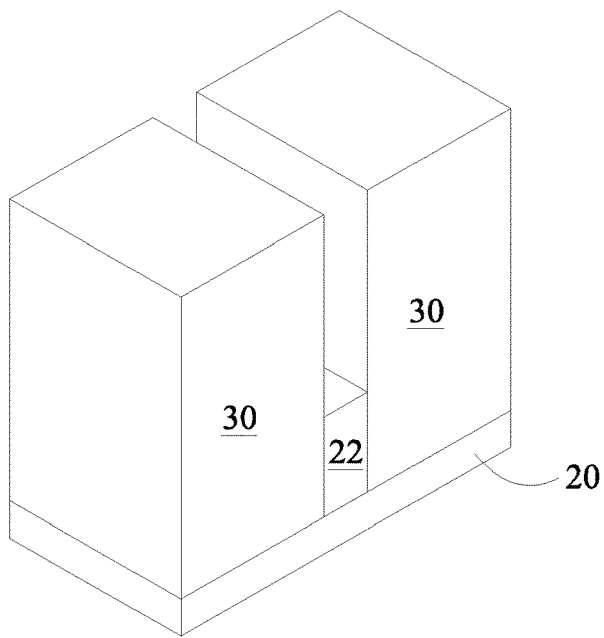
Figure 8B:
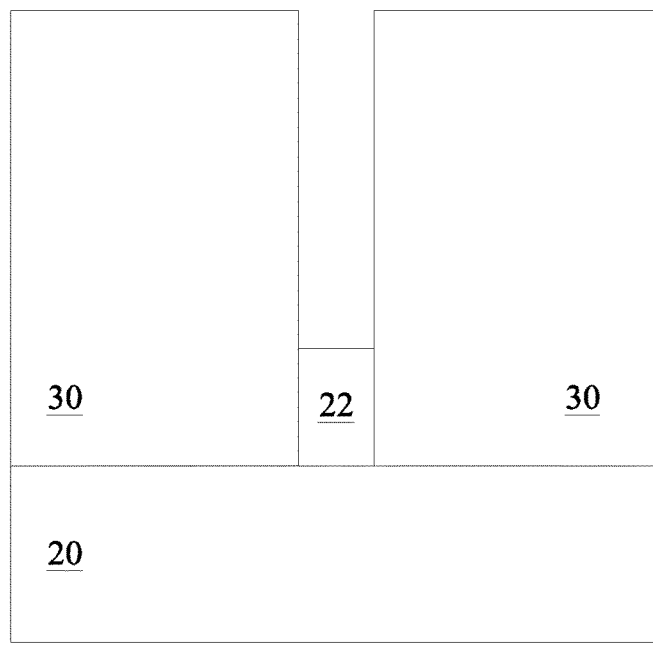

In FIGS. 8A, 8B, and step 124 in FIG. 10, trenches are formed in the buffer layer 22 to form a sacrificial fin from the buffer layer 22. In some embodiments, the sacrificial fin may be formed by etching the trenches into, but not completely through, the buffer layer 22. In some embodiments, the trenches can extend through the buffer layer 22 but not into the substrate 20. In some embodiments, the trenches can extend through the buffer layer 22 and into the substrate 20. The etching may be any acceptable etch process, such as a RIE, NBE, the like, or a combination thereof. The etch may be anisotropic.

Further in FIGS. 8A, 8B, and step 126 in FIG. 10, the trenches are filled with an insulation material 30. The insulation material 30 may be an oxide, such as silicon oxide, a nitride, the like, or a combination thereof, and may be formed by a HDP-CVD, FCVD, the like, or a combination thereof. Other insulation materials formed by any acceptable process may be used. In the illustrated embodiment, the insulation material 30 is silicon oxide formed by a FCVD process. An anneal process may be performed once the insulation material 30 is formed. Further, a planarization process, such as a CMP, may remove any excess insulation material and form top surfaces of the insulation material 30 and a top surface of the sacrificial fin that are co-planar.

Further in FIGS. 8A, 8B, and step 128 in FIG. 10, the sacrificial fin is recessed to form a recess between the insulation material 30. The recessing may use an acceptable etching process, such as one that is selective to the sacrificial fin. The etching may be a wet or dry process and may be isotropic. The recessing of the sacrificial fin results in a lower portion of the buffer layer 22 remaining between the isolation regions 30 as illustrated. This recessing forms the surface of the buffer layer 22 distal from the substrate 20 as previously discussed.

Figure 9A:
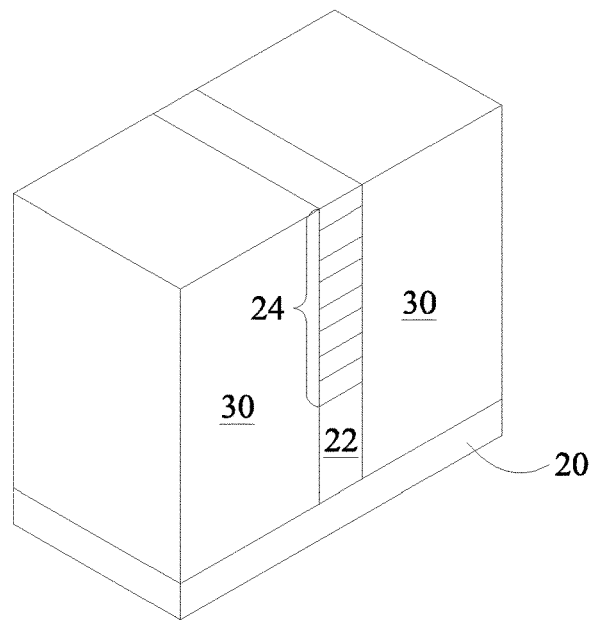
Figure 9B:
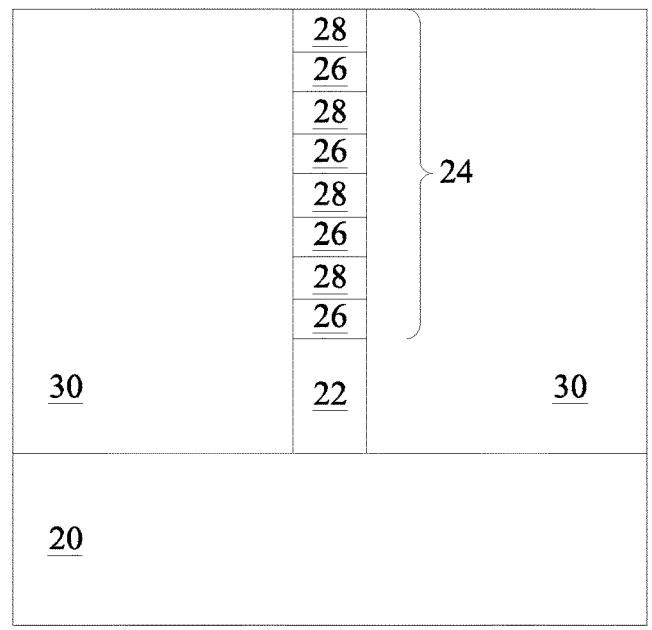
Figure 10:
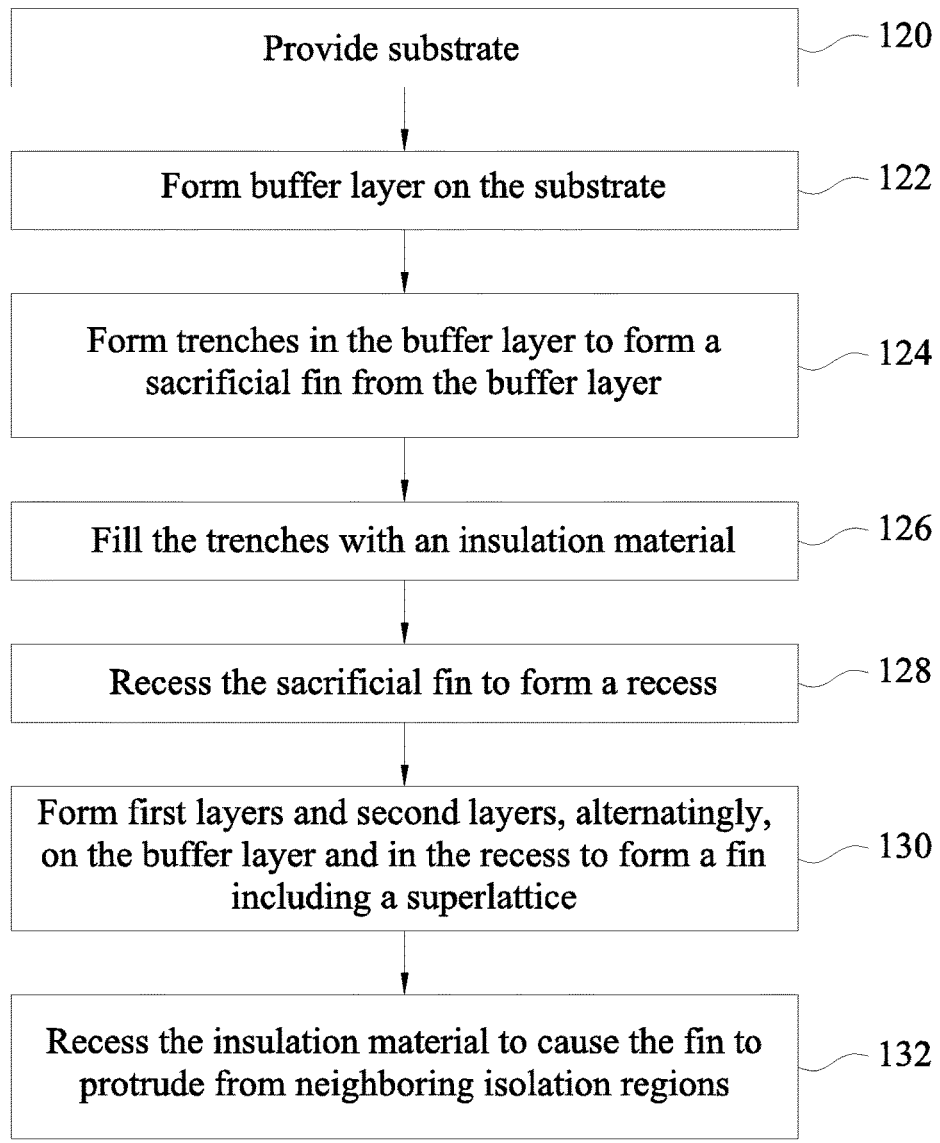
FIG. 10 is a process flow chart of the manufacturing of the fin manufactured in FIGS. 6A-B through 9A-B in accordance with some embodiments.

In FIGS. 9A and 9B and step 130 of FIG. 10, a superlattice 24 is formed in the recess between the insulation material 30 and on the buffer layer 22. The superlattice 24 includes alternating first layers 26 and second layer 28. Each of the first layers 26 and the second layers 28 can be formed and can include the materials as previously discussed with respect to FIGS. 2A and 2B. The superlattice 24 can include any number of first layers 26 and any number of second layers 28. As illustrated, the superlattice 24 has four first layers 26 and four second layer 28. The first layers 26 and the second layers 28 can have the natural lattice constants and can be strained or relaxed as discussed with respect to FIGS. 2A and 2B. By forming the superlattice 24 in the recess between the insulation material 30, a fin including the superlattice 24 is formed. A planarization process, such as a CMP, may form top surfaces of the insulation material 30 and the fin that are co-planar.

In step 132 of FIG. 10, and as will be illustrated in FIGS. 11A, 11B, and 11C, the insulation material 30 is recessed to cause the fin, e.g., one or more of the first layers 26 and second layers 28 of the superlattice 24, to protrude from between neighboring isolation regions 30, which may be referred to as STI regions. The isolation regions 30 may be recessed using an acceptable etching process, such as one that is selective to the material of the insulation material 30. For example, a chemical oxide removal using a CERTAS® etch or an Applied Materials SICONI tool or dilute hydrofluoric (dHF) acid may be used.

A person having ordinary skill in the art will readily understand that the processes described above are just examples of how a fin may be formed. In other embodiments, a dielectric layer can be formed over a top surface of the substrate 20; a trench can be etched through the dielectric layer; the buffer layer 22 and the superlattice 24 can be epitaxially grown in the trench; and the dielectric layer can be recessed such that the at least a portion of the superlattice 24 and/or buffer layer 22 protrude from the dielectric layer to form a fin.

FIGS. 11A, 12A, 13A, 14A, 15A, 16A, 17A, and 18A are various 3D views of intermediate stages in the manufacturing of a finFET, which comprises a superlattice channel region, in accordance with some embodiments. FIGS. 11B, 11C, 12B, 12C, 13B, 13C, 14B, 14C, 15B, 15C, 16B, 16C, 17B, 17C, 18B, and 18C are various cross-sectional views of the intermediate stages in the manufacturing of the finFET. FIG. 19 is a process flow chart of the manufacturing of the finFET.

In FIGS. 11A, 11B, and 11C and in step 140 of FIG. 19, a fin including a superlattice 24 is formed. The fin can be formed using the processes discussed above, for example, in FIGS. 5 and 10 and their corresponding structural depictions. FIG. 11A is a 3D view of the fin including the superlattice 24. FIG. 11A illustrates cross-sections B-B and C-C. Cross-section B-B is illustrated in the following figures that end in "B," and cross-section C-C is illustrated in the following figures that end in "C." In the illustrated embodiment, the entirety of the superlattice 24 protrudes from between the neighboring isolation regions 30. In other embodiments, the buffer layer 22 may also protrude from between the neighboring isolation regions 30. Further in the illustrated embodiment, the isolation regions 30 extend to the substrate 20, and in other embodiments, the isolation regions 30 do not extend fully to the substrate 20 such that a continuous portion of the buffer layer 22 is disposed between the isolation regions 30 and a top surface of the substrate 20. In other embodiments, the isolation regions 30 extend into the substrate 20.

Figure 12A:
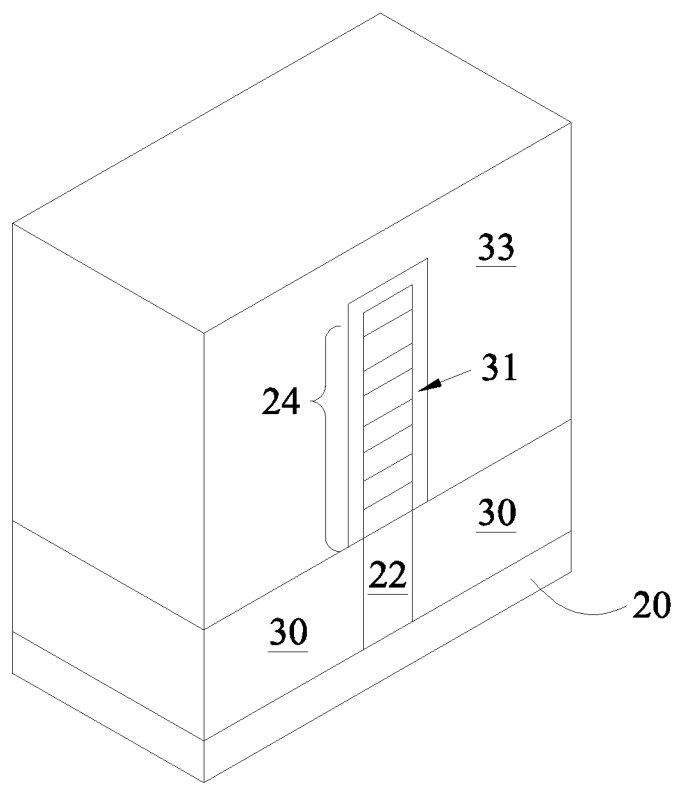
Figure 12B:
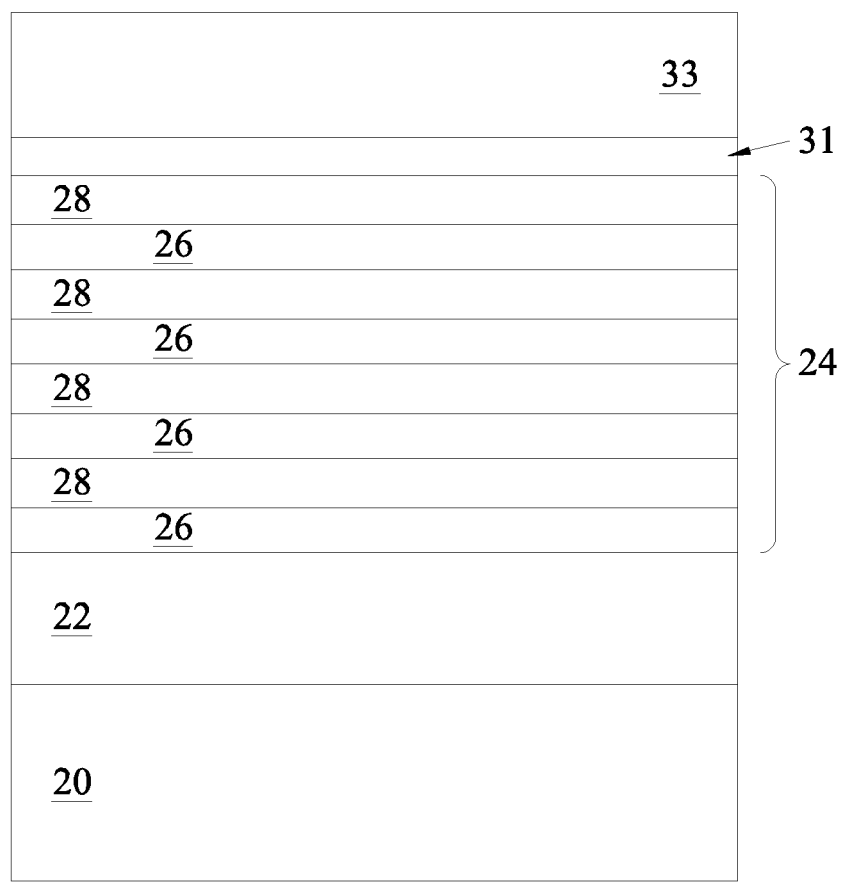
Figure 12C:
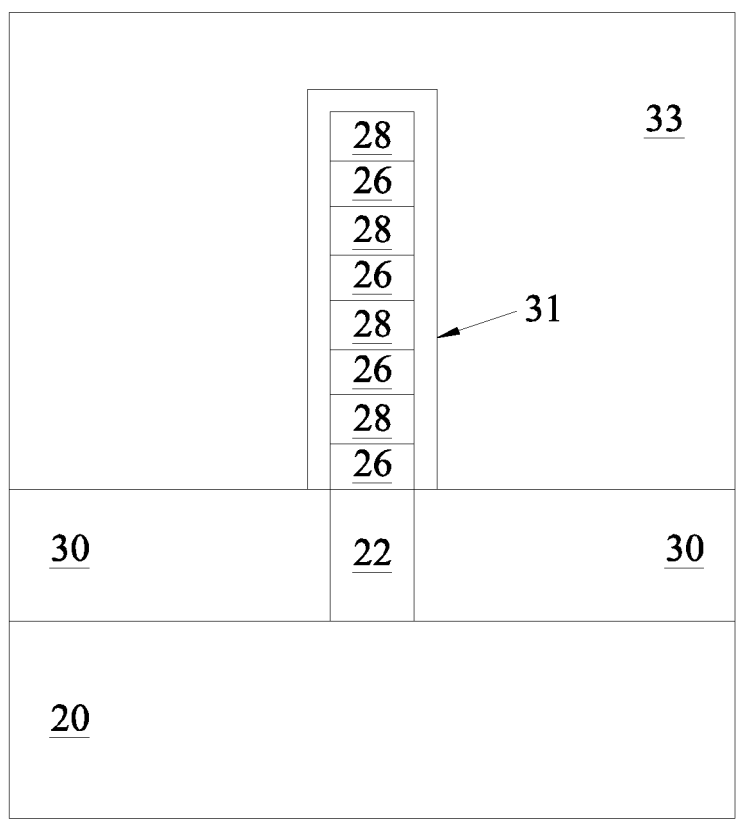

In FIGS. 12A, 12B, and 12C and in step 142 of FIG. 19, a dummy dielectric layer 31 is formed on the fin. The dummy dielectric layer 31 may be, for example, silicon oxide, silicon nitride, a combination thereof, or the like, and may be deposited or thermally grown according to acceptable techniques, such as CVD, thermal oxidation, or the like. Further in FIGS. 12A, 12B, and 12C and in step 144 of FIG. 19, a dummy gate layer 33 is formed over the dummy dielectric layer 31. The dummy gate layer 33 may be deposited, such as by using CVD or the like, over the dummy dielectric layer 31 and then planarized, such as by a CMP. The dummy gate layer 33 may comprise, for example, polysilicon, although other materials that have a high etching selectivity may also be used. Although not illustrated, a mask layer may be formed over the dummy gate layer 33. The mask layer may be deposited, such as by using CVD or the like, over the dummy gate layer 33. The mask layer may comprise, for example, silicon nitride, silicon oxynitride, silicon carbon nitride, or the like.

Figure 13A:
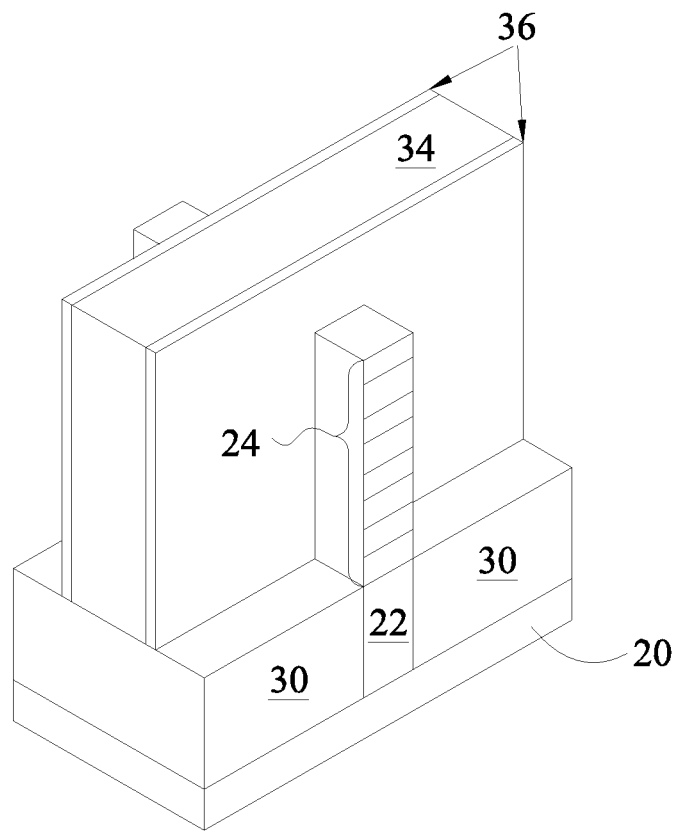
Figure 13B:
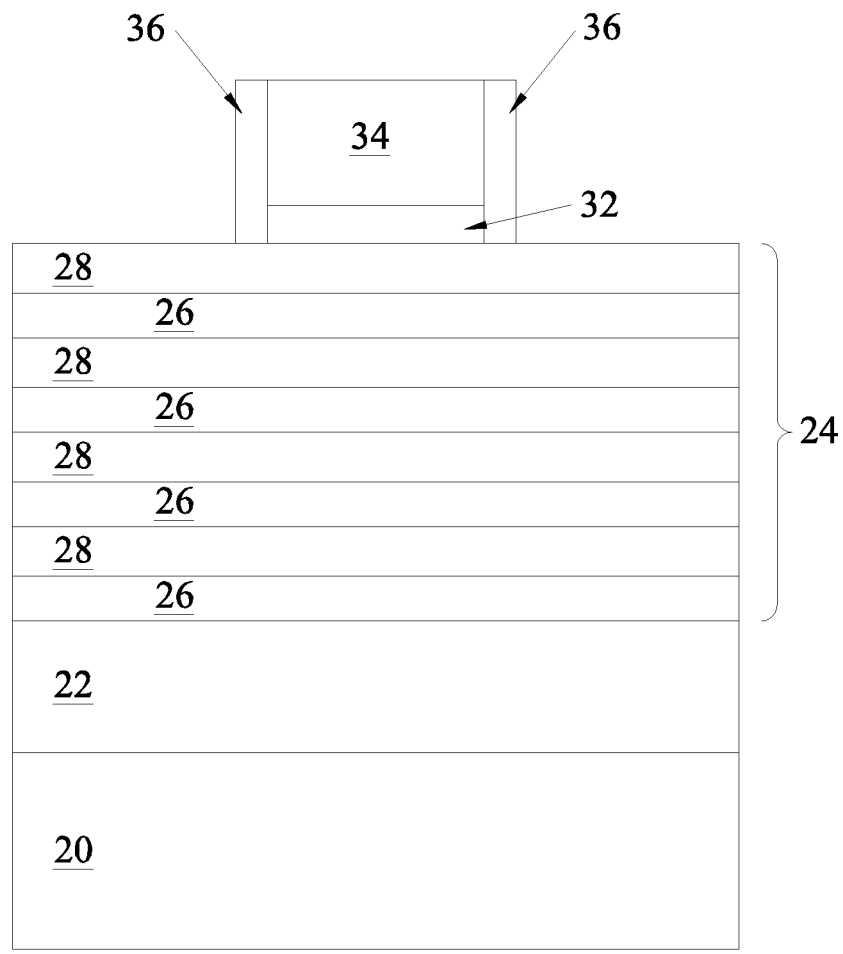
Figure 13C:
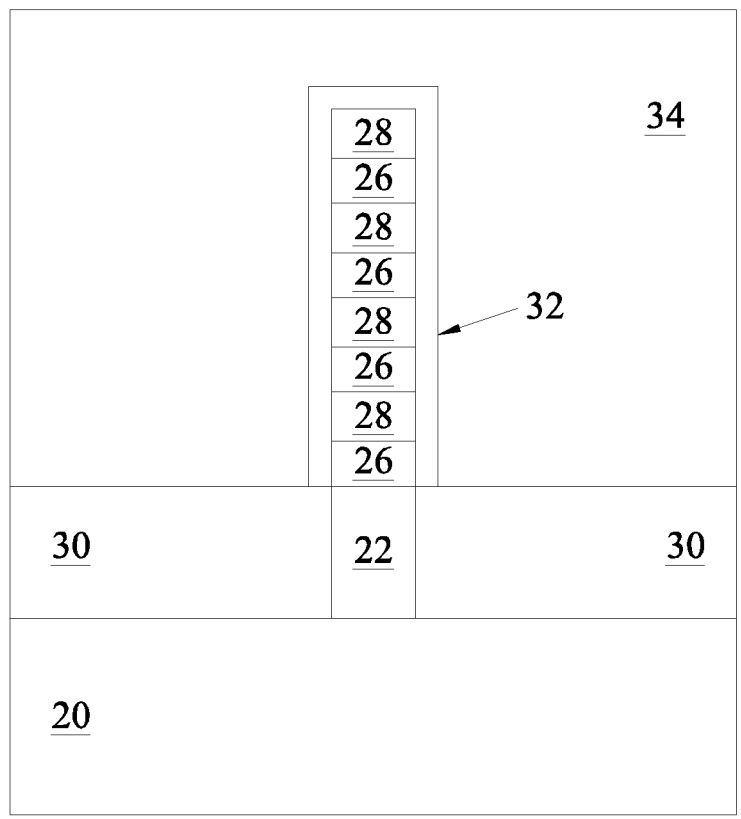

In FIGS. 13A, 13B, and 13C, the mask layer (if used) may be patterned using acceptable photolithography and etching techniques to form a mask. Further, and in step 146 of FIG. 19, the dummy gate layer 33 and dummy dielectric layer 31 may be patterned, such as by transferring the pattern of the mask, by using an acceptable etching technique to form a dummy gate 34 and dummy gate dielectric 32 from the dummy gate layer 33 and the dummy dielectric layer 31, respectively. The etching may comprise an acceptable anisotropic etching, such as RIE, NBE, or the like. The dummy gate 34 covers a channel region of the fin. The dummy gate 34 may also have a lengthwise direction substantially perpendicular to the lengthwise direction of the fin.

Although not specifically illustrated, implants or plasma doping (PLAD) for lightly doped source/drain (LDD) regions may be performed. Similar to the implants discussed above, a mask, such as a photoresist, may be formed over the second region, e.g., for p-type devices, while exposing the first region, e.g., for n-type devices, and n-type impurities may be implanted or introduced by a plasma into an exposed fin in the first region. The mask may then be removed. Subsequently, a mask, such as a photoresist, may be formed over the first region while exposing the second region, and p-type impurities may be implanted or introduced by a plasma into an exposed fin in the second region. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIGS. 13A, 13B, and 13C and in step 148 of FIG. 19, gate spacers 36 are formed along sidewalls of the dummy gate 34 and dummy gate dielectric 32. The gate spacers 36 may be formed by conformally depositing, such as by CVD or the like, a material and subsequently anisotropically etching the material. The material of the gate spacers 36 may be silicon nitride, silicon carbon nitride, a combination thereof, or the like.

Figure 14A:
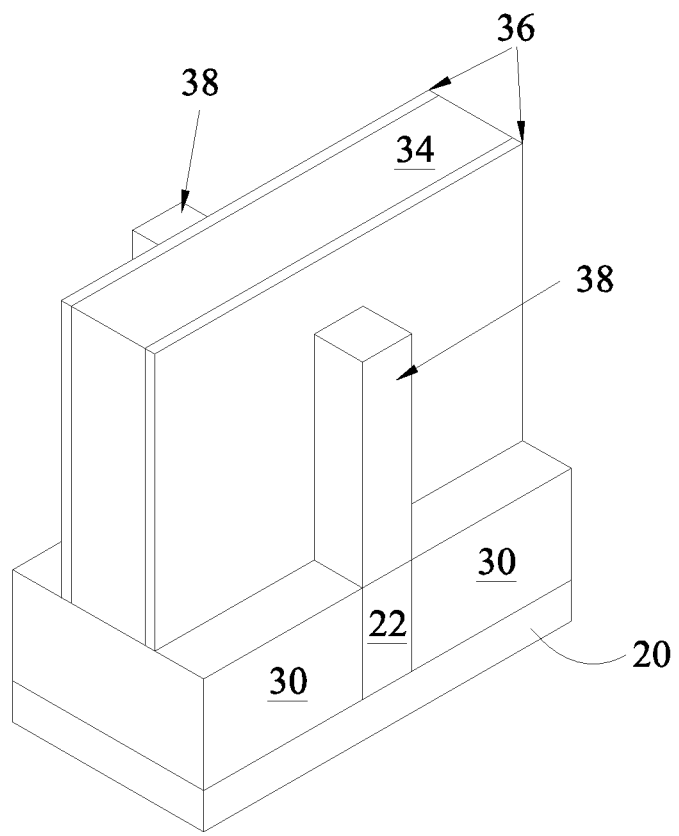
Figure 14B:
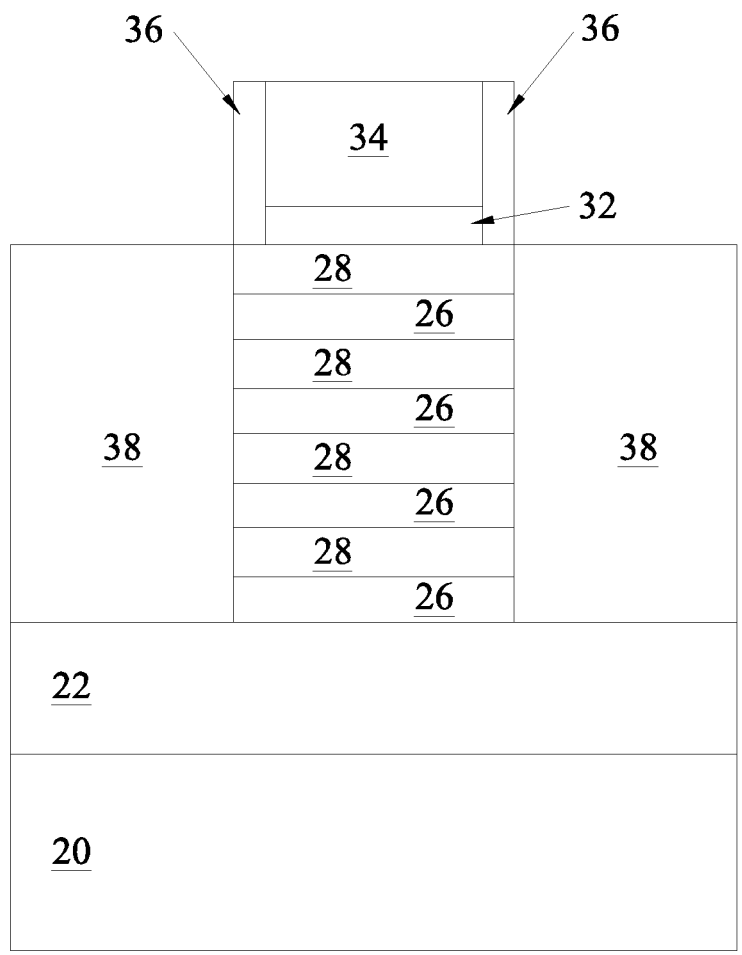
Figure 14C:
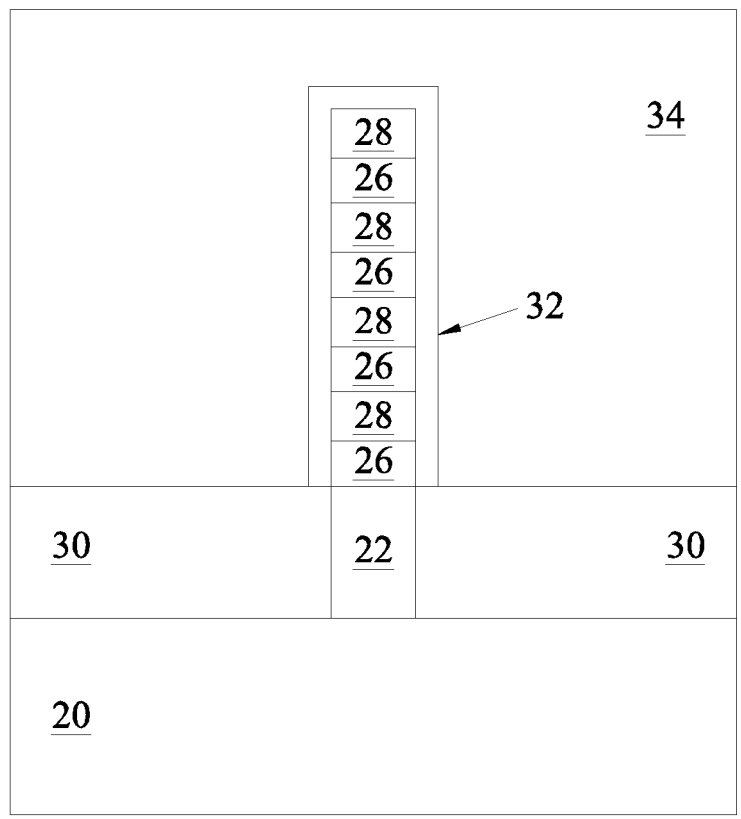

In FIGS. 14A, 14B, and 14C, recesses are formed in the source/drain regions of the fin, as in step 150 of FIG. 19, and epitaxial source/drain regions 38 are formed in the recesses, as in step 152 of FIG. 19. The recesses, and hence, the epitaxial source/drain regions 38, are formed in the source/drain regions of the fin such that the dummy gate 34 is disposed between the recesses. The recesses may be formed using any appropriate etch selective to the fin, e.g., layers of the superlattice 24 protruding from between the isolation regions 30, which may also be anisotropic. The epitaxial source/drain regions 38 are then epitaxially grown in the recesses. The epitaxial growth may be by using MOCVD, MBE, LPE, VPE, the like, or a combination thereof. The epitaxial source/drain regions 38 may comprise any acceptable material, such as appropriate for the device type, e.g., n-type or p-type. For example, the epitaxial source/drain regions 38 for an n-type device may comprise silicon, SiC, SiCP, SiGeP, SiP, SiGeSnP, or the like, and the epitaxial source/drain regions 38 for a p-type device may comprise SiGe, SiGeB, Ge, GeB, GeSn, GeSnB, a boron-doped III-V compound material, or the like. The epitaxial source/drain regions 38 may have surfaces raised from respective outer surfaces of the fin and may have facets.

Although not specifically illustrated, different materials may be used for epitaxial source/drain regions 38 of a p-type device and epitaxial source/drain regions 38 of an n-type device in a complementary device. For example, a first region of the substrate 20 (e.g., where the n-type device is to be formed) can be masked by a first hard mask while a second region of the substrate 20 (e.g., where the p-type device is to be formed) is exposed and processed to form the epitaxial source/drain regions 38 in steps 150 and 152. The first hard mask can then be removed, and a second hard mask can be formed. The second region can be masked by the second hard mask while the first region is exposed and processed to form the epitaxial source/drain regions 38 in steps 150 and 152. The second hard mask can then be removed.

The epitaxial source/drain regions 38 of the fin may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions for an n-type device in the first region may be any of the n-type impurities previously discussed, and the p-type impurities for source/drain regions in for the p-type device in the second region may be any of the p-type impurities previously discussed. In other embodiments, the epitaxial source/drain regions 38 may be in situ doped during growth.

Figure 15A:
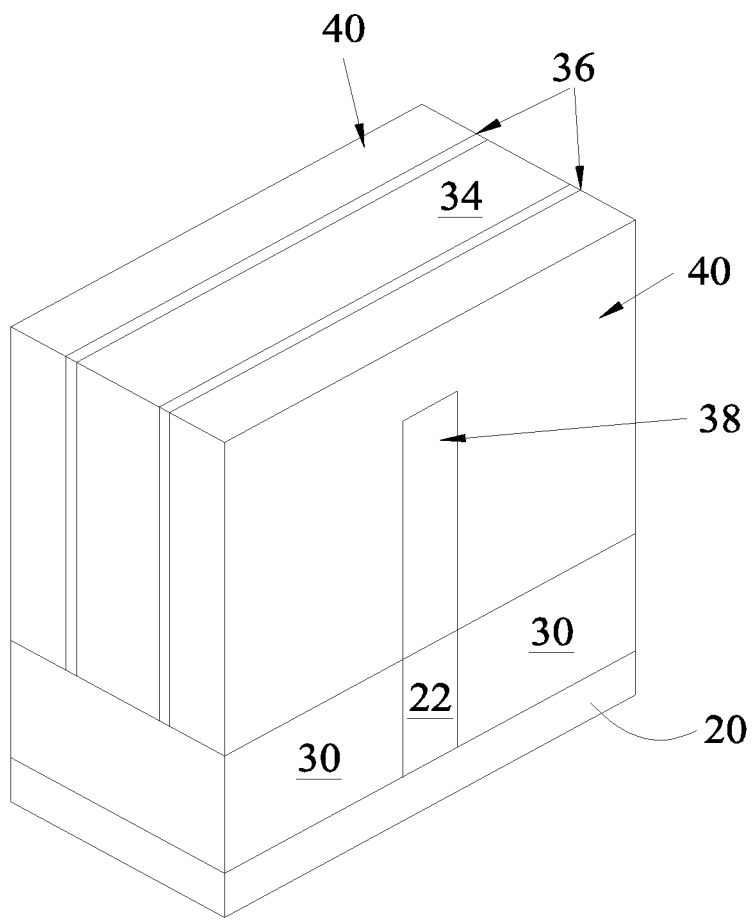
Figure 15B:
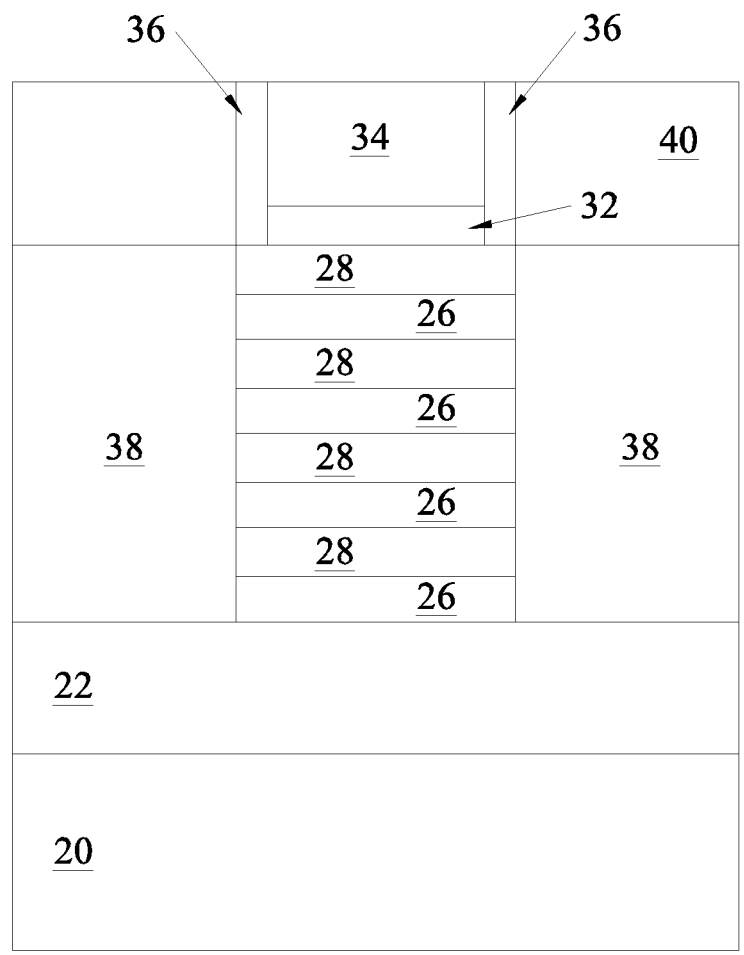
Figure 15C:
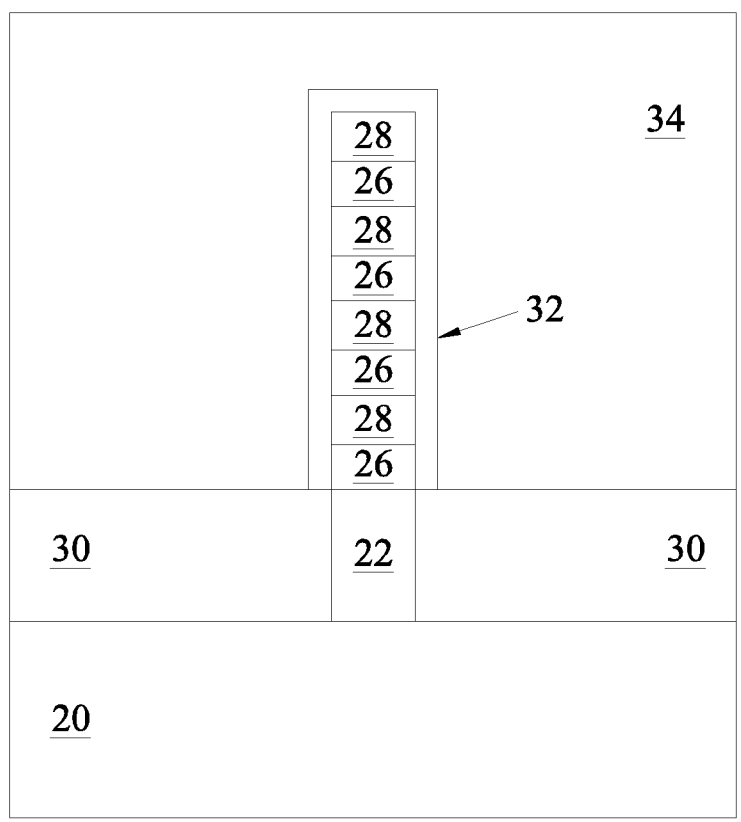

In FIGS. 15A, 15B, and 15C and in step 154 of FIG. 19, a bottom inter-layer dielectric (ILD0) 40 is formed over the fin. The ILD0 40 can comprise a first layer, such as an etch stop layer (ESL), conformally formed on the epitaxial source/drain regions 38, the gate spacers 36, the dummy gate 34 (or mask, if present), and the isolation regions 30. In some embodiments, the ESL 58 may comprise silicon nitride, silicon carbonitride, or the like, formed using Atomic Layer Deposition (ALD), chemical vapor deposition (CVD), the like, or a combination thereof. The ILD0 40 can further comprise a second layer deposited over the first layer. The second layer of the ILD0 40 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Further in FIGS. 15A, 15B, and 15C and in step 154 of FIG. 19, a planarization process, such as a CMP, is performed to level the top surface of ILD0 40 with the top surfaces of the dummy gate 34. The CMP may also remove the mask, if present, from over the dummy gate 34. Accordingly, a top surface of the dummy gate 34 is exposed through the ILD0 40.

Figure 16A:
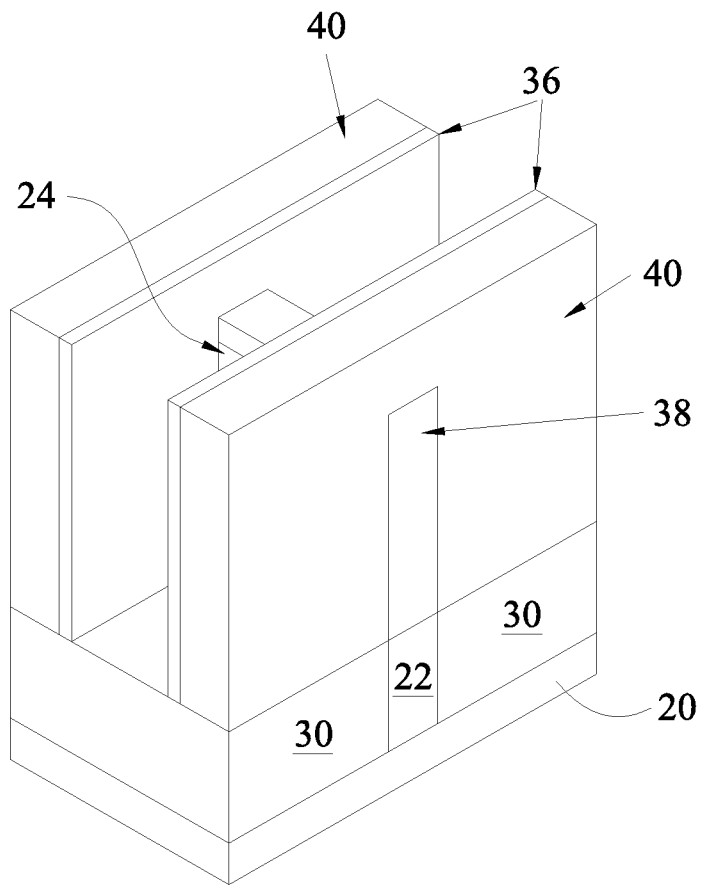
Figure 16B:
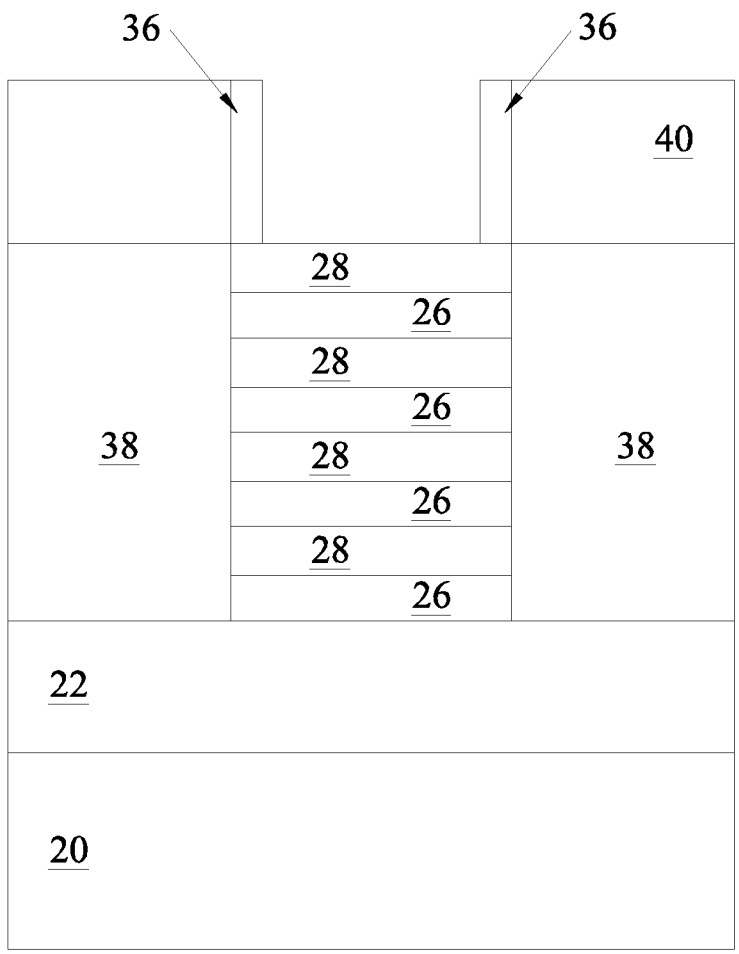
Figure 16C:
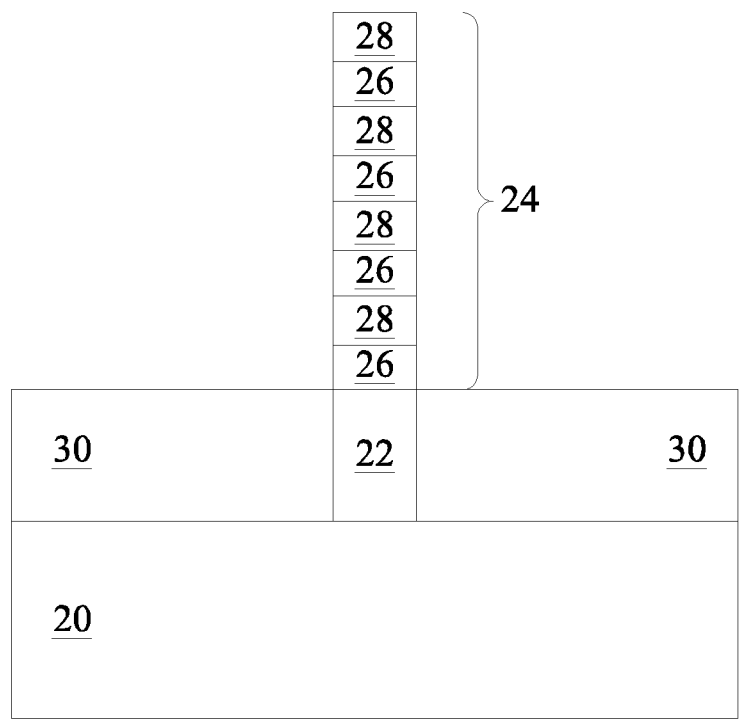

In FIGS. 16A, 16B, and 16C and in step 156 of FIG. 19, the dummy gate 34 and the dummy gate dielectric 32 are removed in an etching step(s), so that an opening through the ILD0 40 and defined by the gate spacers 36 is formed to the fin, e.g., the superlattice 24. The opening exposes a channel region of the fin, e.g., the superlattice 24. The channel region is disposed between the neighboring pair of epitaxial source/drain regions 38. The etching step(s) may be selective to the materials of the dummy gate 34 and the dummy gate dielectric 32, which etching may be a dry or wet etching. During the etching, the dummy gate dielectric 32 may be used as an etch stop layer when the dummy gate 34 is etched. The dummy gate dielectric 32 may then be etched after the removal of the dummy gate 34.

Figure 17A:
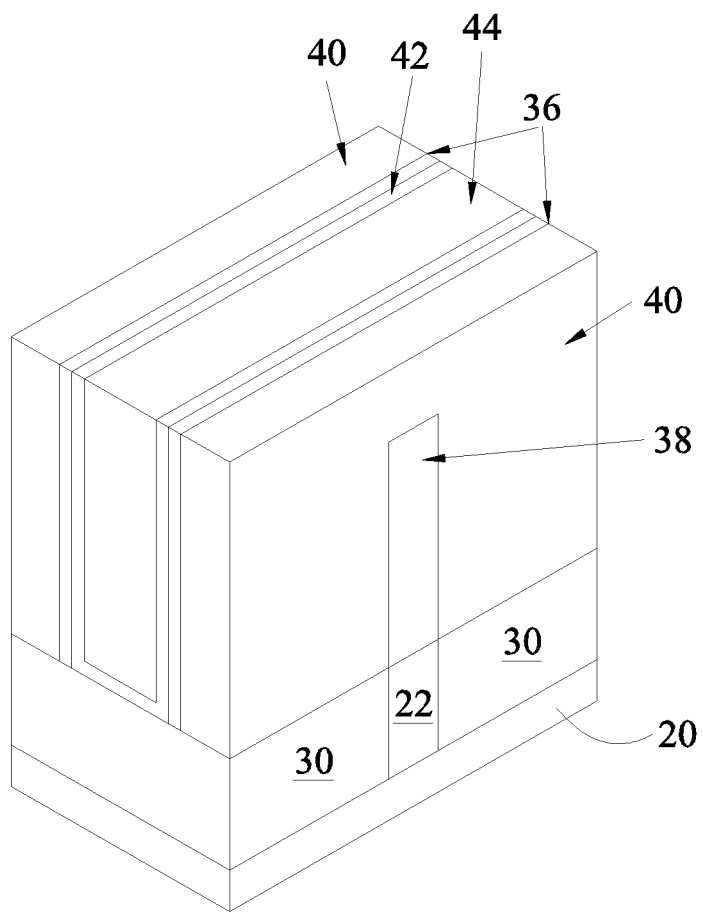
Figure 17B:
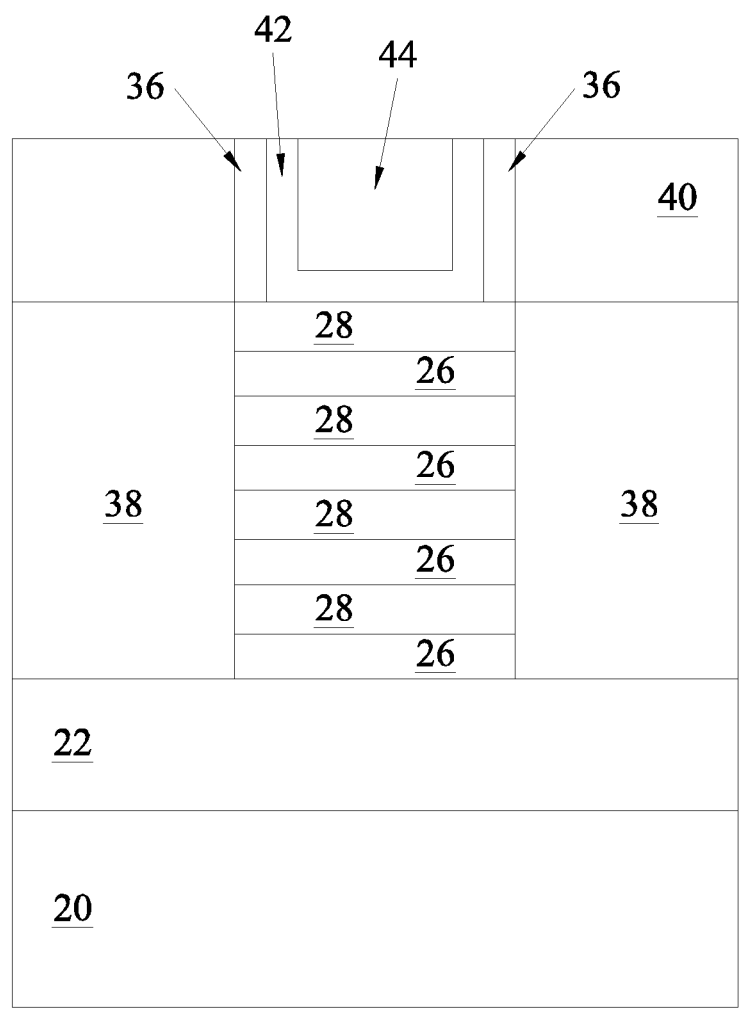
Figure 17C:
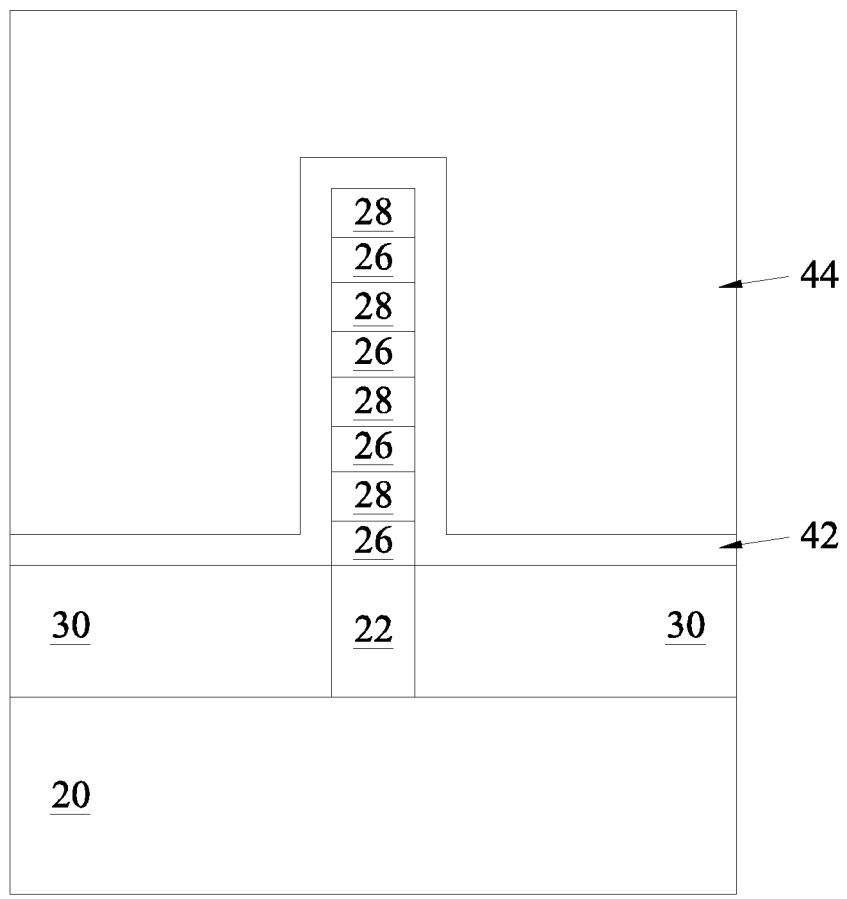

In FIGS. 17A, 17B, and 17C and in step 158 of FIG. 19, a gate dielectric 42 and a gate electrode 44 are formed in the opening through the ILD0 40. The gate dielectric 42 can include an interfacial dielectric formed in the opening and on the fin. The interfacial dielectric may be, for example, an oxide or the like formed by thermal oxidation, ALD, CVD, or the like. The gate dielectric 42 can further include a high-k dielectric layer formed conformally on the top surface of the ILD0 40 and in the opening along sidewalls of the gate spacers 36 and on the interfacial dielectric. The high-k dielectric layer may have a k value greater than about 7.0, and may include a metal oxide or a silicate of Hf, Al, Zr, La, Mg, Ba, Ti, Pb, and combinations thereof. The formation methods of high-k dielectric layer may include ALD, CVD, Molecular-Beam Deposition (MBD), the like, or a combination thereof. Other embodiments contemplate other materials for the gate dielectric 42, such as materials that are not high-k.

The gate electrode 44 is formed on the gate dielectric 42. The gate electrode 44 can be a multi-layered structure. For example, the gate electrode 44 can include a capping layer conformally formed on the gate dielectric 42, one or more work function tuning layers conformally formed on the capping layer, and a metal-containing material, such as a metal, formed on the work function tuning layers and filling the opening. In an example, the capping layer can comprise a first sub-layer on the gate dielectric 42 formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof.

Next, a planarization process, such as a CMP, may be performed to remove the excess portions of gate electrode 44 and the gate dielectric 42, which excess portions are over the top surface of ILD0 40.

Figure 18A:
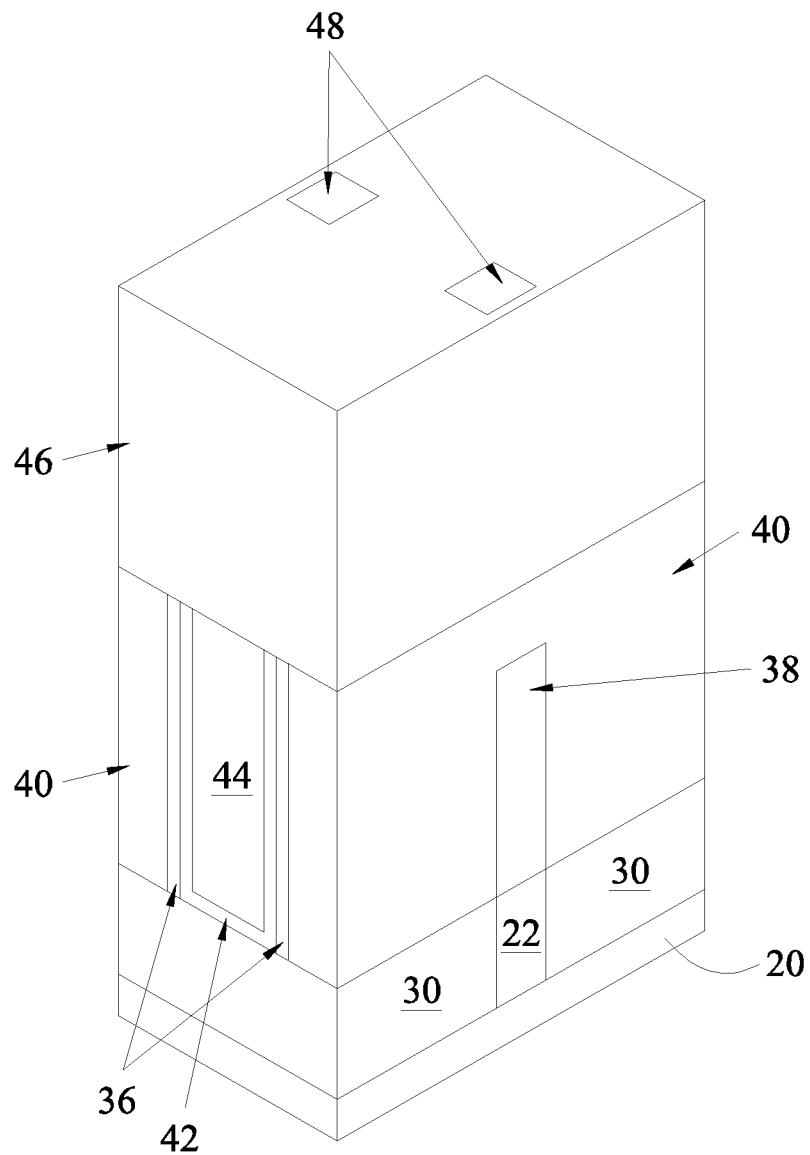
Figure 18B:
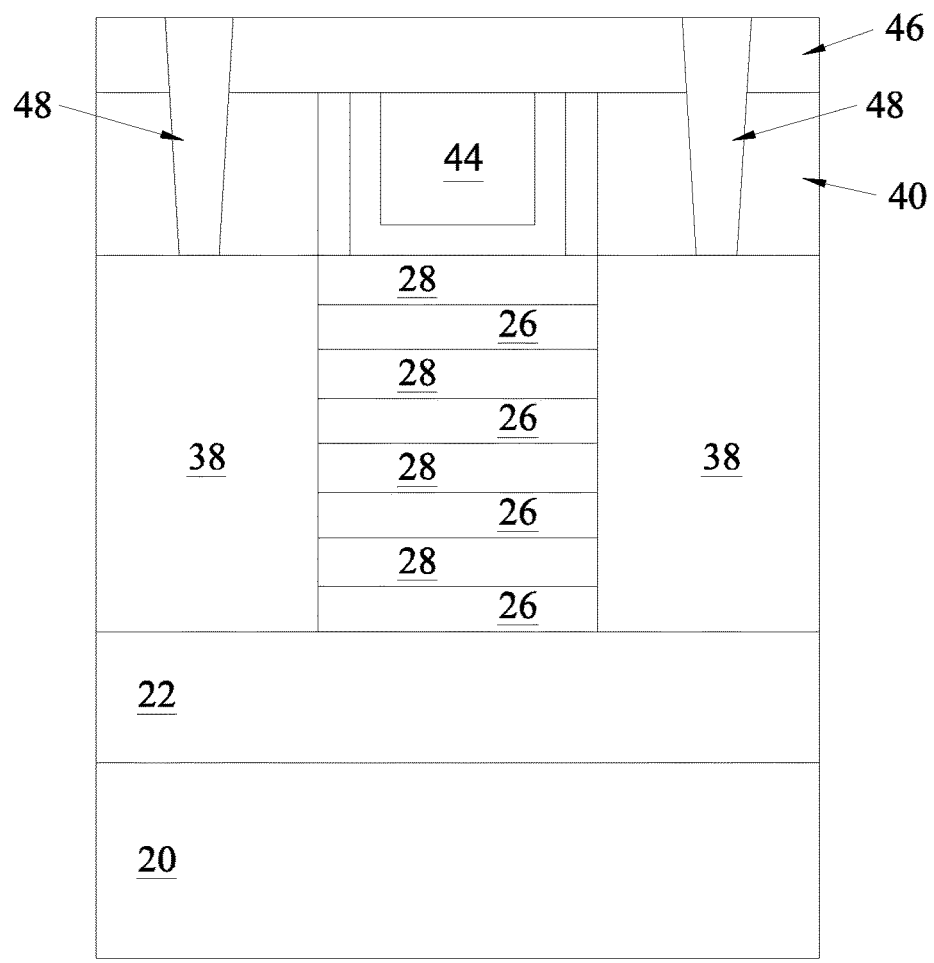
Figure 18C:
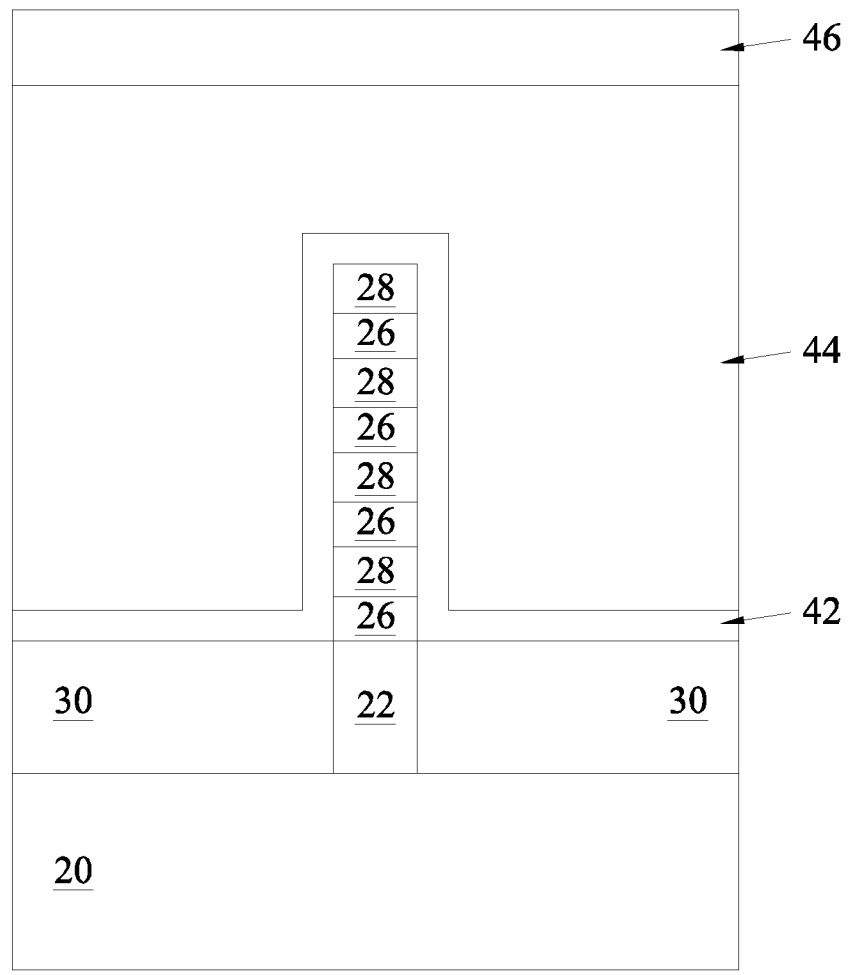
Figure 19:
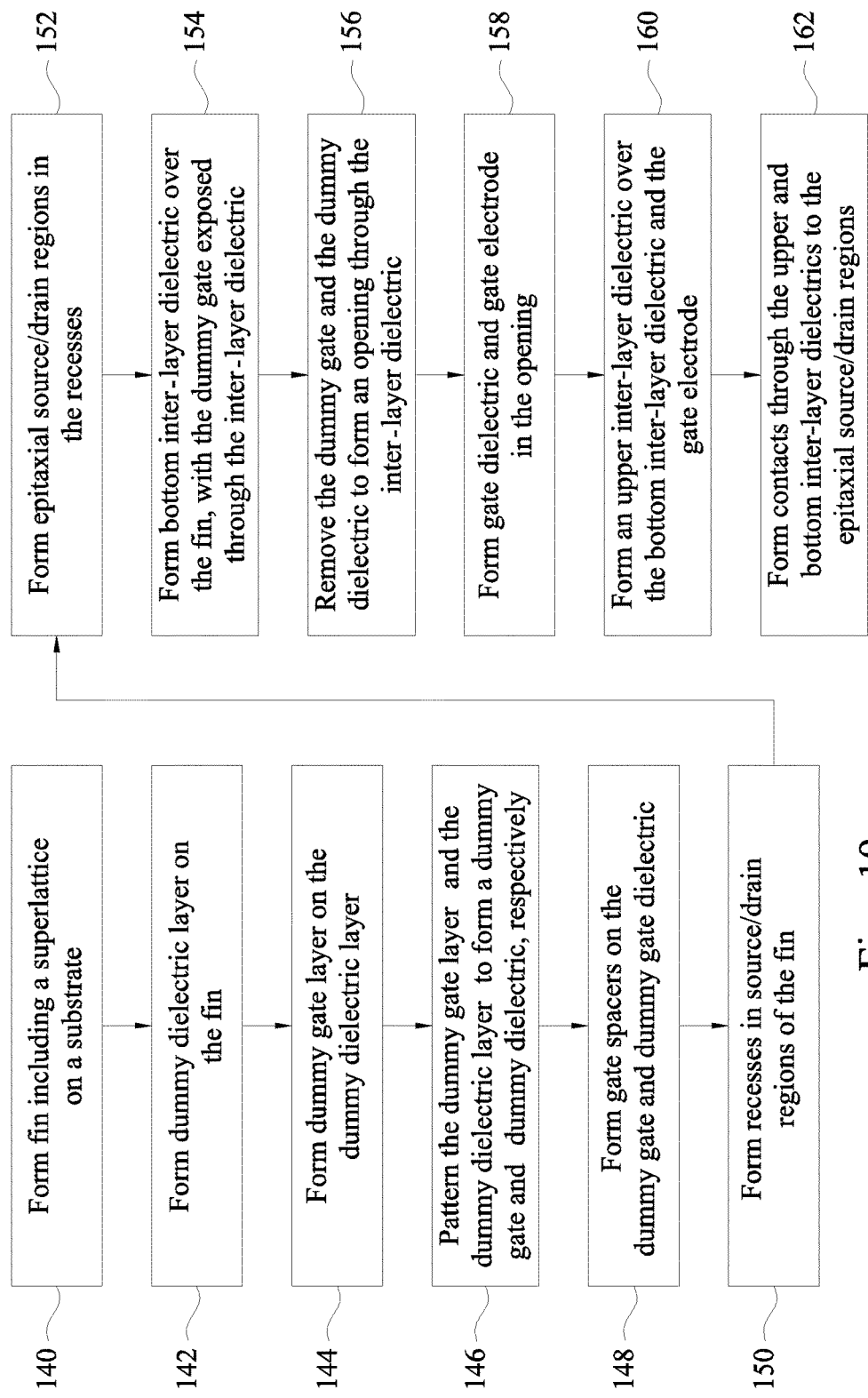
FIG. 19 is a process flow chart of the manufacturing of the finFET manufactured in FIGS. 11A-C through 18A-C in accordance with some embodiments.

In FIGS. 18A, 18B, and 18C and in step 160 of FIG. 19, an upper ILD (ILD1) 90 is deposited over the ILD0 40 and the gate electrode 44, and, in step 162 of FIG. 19, contacts 48 are formed through the ILD1 46 and ILD0 40 to the epitaxial source/drain regions 38. The ILD1 46 is formed of a dielectric material such as PSG, BSG, BPSG, USG, or the like, and may be deposited by any suitable method, such as CVD and PECVD. Openings for contacts 48 are formed through the ILD1 46 and ILD0 40. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 46. The remaining liner and conductive material form contacts 48 in the openings. An anneal process may be performed to form a silicide at the interface between the epitaxial source/drain regions 38 and the contacts 48, respectively.

Although not explicitly shown, a person having ordinary skill in the art will readily understand that further processing steps may be performed on the structure in FIGS. 18A., 18B, and 18C. For example, various Inter-Metal Dielectrics (IMD) and their corresponding metallizations may be formed over ILD1 46.

Figure 20:
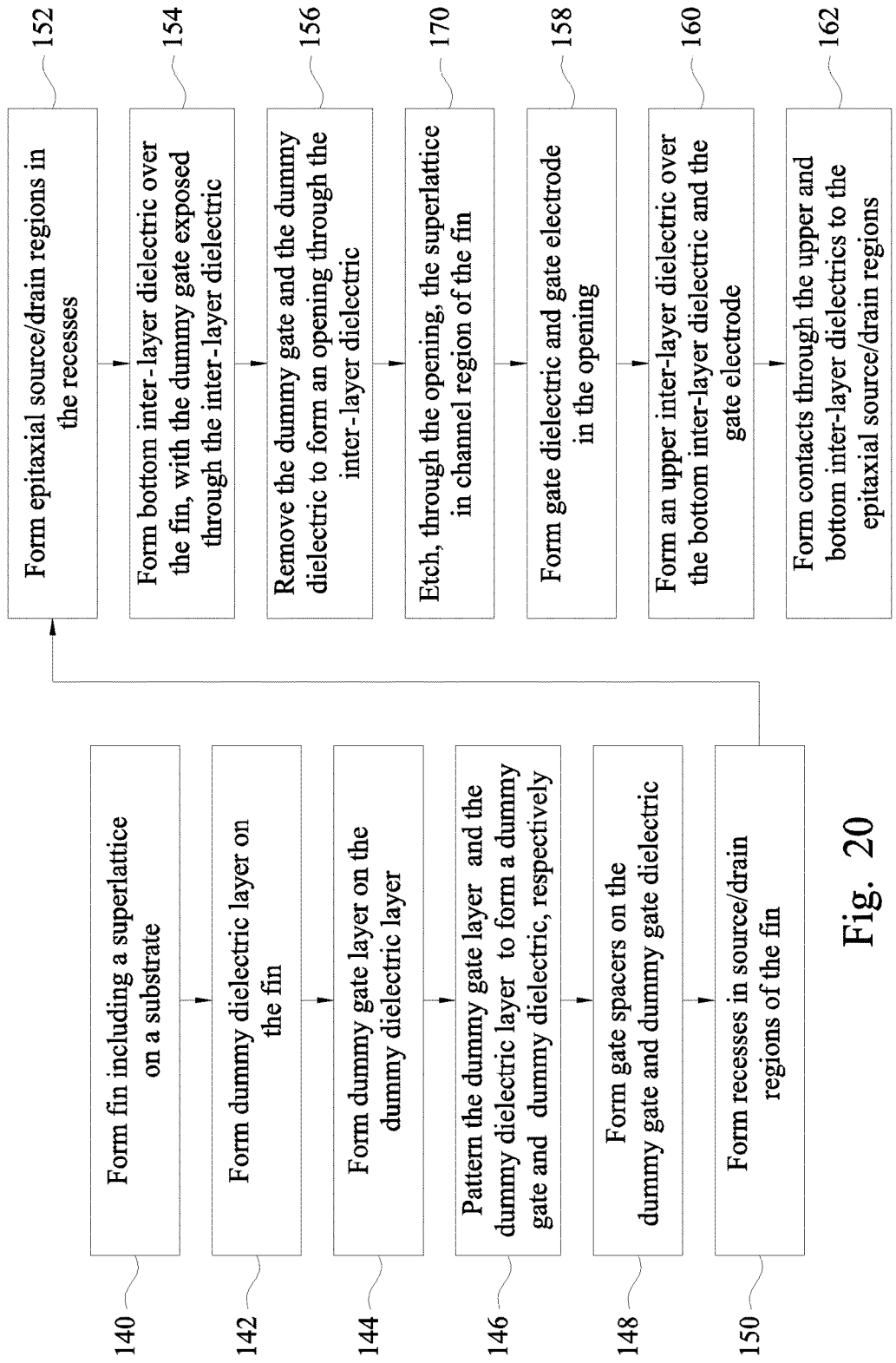
FIG. 20 is another process flow chart of the manufacturing of a finFET in accordance with some embodiments.

FIG. 20 is a process flow for manufacturing a finFET in accordance with some embodiments. FIG. 20 is a modification of the process flow of FIG. 19, and includes step 170 between steps 156 and 158. Before the etch step 170, sidewalls of a respective side of the alternating first layers 26 and second layers 28 were vertically aligned, as illustrated in FIG. 16C. In step 170, the channel region of the superlattice 24 is etched through the opening through the ILD0 40 and defined by the sidewalls of the gate spacers 36. The etch can result in etched-modified first layers 26, etched-modified second layers 28, first layers 26 being removed, second layers 28 being removed, or a combination thereof.

FIGS. 21A-C, 23A-C, 25A-C, and 27A-C illustrate different example results of etch steps 170 that etch the first layers 26, and FIGS. 22A-C, 24A-C, 26A-C, and 28A-C illustrate structures after the respective etch step 170 described with respect to the immediately preceding figures and after further processing. FIGS. 29A-C, 31A-C, 33A-C, and 35A-C illustrate different example results of etch steps 170 that etch the second layers 28, and FIGS. 30A-C, 32A-C, 34A-C, and 36A-C illustrate structures after the respective etch step 170 described with respect to the immediately preceding figures and after further processing.

Although not specifically illustrated, different etch processes may be used for a p-type device and an n-type device in a complementary device. For example, a first region of the substrate 20 (e.g., where the n-type device is to be formed) can be masked, such as by a first photoresist, while a second region of the substrate 20 (e.g., where the p-type device is to be formed) is exposed and etched according to step 170. The mask can then be removed, and another mask, such as a photoresist, can be formed. The second region can be masked while the first region is exposed and etched according to step 170. The mask can then be removed.

Figure 21A:
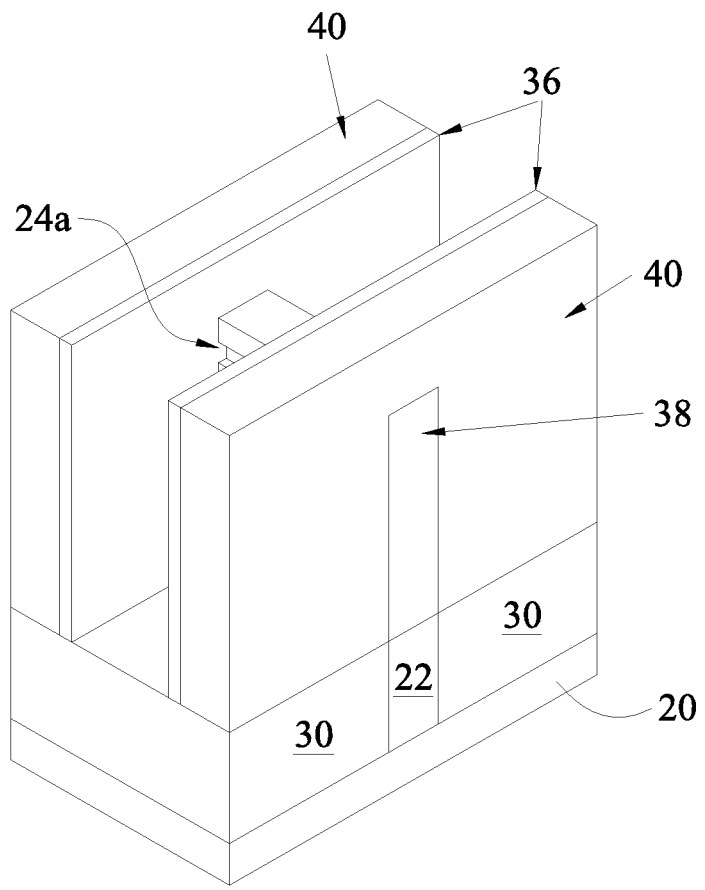
FIGS. 21A, 21B, and 21C are various 3D and cross-sectional views of a result of a first example etch step of FIG. 20 in accordance with some embodiments.
Figure 21B:
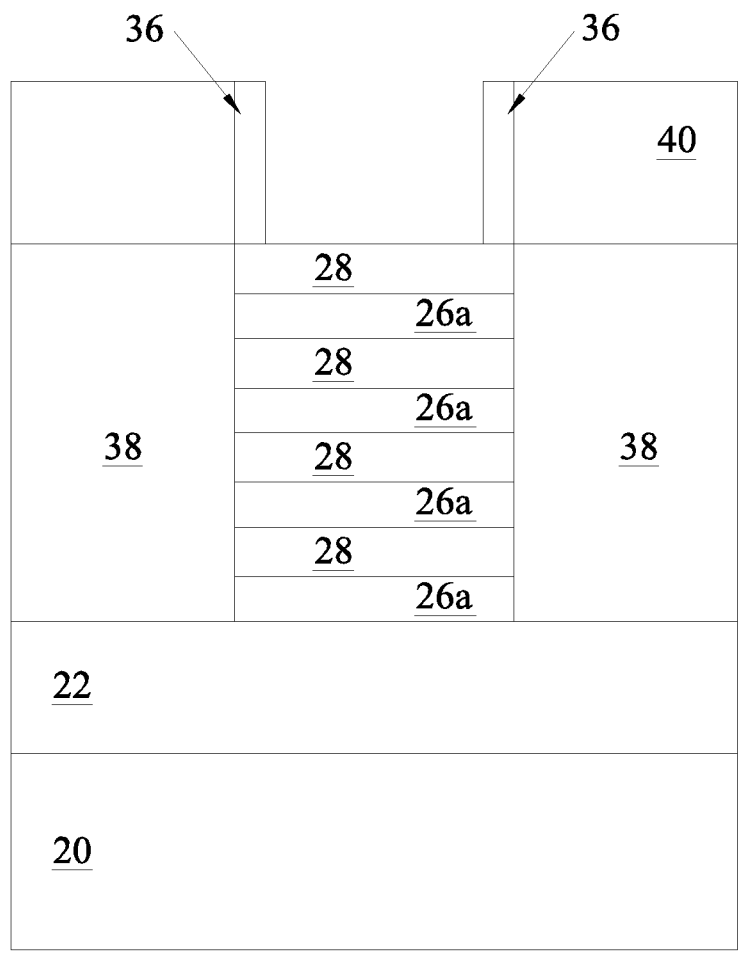
Figure 21C:
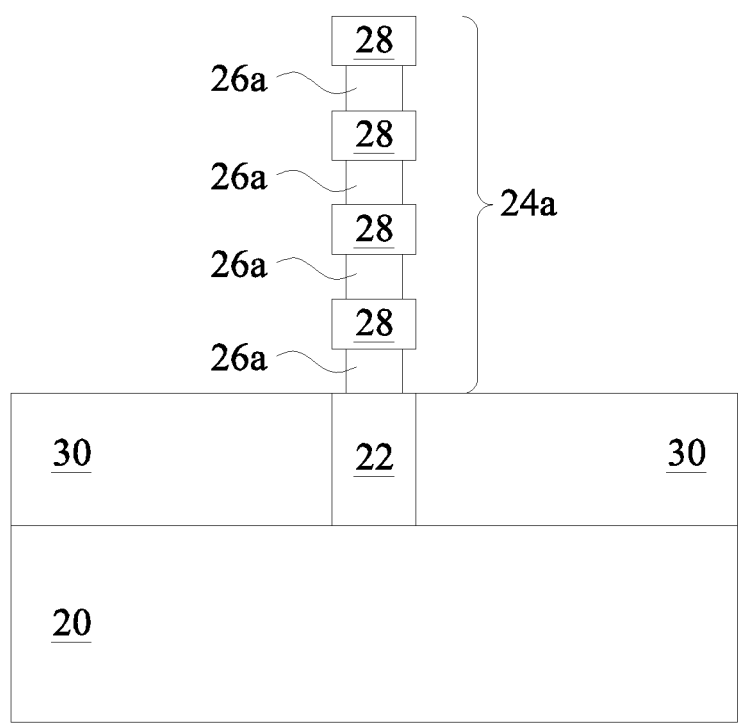

In FIGS. 21A, 21B, and 21C, substantially only the first layers 26 of the superlattice 24 are etched during step 170. As a result of this etch step 170, sidewalls of the etched first layers 26a are offset inwardly to the fin from sidewalls of the second layers 28 on a respective side. The etching results in a first modified superlattice 24a. In some embodiments, the result of the etch as illustrated in FIGS. 21A, 21B, and 21C can be a function of the materials of the first layers 26 and the second layers 28, the orientation of the sidewalls, and the etchant used for etching. For example, continuing the specific example where each of the first layers 26 is a layer of $Si_{0.50}Ge_{0.50}$, and each of the second layers 28 is a layer of Si, the buffer layer 22, first layers 26, and second layers 28 are epitaxially grown on a (110) surface of a bulk Si substrate, and the sidewalls of the first layers 26 and the second layers 28 are (111) crystalline surfaces. Further, the etchant can be a wet etchant, such as a diluted ammonium hydroxide-hydrogen peroxide mixture (APM), sulfuric acid-hydrogen peroxide mixture (SPM), or the like, which is selective to the (111) crystalline surfaces of the $Si_{0.50}Ge_{0.50}$ first layers 26. These conditions can result in (111) crystalline sidewall surfaces of the etched $Si_{0.50}Ge_{0.50}$ first layers 26a that are inwardly offset from (111) crystalline sidewall surfaces of the Si second layers 28.

Figure 22A:
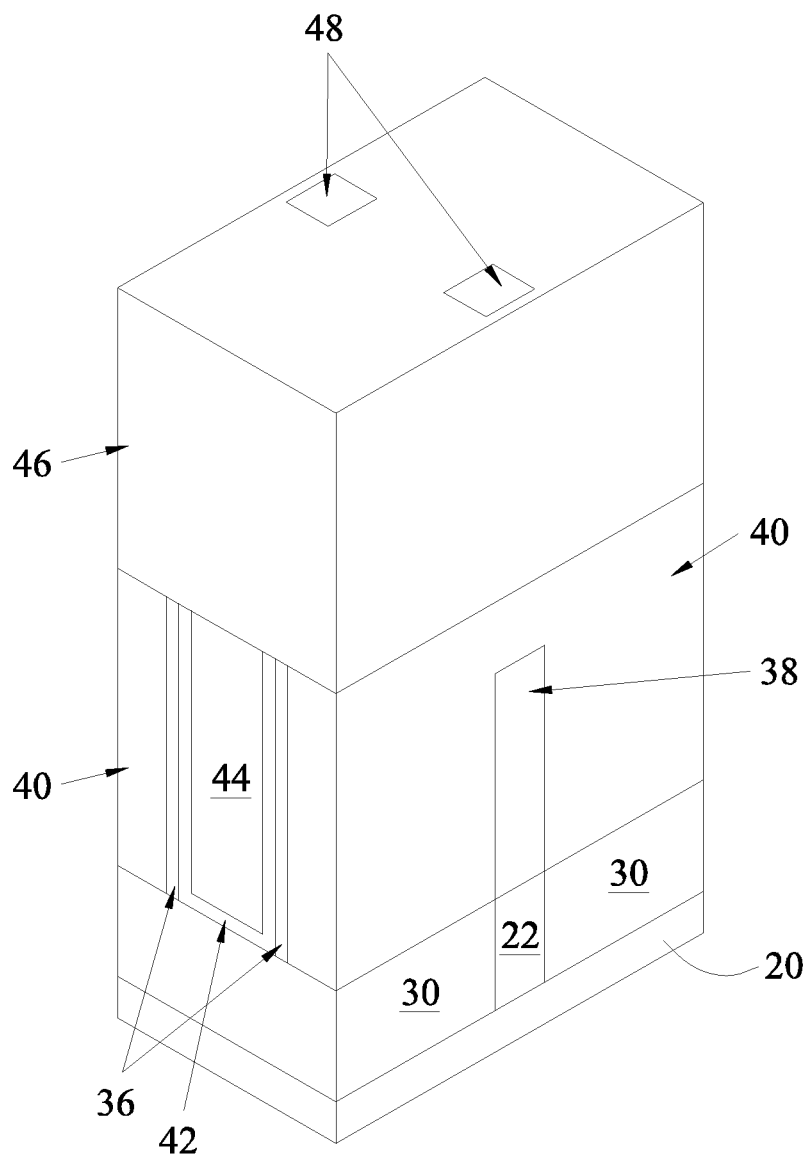
FIGS. 22A, 22B, and 22C are various 3D and cross-sectional views of a structure formed with the etch step of FIGS. 21A-C and according to the process flow chart of FIG. 20 in accordance with some embodiments.
Figure 22B:
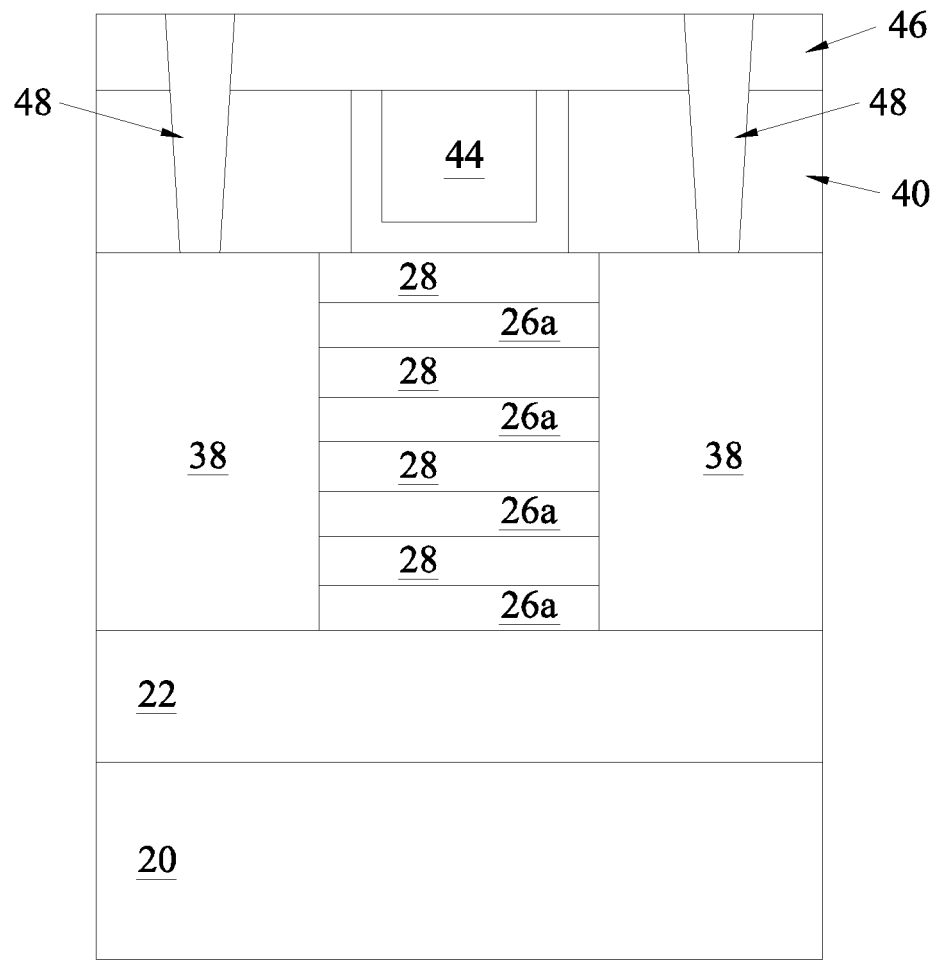
Figure 22C:
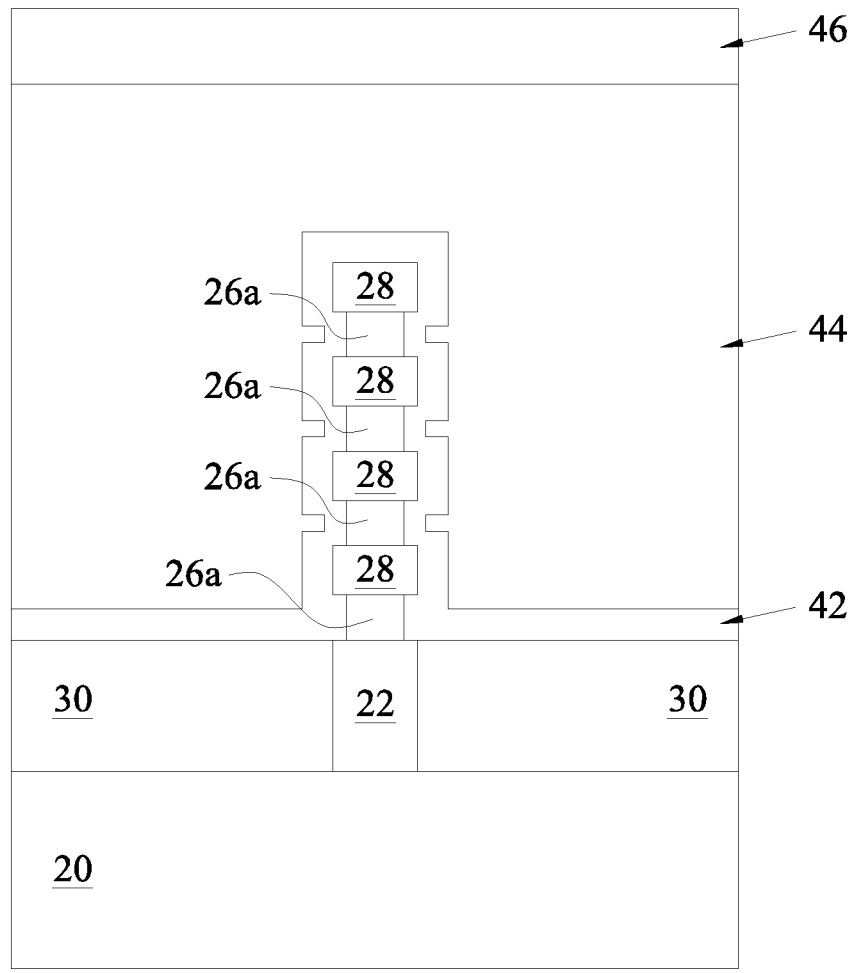

FIGS. 22A, 22B, and 22C illustrate a structure after undergoing the etch in step 170 described in FIGS. 21A, 21B, and 21C and after continuing through processing steps 158 through 162 as discussed above. As illustrated in FIG. 22C, the gate dielectric 42 is conformal to the etched sidewalls in the first modified superlattice 24a. Further, the gate electrode 44 can extend at least partially between or closer to surfaces of the second layers 28 because the etched first layers 26a have been etched.

Figure 23A:
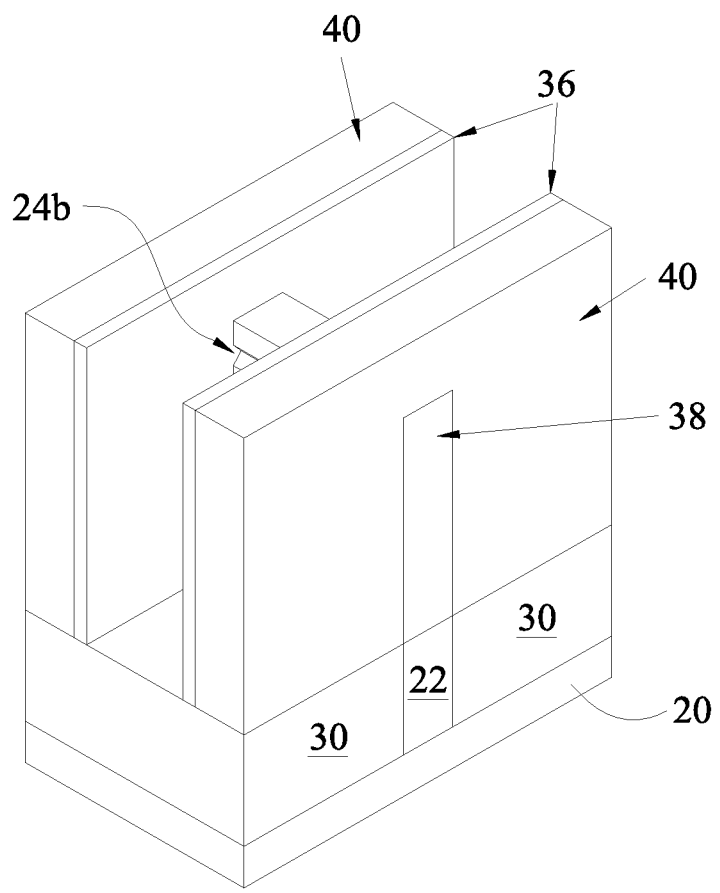
FIGS. 23A, 23B, and 23C are various 3D and cross-sectional views of a result of a second example etch step of FIG. 20 in accordance with some embodiments.
Figure 23B:
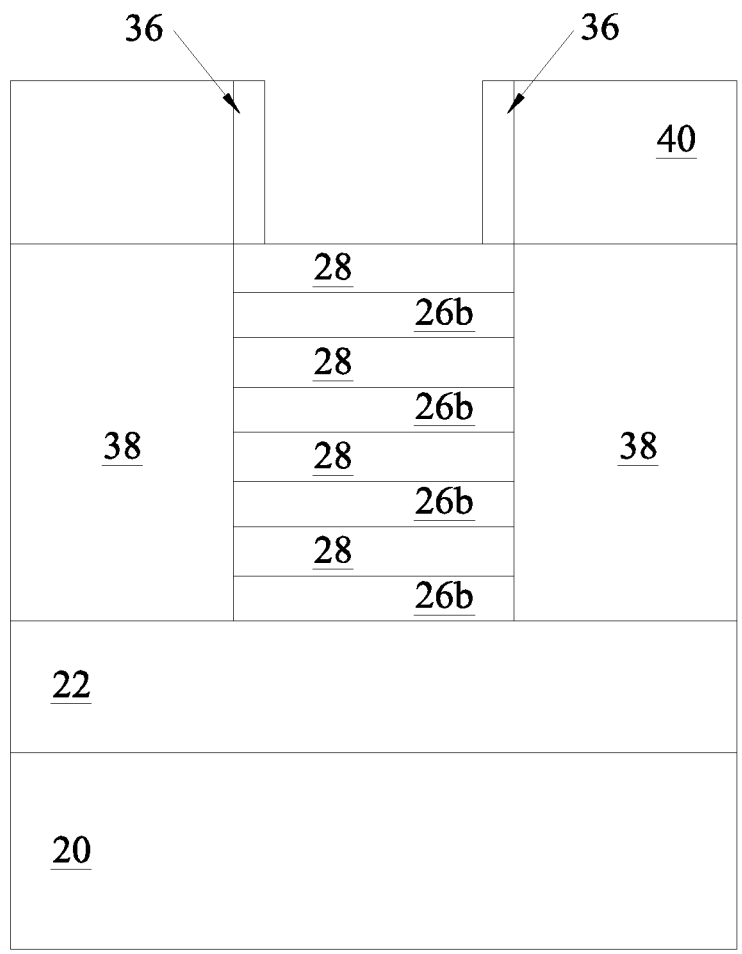
Figure 23C:
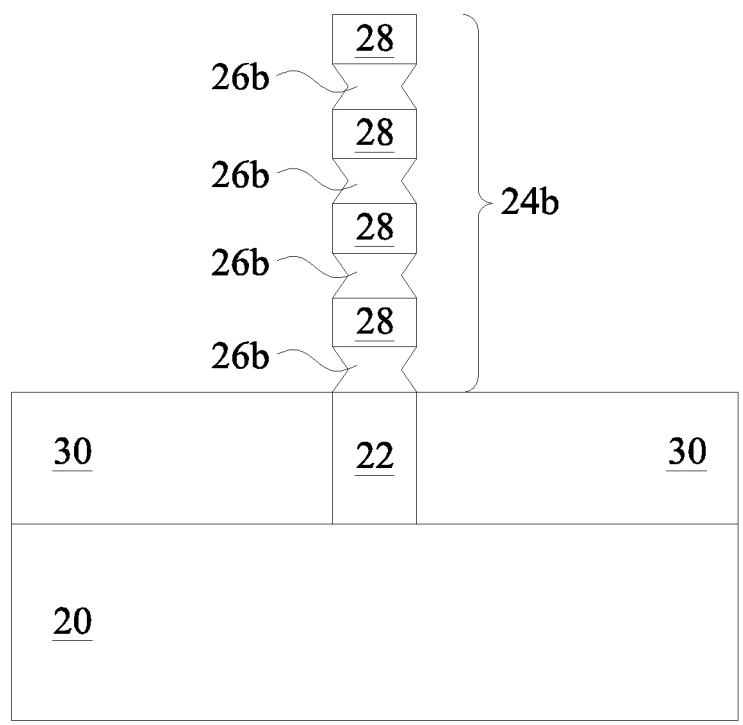

In FIGS. 23A, 23B, and 23C, substantially only the first layers 26 of the superlattice 24 are etched during step 170. As a result of this etch step 170, sidewalls of the etched first layers 26b are anisotropically notched, e.g., according to a crystalline plane, inwardly to the fin from sidewalls of the second layers 28 on a respective side. The etching results in a second modified superlattice 24b. In some embodiments, the result of the etch as illustrated in FIGS. 23A, 23B, and 23C can be a function of the materials of the first layers 26 and the second layers 28, the orientation of the sidewalls, and the etchant used for etching. For example, continuing the specific example where each of the first layers 26 is a layer of $Si_{0.50}Ge_{0.50}$, and each of the second layers 28 is a layer of Si, the buffer layer 22, first layers 26, and second layers 28 are epitaxially grown on a (001) surface of a bulk Si substrate, and the sidewalls of the first layers 26 and the second layers 28 are (110) crystalline surfaces. Further, the etchant can be a wet etchant, such as a diluted ammonium hydroxide-hydrogen peroxide mixture (APM), sulfuric acid-hydrogen peroxide mixture (SPM), or the like, which is selective to the (111) crystalline surfaces of the $Si_{0.50}Ge_{0.50}$ first layers 26. These conditions can result in (111) crystalline notched surfaces of the etched $Si_{0.50}Ge_{0.50}$ first layers 26b that are notched inwardly from (110) crystalline sidewall surfaces of the Si second layers 28.

Figure 24A:
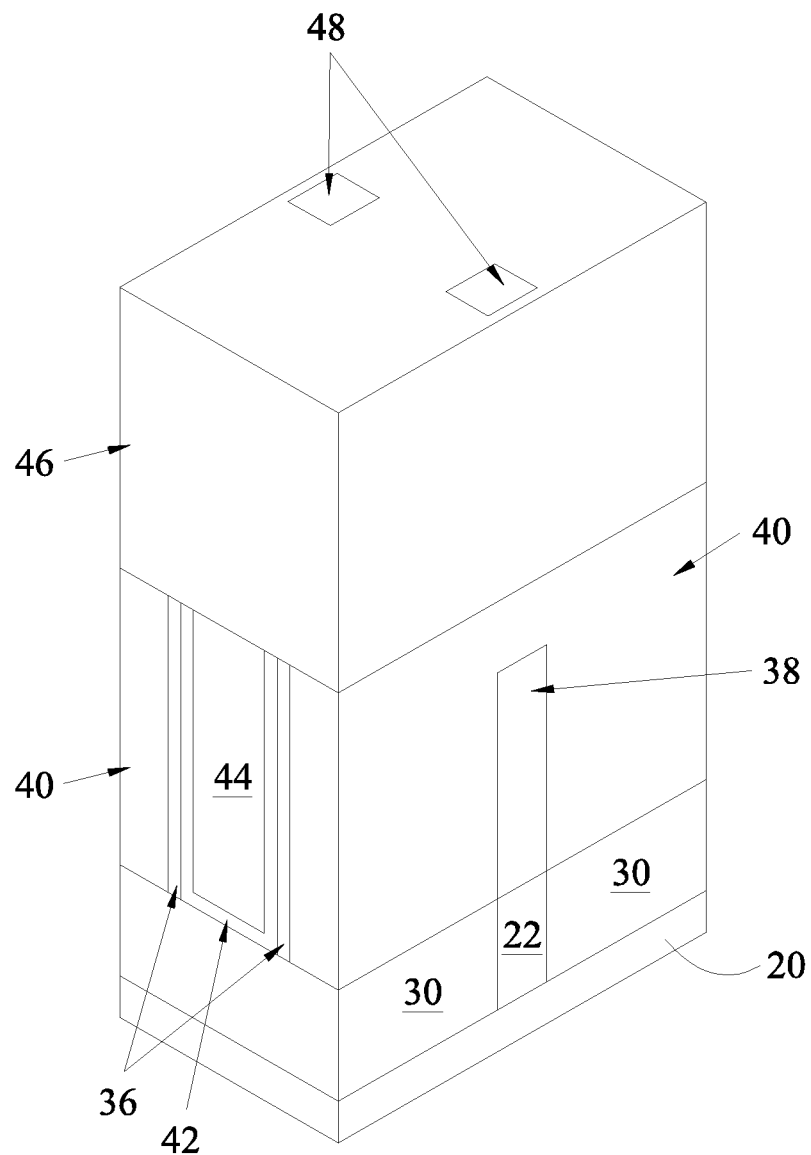
FIGS. 24A, 24B, and 24C are various 3D and cross-sectional views of a structure formed with the etch step of FIGS. 23A-C and according to the process flow chart of FIG. 20 in accordance with some embodiments.
Figure 24B:
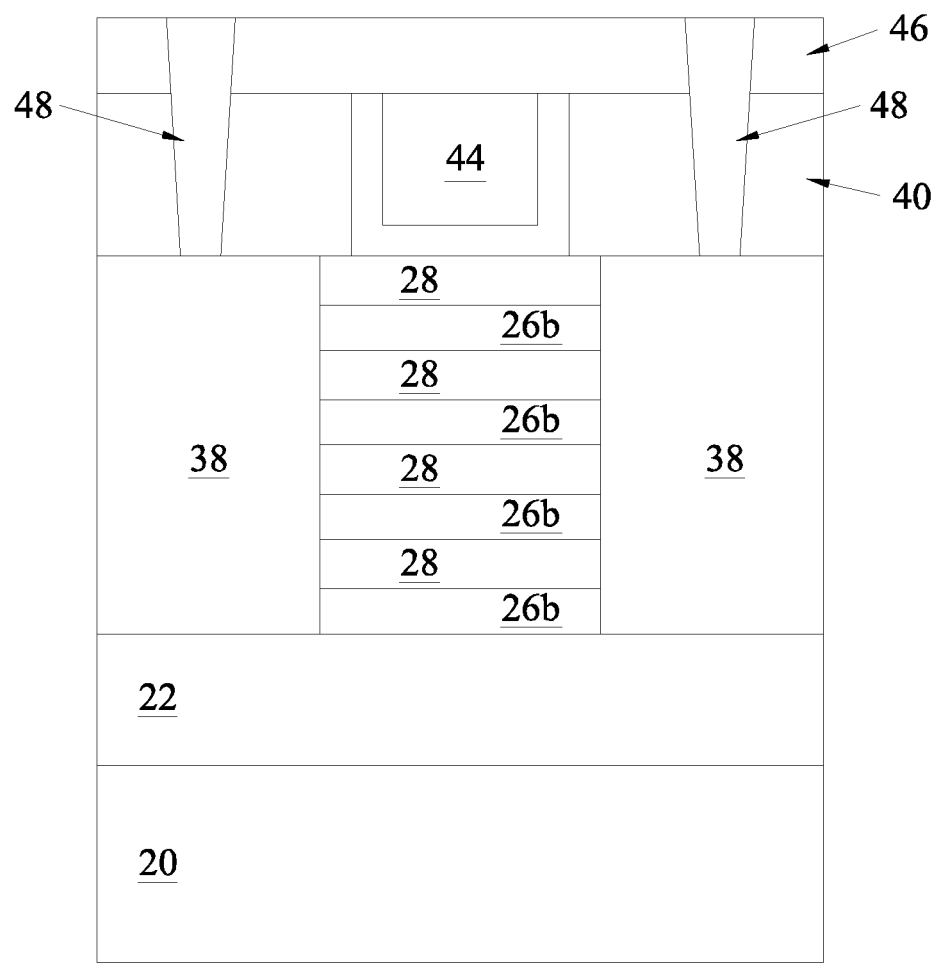
Figure 24C:
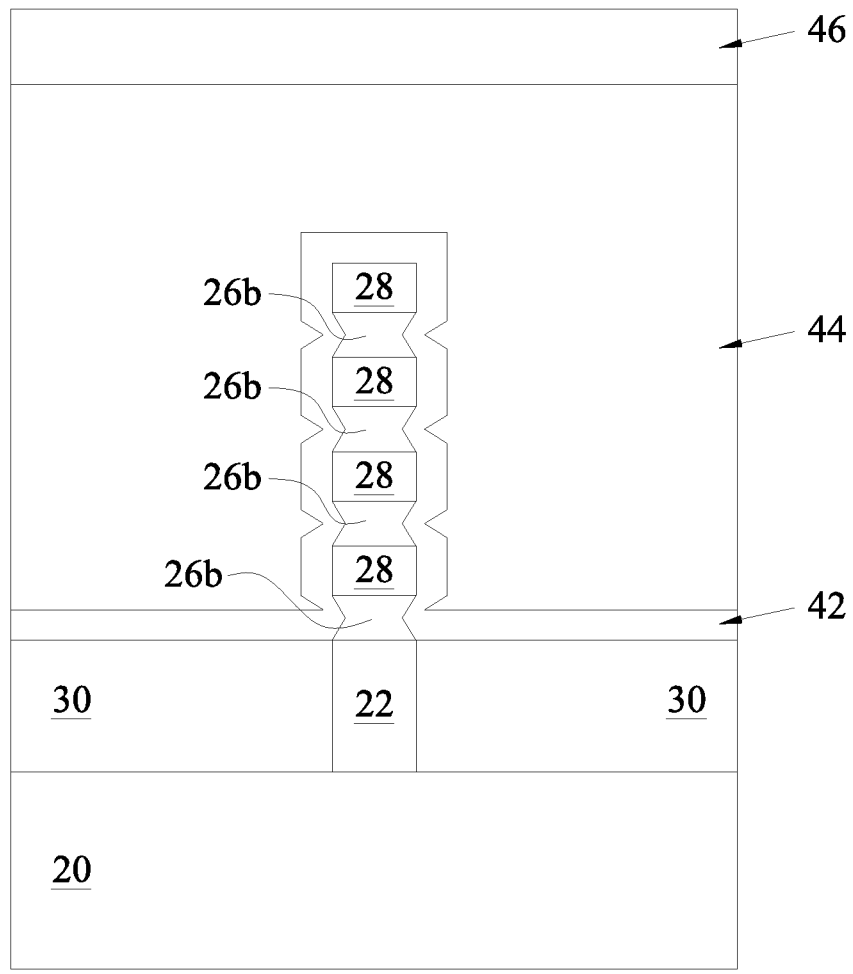

FIGS. 24A, 24B, and 24C illustrate a structure after undergoing the etch in step 170 described in FIGS. 23A, 23B, and 23C and after continuing through processing steps 158 through 162 as discussed above. As illustrated in FIG. 24C, the gate dielectric 42 is conformal to the etched sidewalls in the second modified superlattice 24b. Further, the gate electrode 44 can extend at least partially between or closer to surfaces of the second layers 28 because the etched first layers 26b have been etched.

Figure 25A:
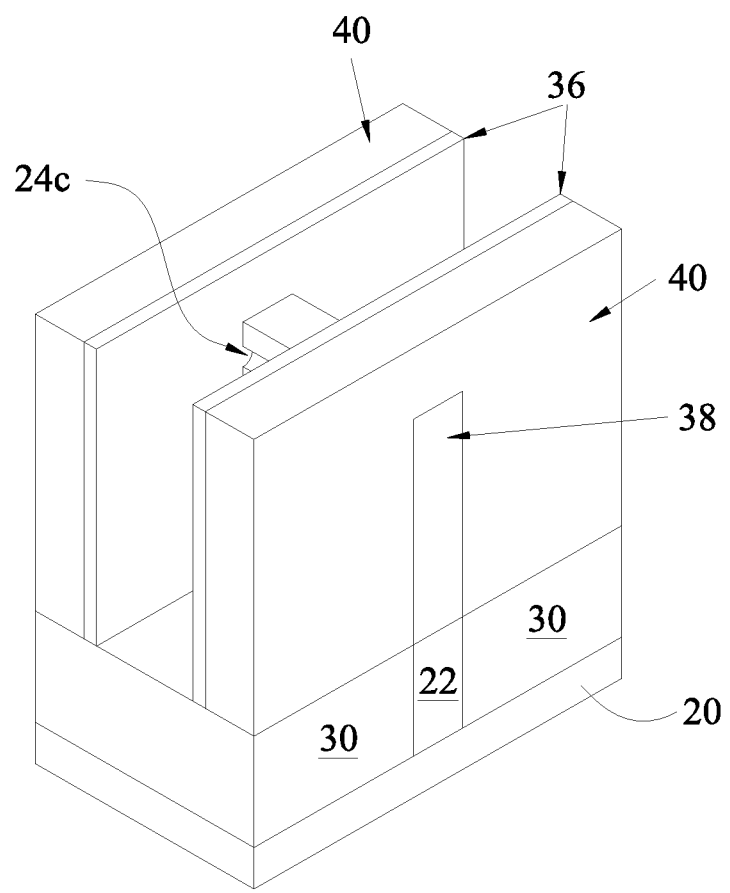
FIGS. 25A, 25B, and 25C are various 3D and cross-sectional views of a result of a third example etch step of FIG. 20 in accordance with some embodiments.
Figure 25B:
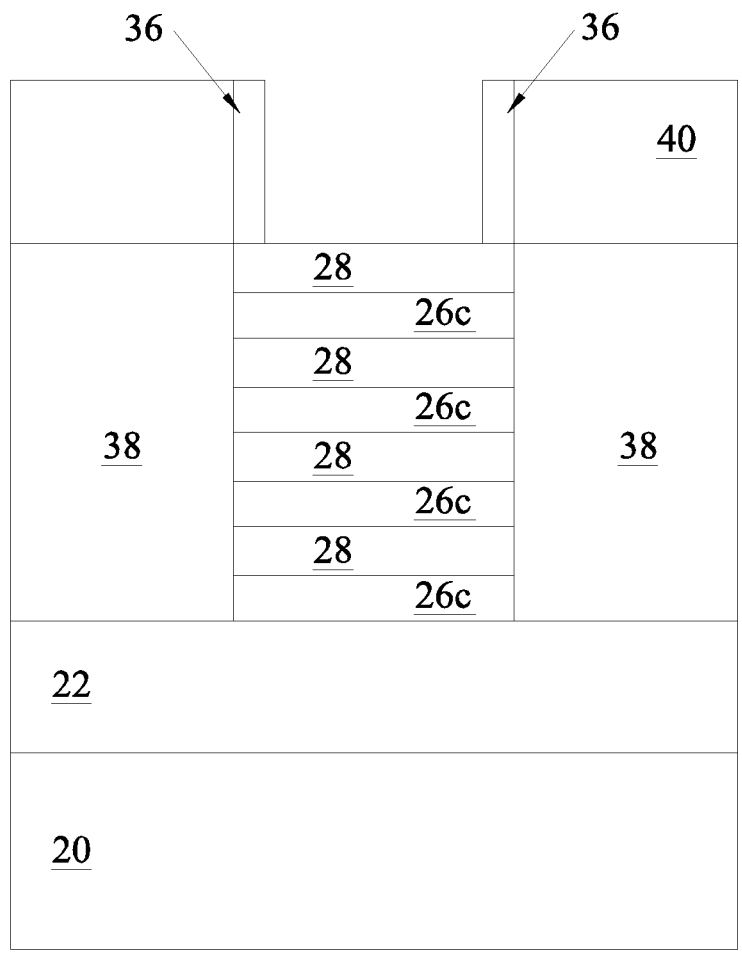
Figure 25C:
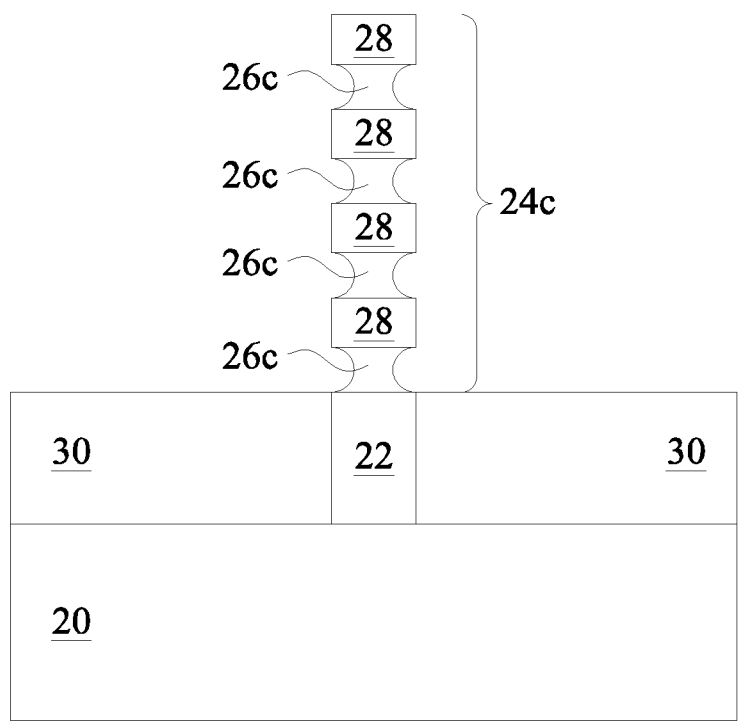

In FIGS. 25A, 25B, and 25C, substantially only the first layers 26 of the superlattice 24 are etched during step 170. As a result of this etch step 170, sidewalls of the etched first layers 26c are isotropically notched inwardly to the fin from sidewalls of the second layers 28 on a respective side. The etching results in a third modified superlattice 24c. In some embodiments, the result of the etch as illustrated in FIGS. 25A, 25B, and 25C can be a function of the materials of the first layers 26 and the second layers 28 and the etchant used for etching. For example, continuing the specific example where each of the first layers 26 is a layer of $Si_{0.50}Ge_{0.50}$, and each of the second layers 28 is a layer of Si, the etching can use a dry isotropic etch, such as using a mixture of HCl gas, $Cl_2$ gas, and/or $NF_3$ gas, or the like. As one of skill will readily understand, a selectivity of HCl gas and $Cl_2$ gas can be modified by controlling a temperature and pressure of the etching process. These conditions can result in isotropically notched surfaces of the etched $Si_{0.50}Ge_{0.50}$ first layers 26c that are notched inwardly from sidewall surfaces of the Si second layers 28.

Figure 26A:
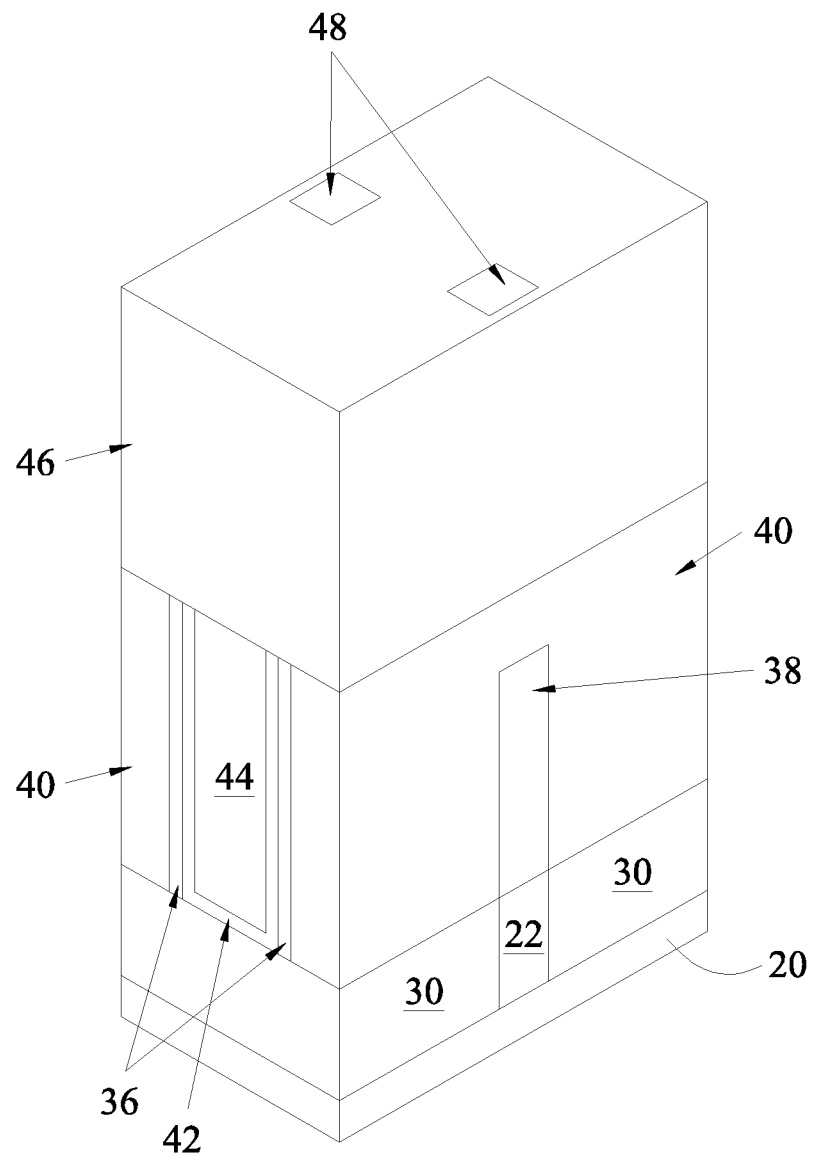
FIGS. 26A, 26B, and 26C are various 3D and cross-sectional views of a structure formed with the etch step of FIGS. 25A-C and according to the process flow chart of FIG. 20 in accordance with some embodiments.
Figure 26B:
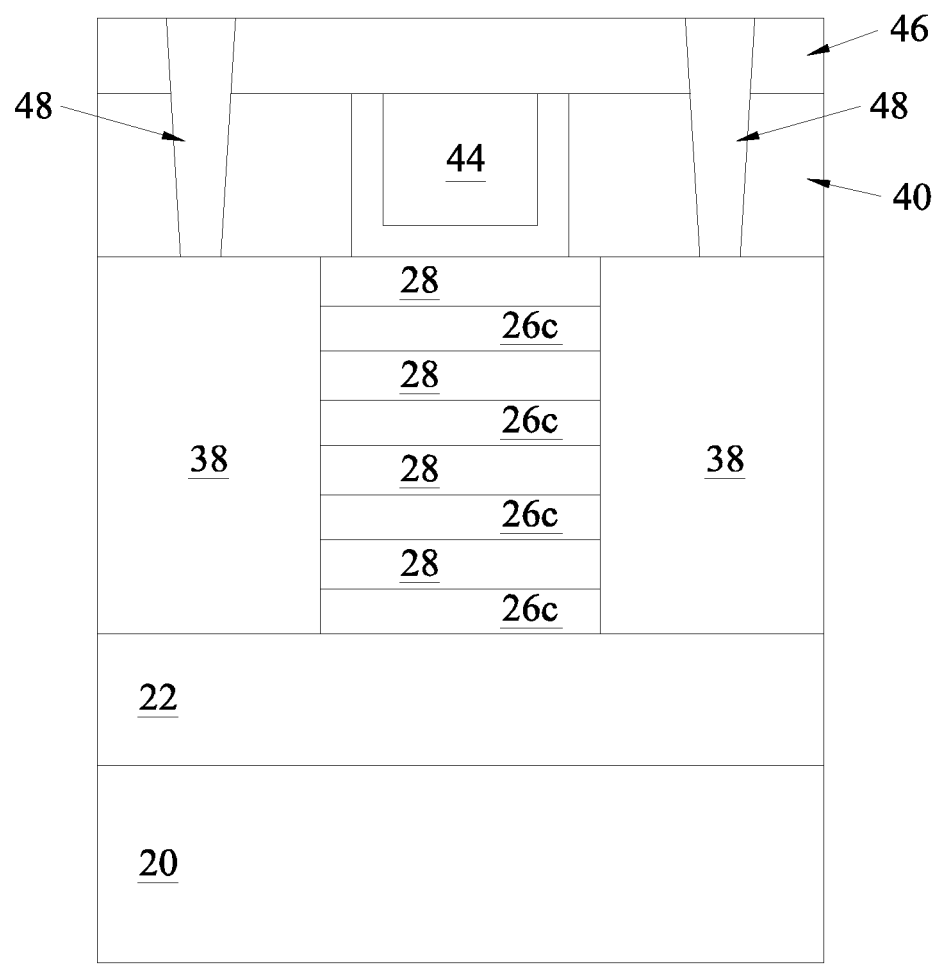
Figure 26C:
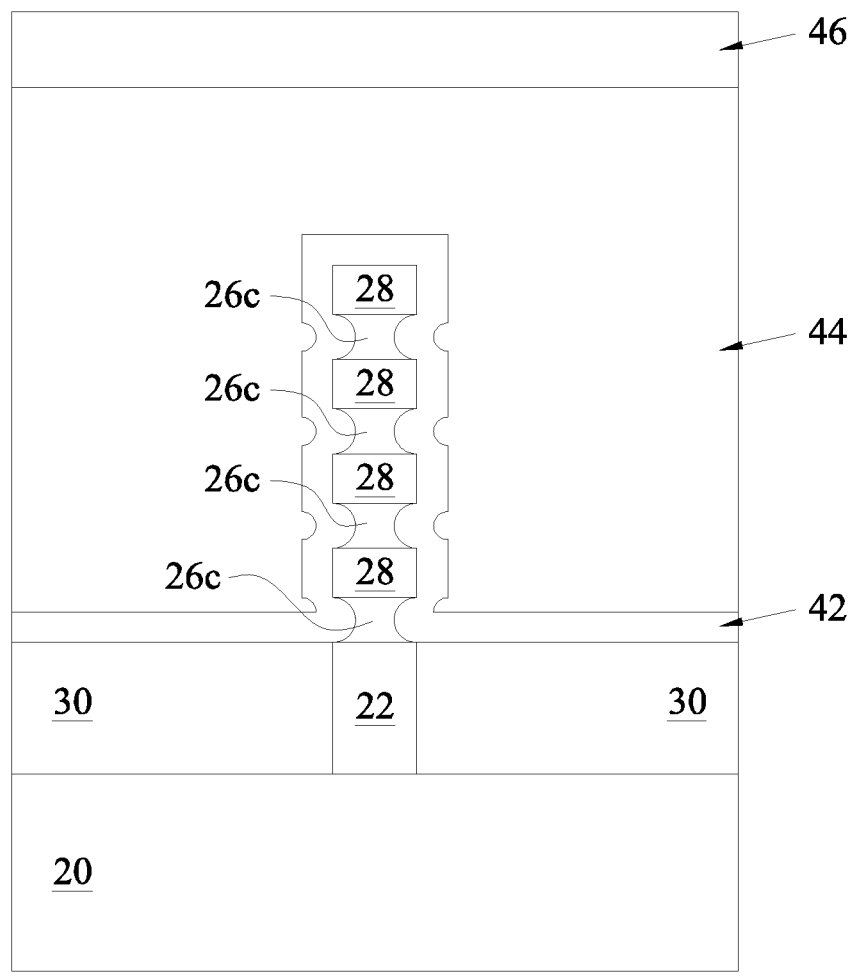

FIGS. 26A, 26B, and 26C illustrate a structure after undergoing the etch in step 170 described in FIGS. 25A, 25B, and 25C and after continuing through processing steps 158 through 162 as discussed above. As illustrate in FIG. 26C, the gate dielectric 42 is conformal to the etched sidewalls in the third modified superlattice 24c. Further, the gate electrode 44 can extend at least partially between or closer to surfaces of the second layers 28 because the etched first layers 26c have been etched.

Figure 27A:
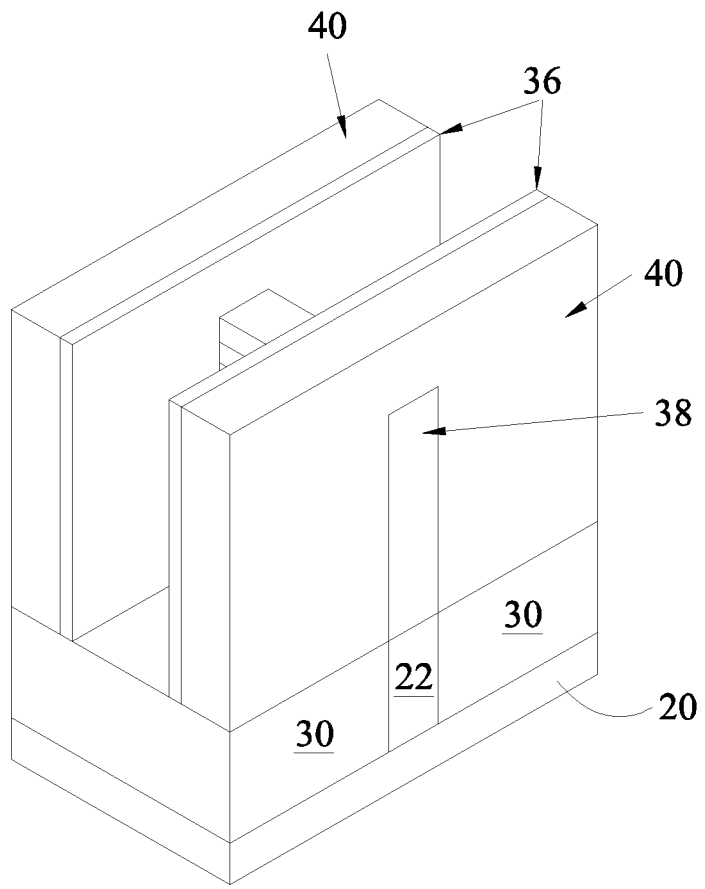
Figure 27B:
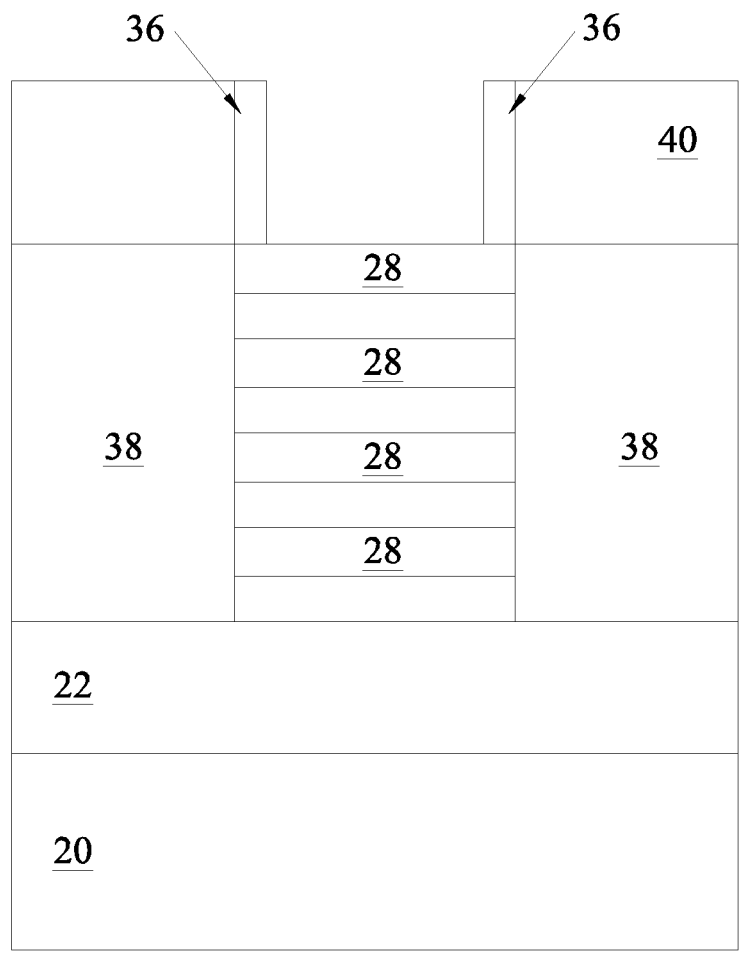
Figure 27C:
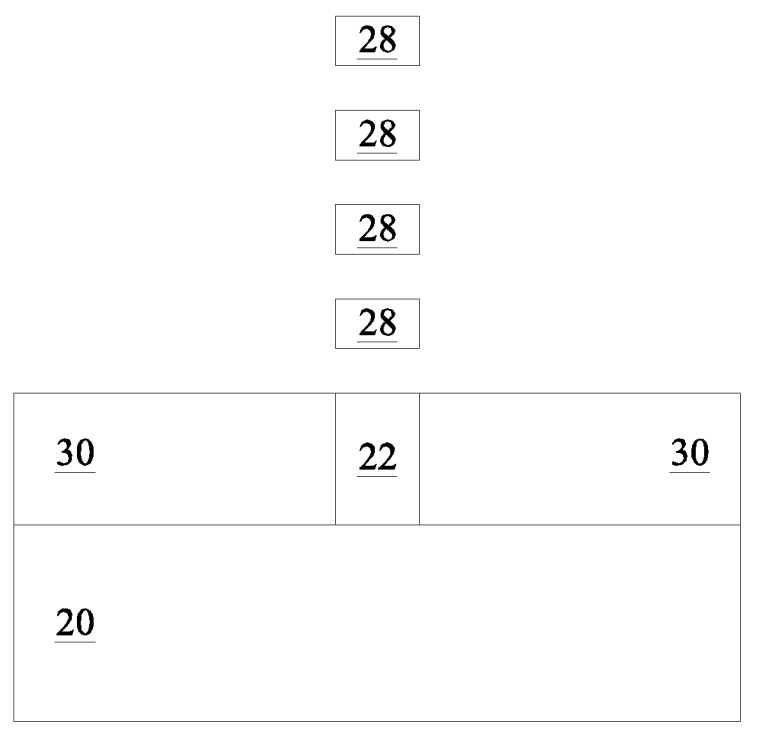

In FIGS. 27A, 27B, and 27C, substantially only the first layers 26 of the superlattice 24 are etched during step 170. As a result of this etch step 170, the first layers 26 are removed. Any of the etching examples provided above, or any other etch selective to the first layers 26, can be used at a longer duration until the first layers 26 are removed.

Figure 28A:
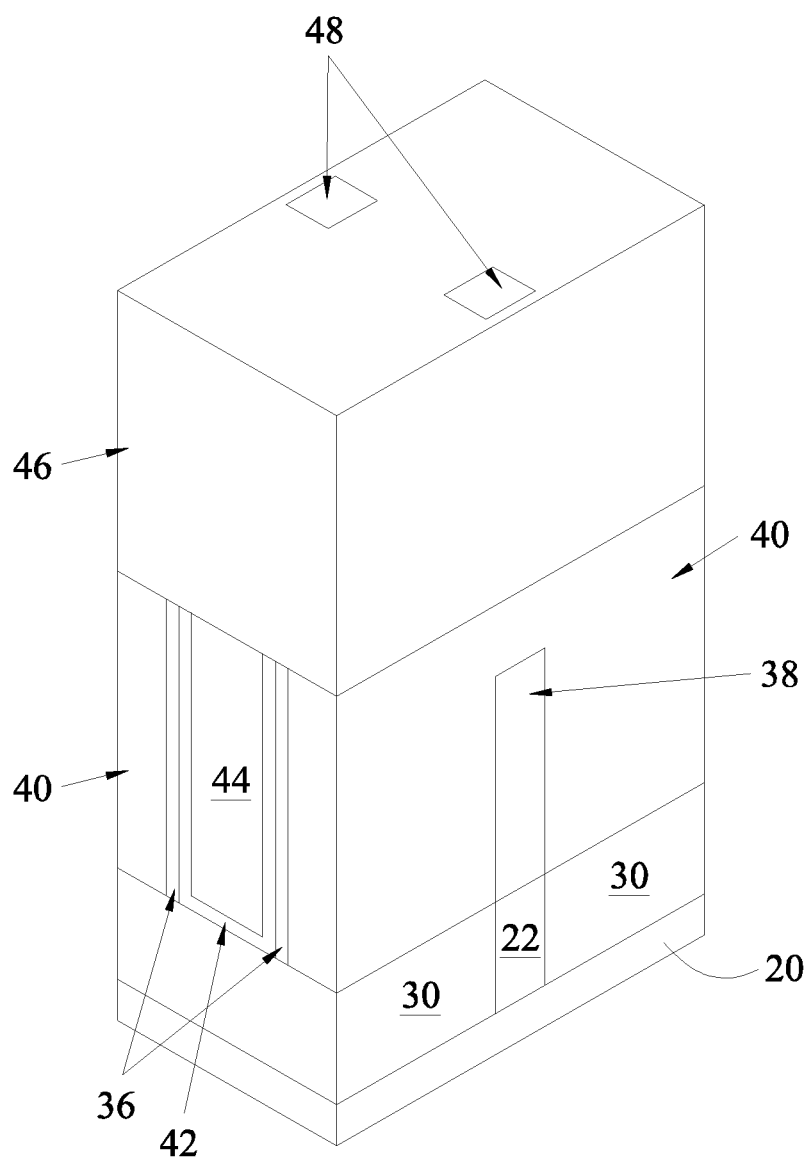
FIGS. 28A, 28B, and 28C are various 3D and cross-sectional views of a structure formed with the etch step of FIGS. 27A-C and according to the process flow chart of FIG. 20 in accordance with some embodiments.
Figure 28B:
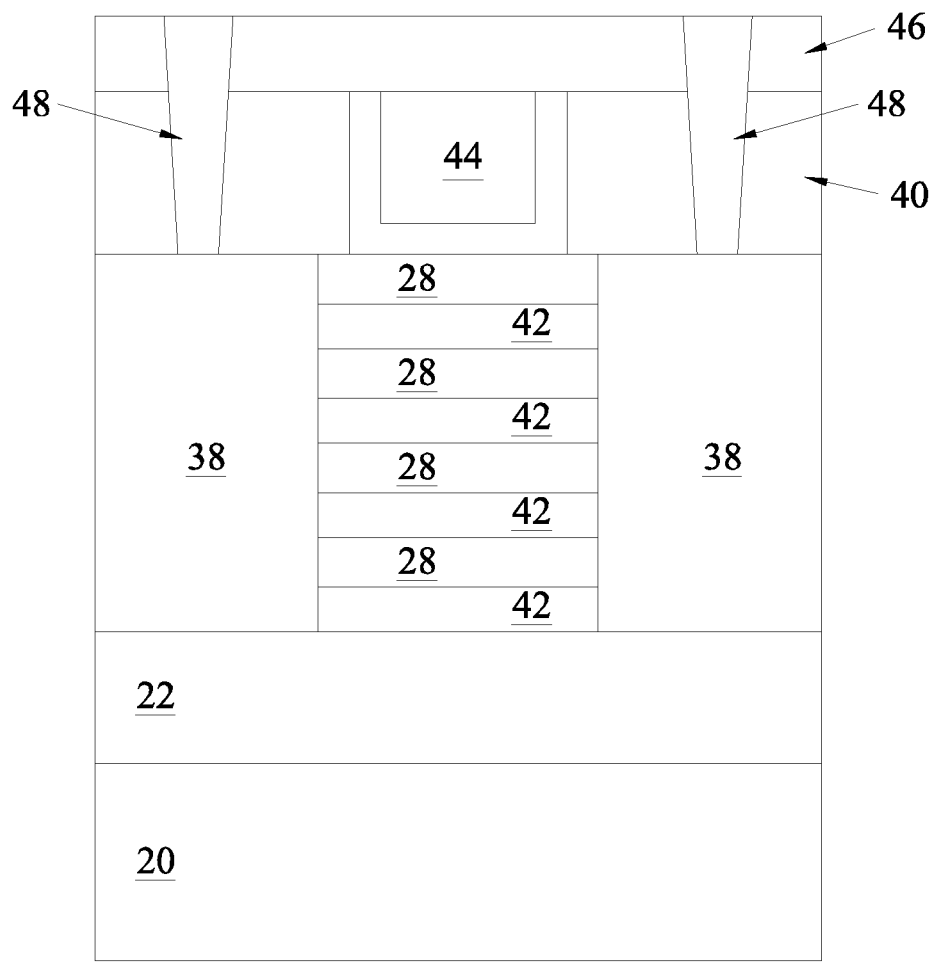
Figure 28C:
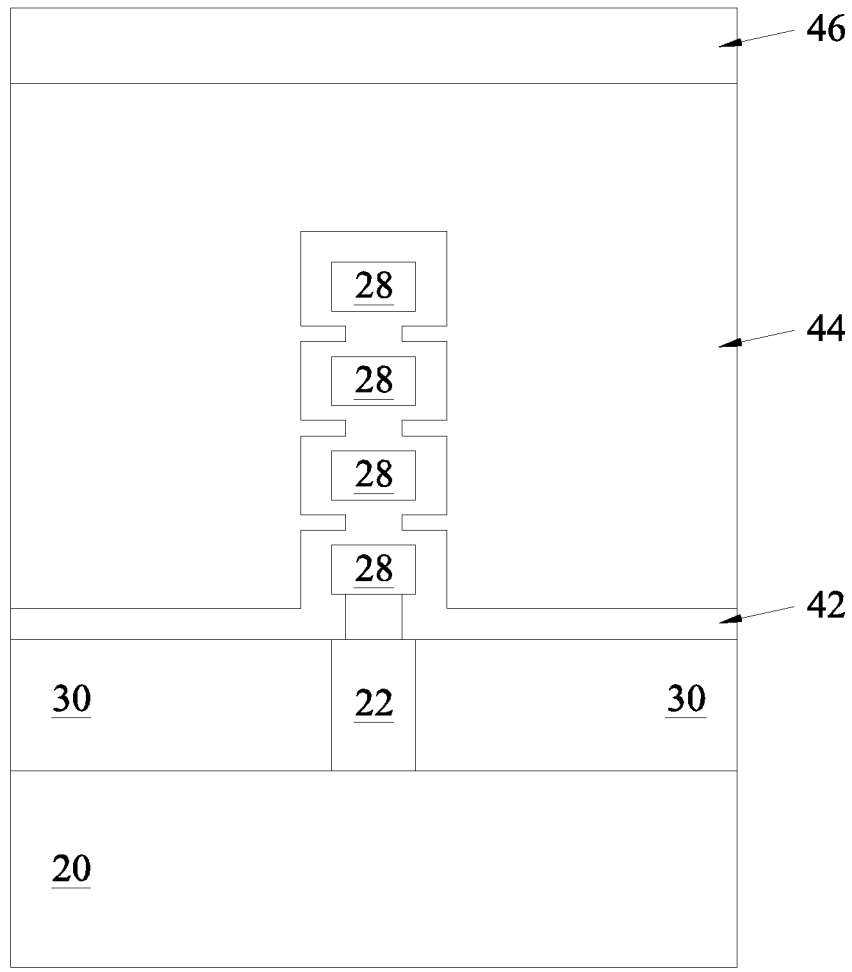

FIGS. 28A, 28B, and 28C illustrate a structure after undergoing the etch in step 170 described in FIGS. 27A, 27B, and 27C and after continuing through processing steps 158 through 162 as discussed above. As illustrate in FIG. 28C, the gate dielectric 42 is conformal to the second layers 28. Depending on the distance between neighboring second layers 28, the gate dielectric 42 may coalesce between the neighboring second layers 28, as illustrated. In other embodiments, the gate dielectric 42 may not coalesce between neighboring second layers 28. Further, the gate electrode 44 can extend at least partially between surfaces of the second layers 28 because the first layers 26 have been removed. A device according to some of these embodiments can be a gate all-around (GAA) device.

The resulting configuration of the gate dielectric 42 and gate electrode 44 in each of FIGS. 22C, 24C, 26C, and 28C can result in a larger electrical field generated by the gate electrode 44 affecting current flow in the channel region in the second layers 28. This larger electrical field can increase short channel control even at small technology nodes, such as less than 14 nm. The specific examples discussed with respect to the different etch steps 170 in FIGS. 21A-C, 23A-C, 25A-C, and 27A-C, and the resulting respective structures in FIGS. 22A-C, 24A-C, 26A-C, and 28A-C, may be appropriate for an n-type device, e.g., n-type finFET.

Figure 29A:
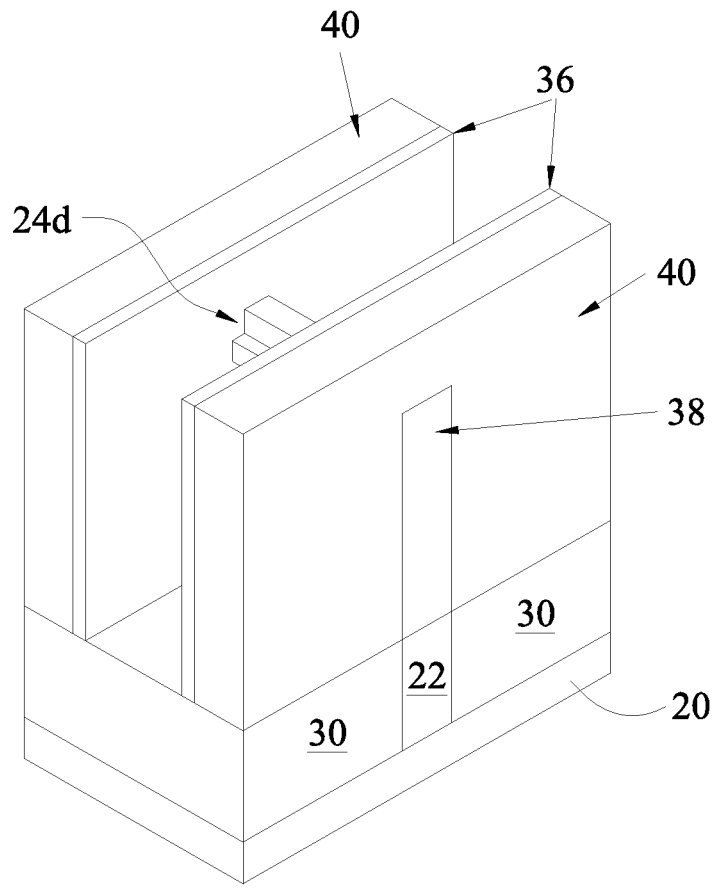
FIGS. 29A, 29B, and 29C are various 3D and cross-sectional views of a result of a fifth example etch step of FIG. 20 in accordance with some embodiments.
Figure 29B:
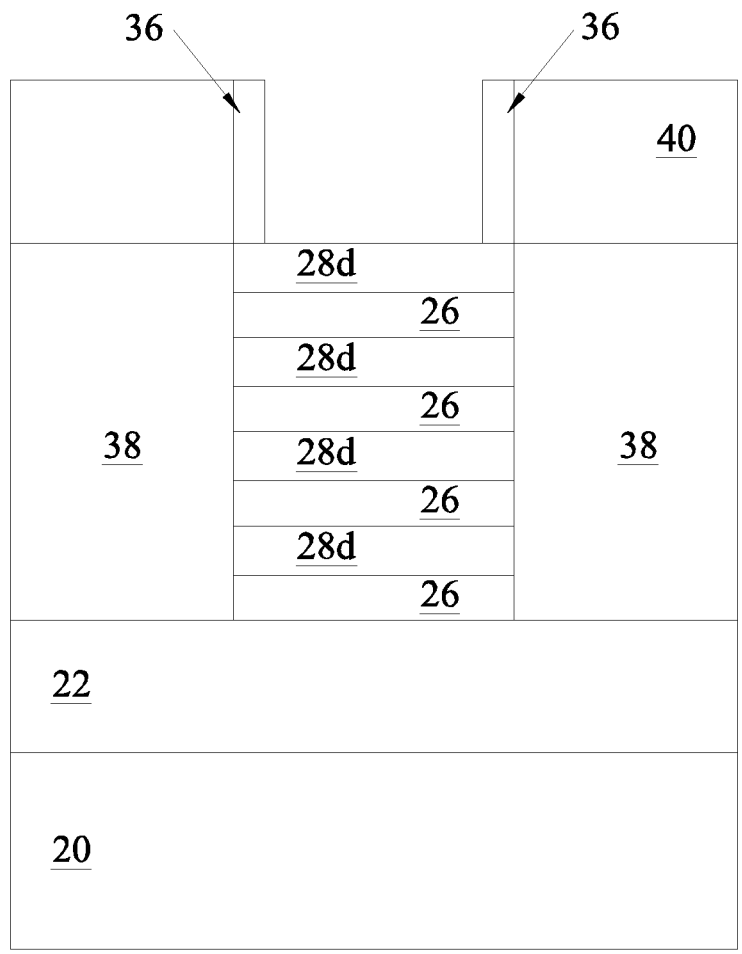
Figure 29C:
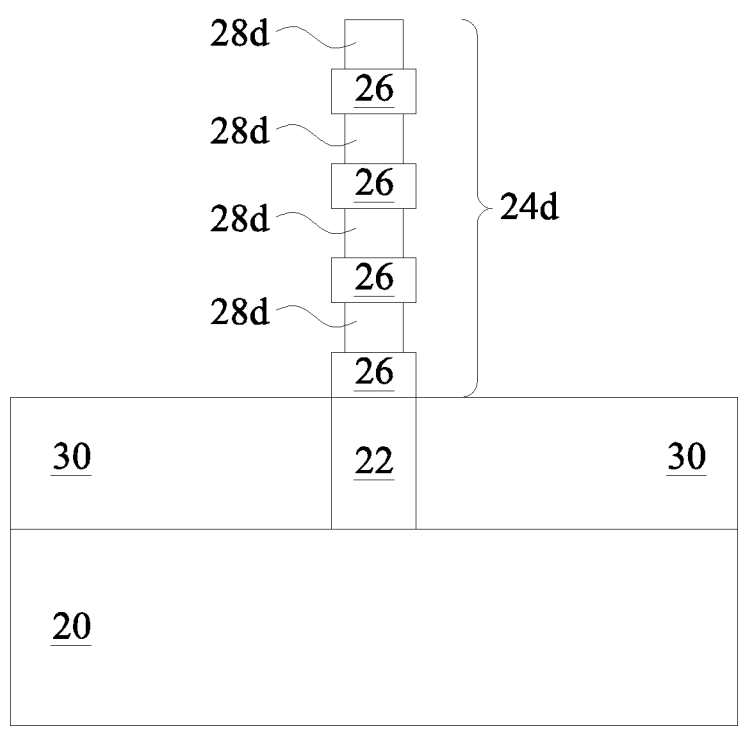

In FIGS. 29A, 29B, and 29C, substantially only the second layers 28 of the superlattice 24 are etched during step 170. As a result of this etch step 170, sidewalls of the etched second layers 28d are offset inwardly to the fin from sidewalls of the first layers 26 on a respective side. The etching results in a fourth modified superlattice 24d. In some embodiments, the result of the etch as illustrated in FIGS. 29A, 29B, and 29C can be a function of the materials of the first layers 26 and the second layers 28, the orientation of the sidewalls, and the etchant used for etching. For example, continuing the specific example where each of the first layers 26 is a layer of $Si_{0.50}Ge_{0.50}$, and each of the second layers 28 is a layer of Si, the buffer layer 22, first layers 26, and second layers 28 are epitaxially grown on a (110) surface of a bulk Si substrate, and the sidewalls of the first layers 26 and the second layers 28 are (111) crystalline surfaces. Further, the etchant can be a wet etchant, such as tetramethylammonium hydroxide (TMAH), ammonium hydroxide ($NH_4OH$), or the like, which is selective to the (111) crystalline surfaces of the Si second layers 28. These conditions can result in (111) crystalline sidewall surfaces of the etched Si second layers 28d that are inwardly offset from (111) crystalline sidewall surfaces of the $Si_{0.50}Ge_{0.50}$ first layers 26.

Figure 30A:
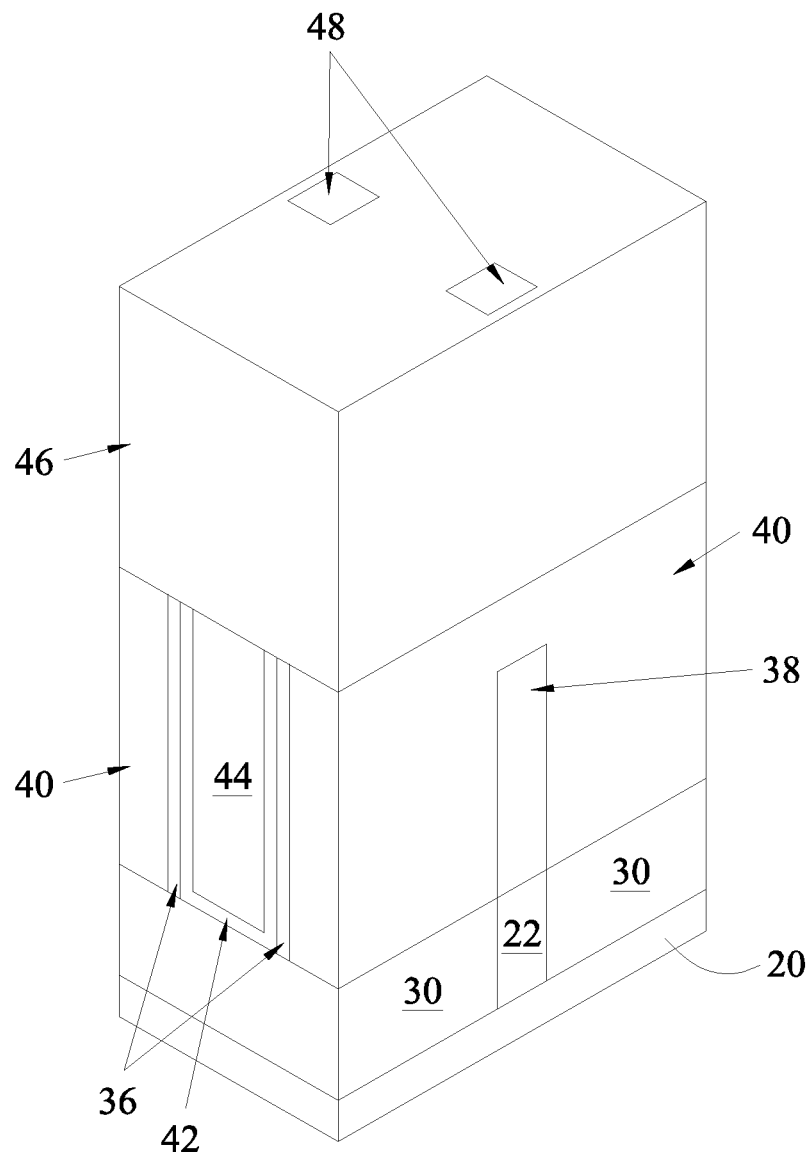
FIGS. 30A, 30B, and 30C are various 3D and cross-sectional views of a structure formed with the etch step of FIGS. 29A-C and according to the process flow chart of FIG. 20 in accordance with some embodiments.
Figure 30B:
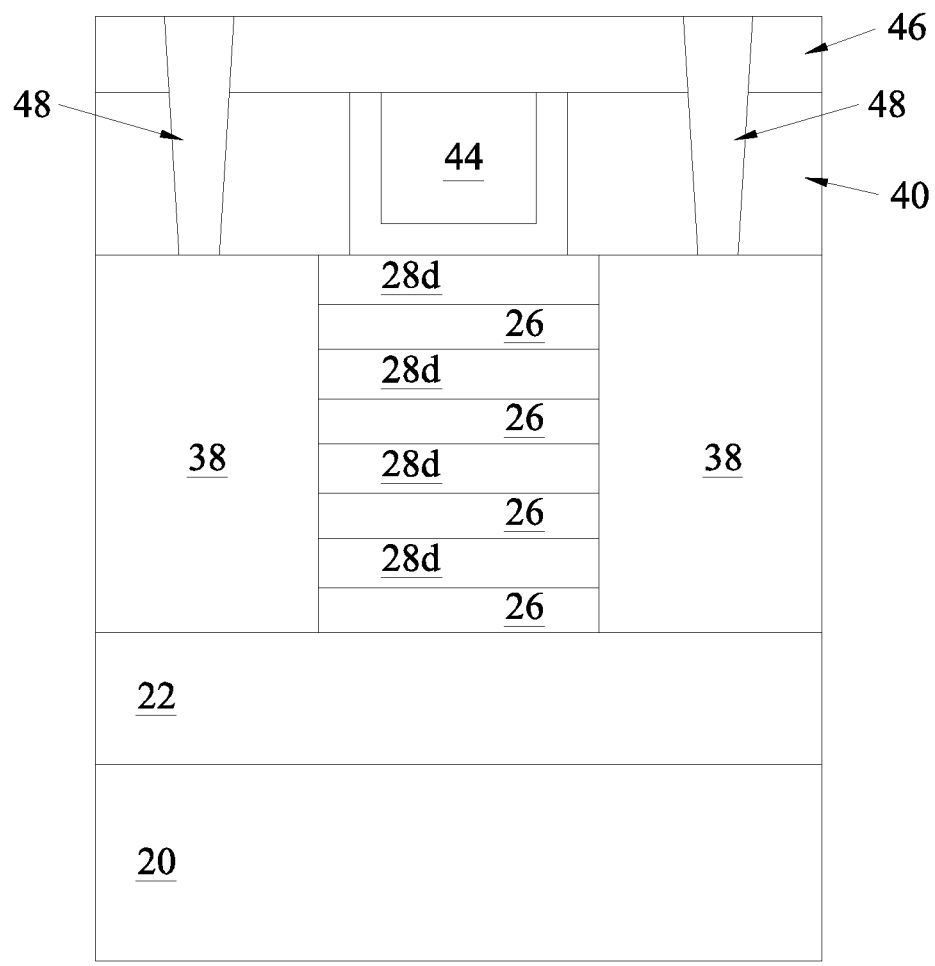
Figure 30C:
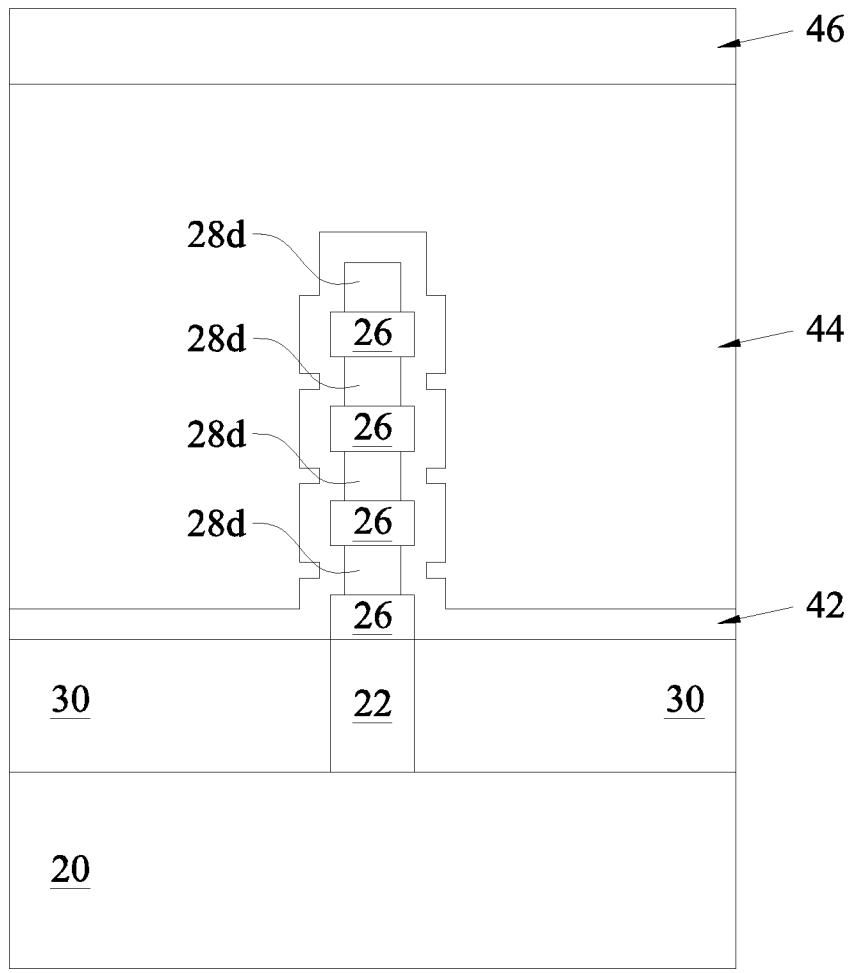

FIGS. 30A, 30B, and 30C illustrate a structure after undergoing the etch in step 170 described in FIGS. 29A, 29B, and 29C and after continuing through processing steps 158 through 162 as discussed above. As illustrated in FIG. 30C, the gate dielectric 42 is conformal to the etched sidewalls in the fourth modified superlattice 24d. Further, the gate electrode 44 can extend at least partially between or closer to surfaces of the first layers 26 because the etched second layers 28d have been etched.

Figure 31A:
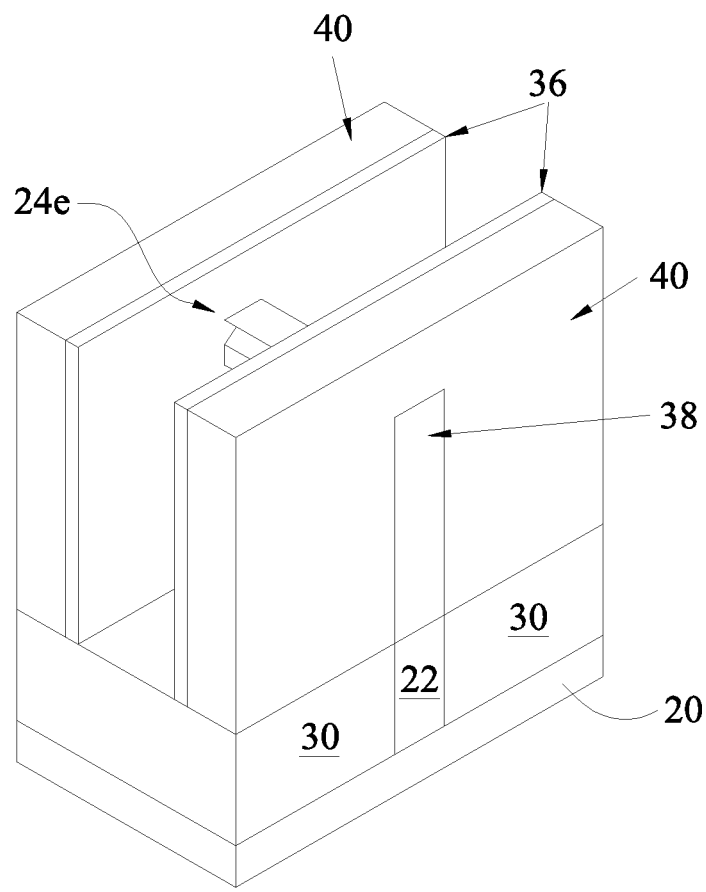
FIGS. 31A, 31B, and 31C are various 3D and cross-sectional views of a result of a sixth example etch step of FIG. 20 in accordance with some embodiments.
Figure 31B:
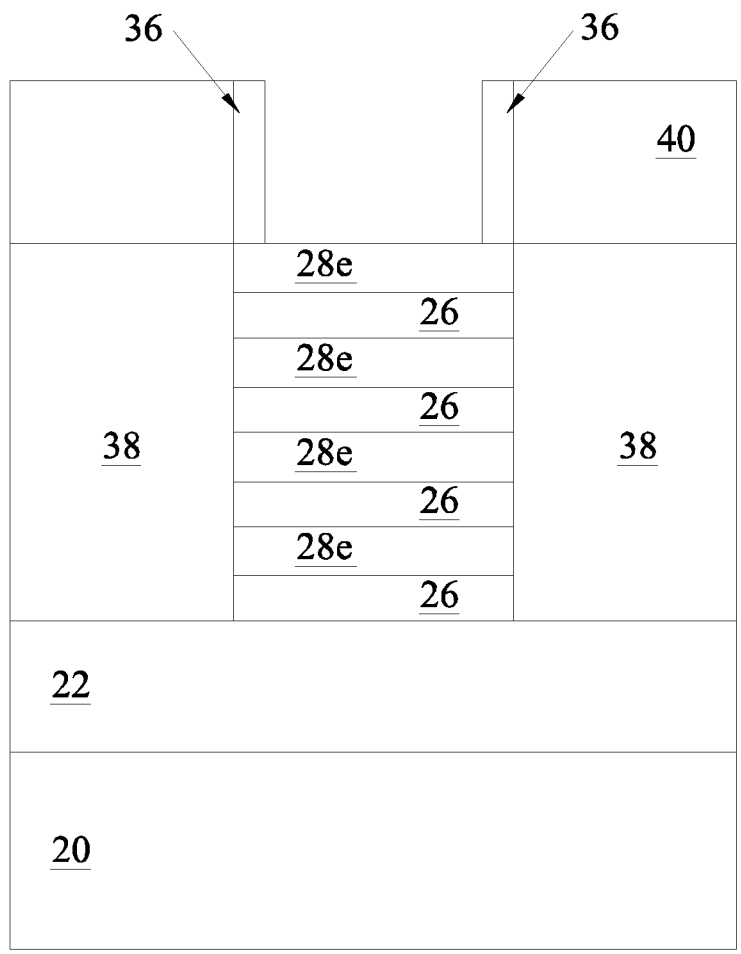
Figure 31C:
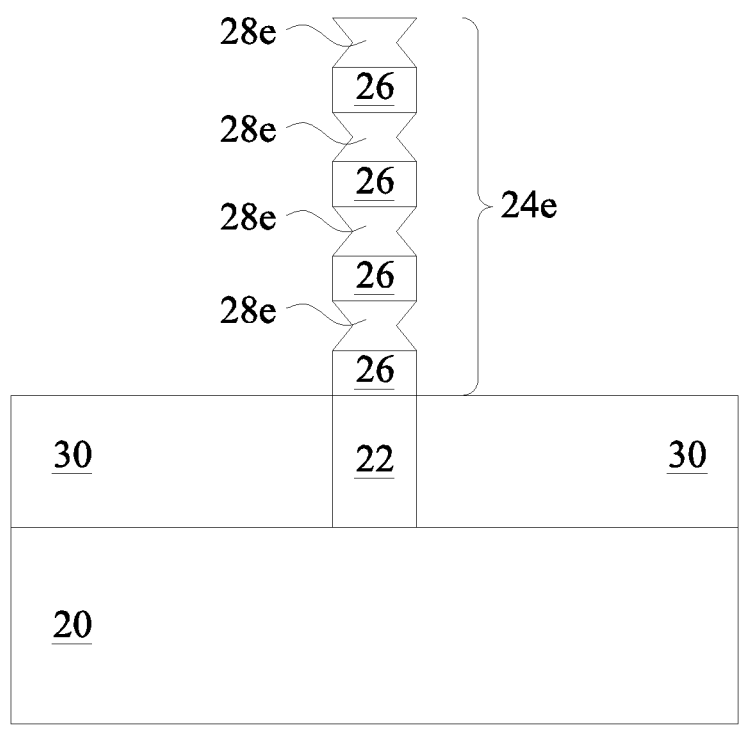

In FIGS. 31A, 31B, and 31C, substantially only the second layers 28 of the superlattice 24 are etched during step 170. As a result of this etch step 170, sidewalls of the etched second layers 28e are anisotropically notched, e.g., according to a crystalline plane, inwardly to the fin from sidewalls of the first layers 26 on a respective side. The etching results in a fifth modified superlattice 24e. In some embodiments, the result of the etch as illustrated in FIGS. 31A, 31B, and 31C can be a function of the materials of the first layers 26 and the second layers 28, the orientation of the sidewalls, and the etchant used for etching. For example, continuing the specific example where each of the first layers 26 is a layer of $Si_{0.50}Ge_{0.50}$, and each of the second layers 28 is a layer of Si, the buffer layer 22, first layers 26, and second layers 28 are epitaxially grown on a (001) surface of a bulk Si substrate, and the sidewalls of the first layers 26 and the second layers 28 are (110) crystalline surfaces. Further, the etchant can be a wet etchant, such as TMAH, ammonium hydroxide ($NH_4OH$), or the like, which is selective to the (111) crystalline surfaces of the Si second layers 28. These conditions can result in (111) crystalline notched surfaces of the etched Si second layers 28e that are notched inwardly from (110) crystalline sidewall surfaces of the $Si_{0.50}Ge_{0.50}$ first layers 26.

Figure 32A:
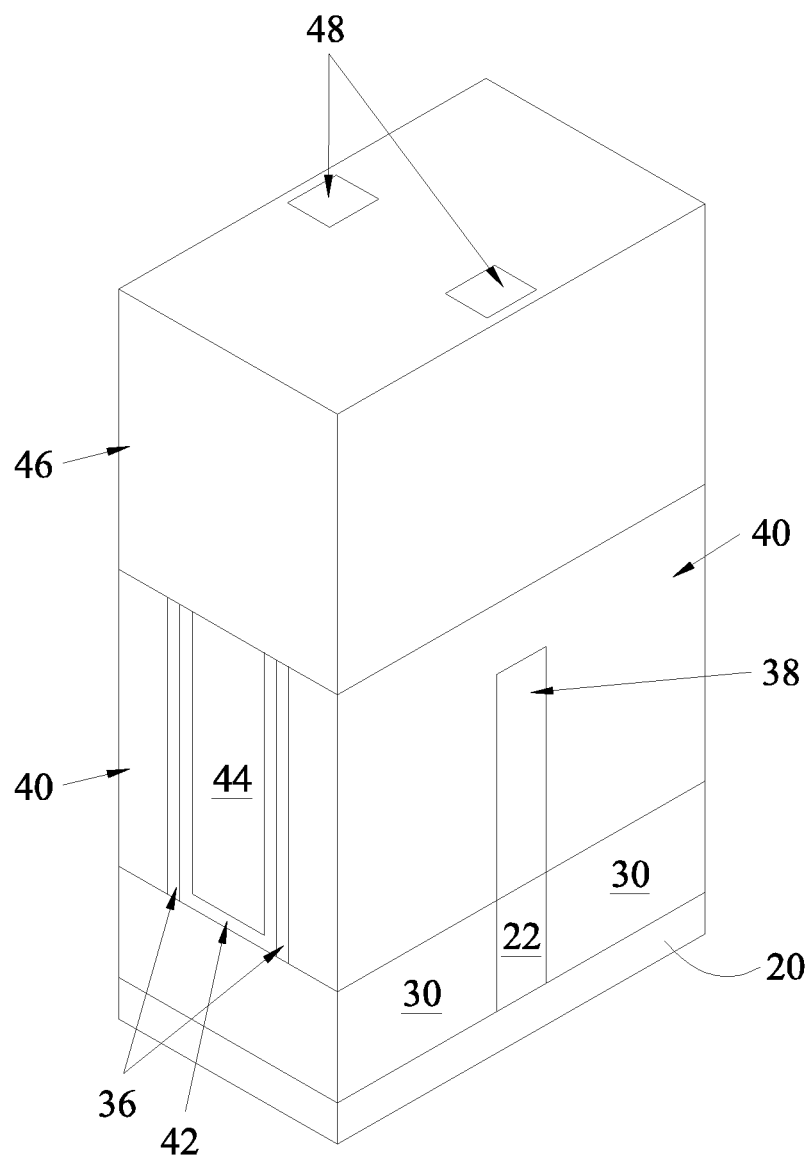
FIGS. 32A, 32B, and 32C are various 3D and cross-sectional views of a structure formed with the etch step of FIGS. 31A-C and according to the process flow chart of FIG. 20 in accordance with some embodiments.
Figure 32B:
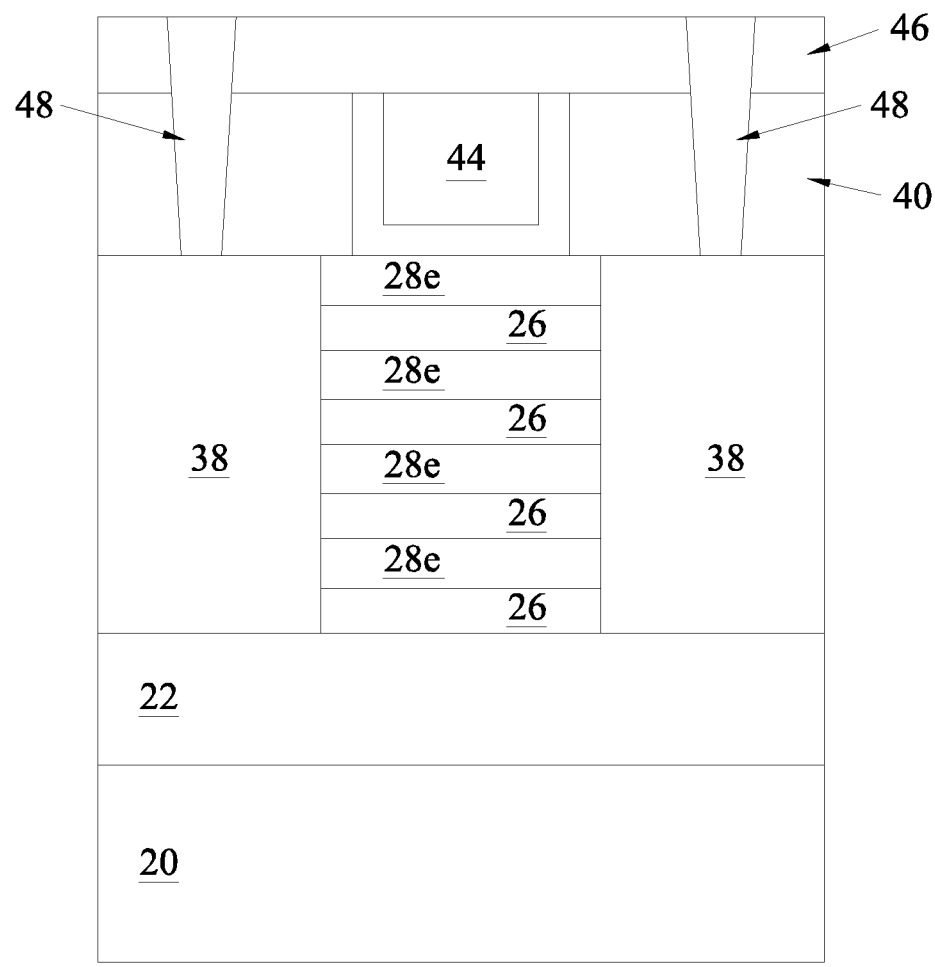
Figure 32C:
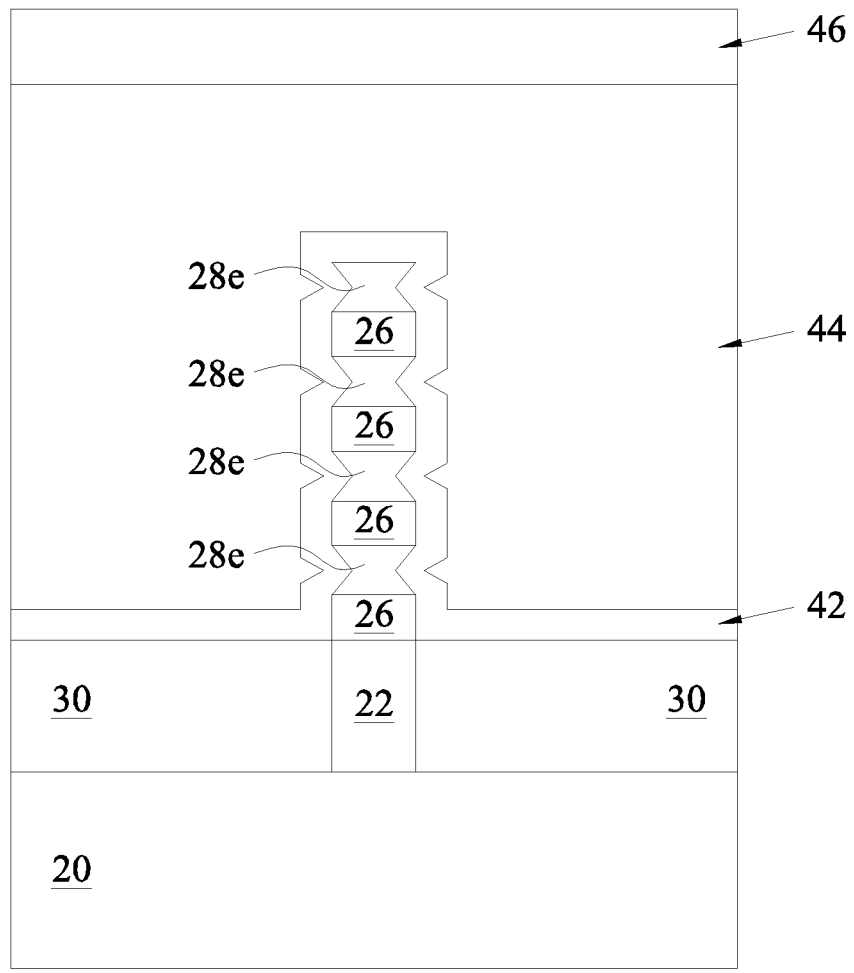

FIGS. 32A, 32B, and 32C illustrate a structure after undergoing the etch in step 170 described in FIGS. 31A, 31B, and 31C and after continuing through processing steps 158 through 162 as discussed above. As illustrated in FIG. 32C, the gate dielectric 42 is conformal to the etched sidewalls in the fifth modified superlattice 24e. Further, the gate electrode 44 can extend at least partially between or closer to surfaces of the first layers 26 because the etched second layers 28e have been etched.

Figure 33A:
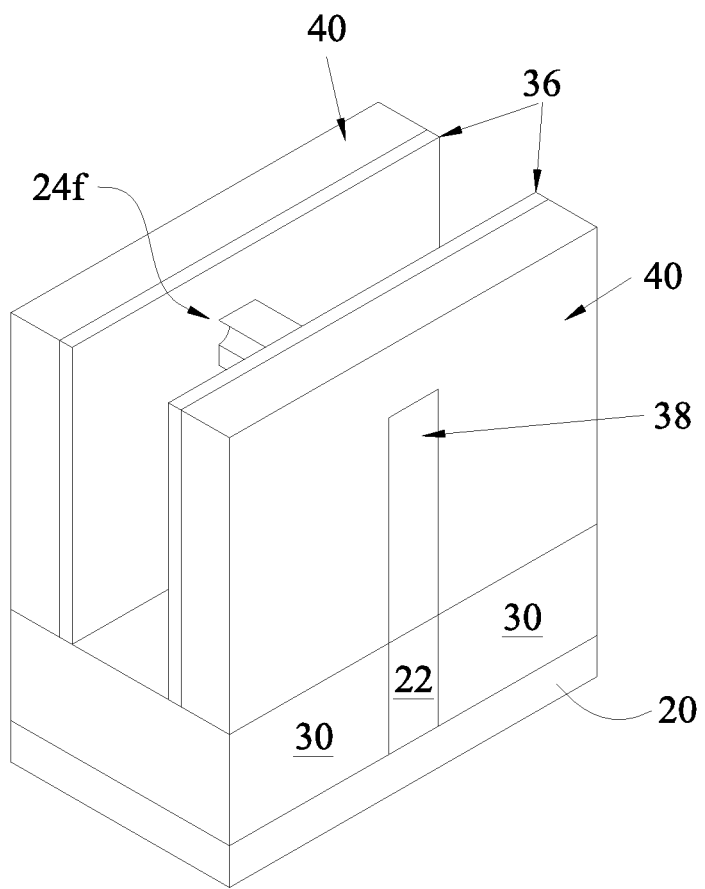
FIGS. 33A, 33B, and 33C are various 3D and cross-sectional views of a result of a seventh example etch step of FIG. 20 in accordance with some embodiments.
Figure 33B:
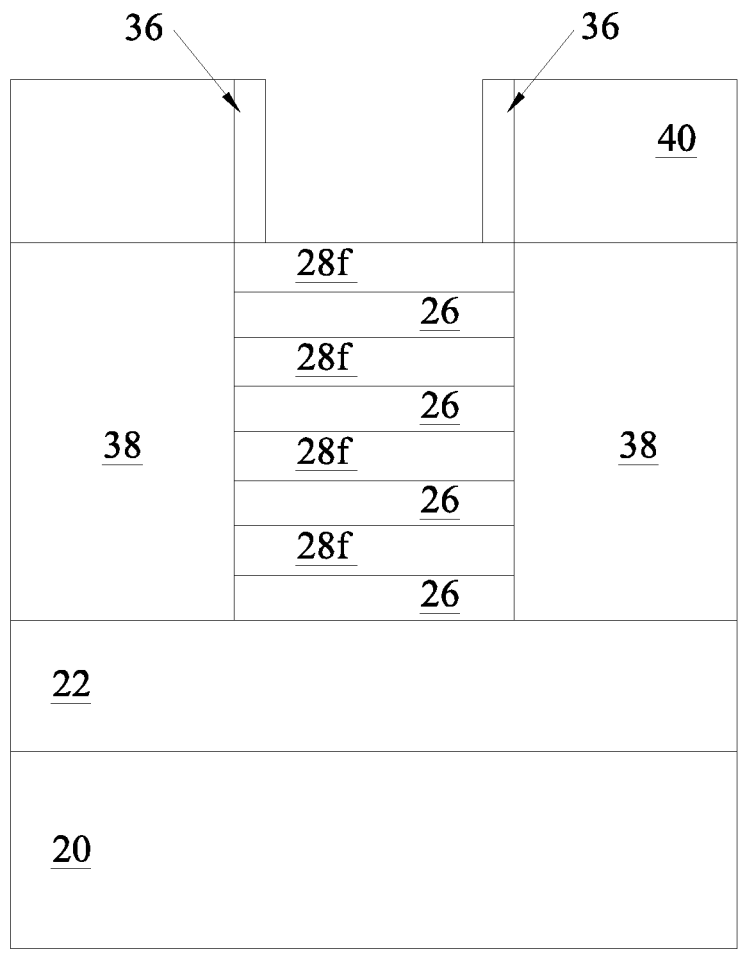
Figure 33C:
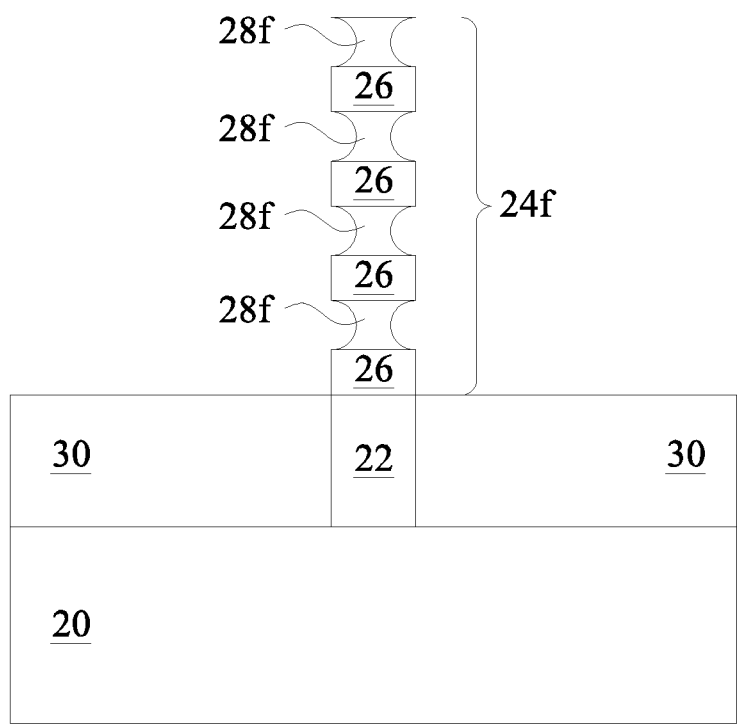

In FIGS. 33A, 33B, and 33C, substantially only the second layers 28 of the superlattice 24 are etched during step 170. As a result of this etch step 170, sidewalls of the etched second layers 28f are isotropically notched inwardly to the fin from sidewalls of the first layers 26 on a respective side. The etching results in a sixth modified superlattice 24f. In some embodiments, the result of the etch as illustrated in FIGS. 33A, 33B, and 33C can be a function of the materials of the first layers 26 and the second layers 28 and the etchant used for etching. For example, continuing the specific example where each of the first layers 26 is a layer of $Si_{0.50}Ge_{0.50}$, and each of the second layers 28 is a layer of Si, the etching can use a dry isotropic etch, such as using a mixture of HCl gas, $Cl_2$ gas, and/or $NF_3$ gas, or the like. As one of skill will readily understand, a selectivity of HCl gas and $Cl_2$ gas can be modified by controlling a temperature and pressure of the etching process. These conditions can result in isotropically notched surfaces of the etched Si second layers 28f that are notched inwardly from sidewall surfaces of the $Si_{0.50}Ge_{0.50}$ first layers 26.

Figure 34A:
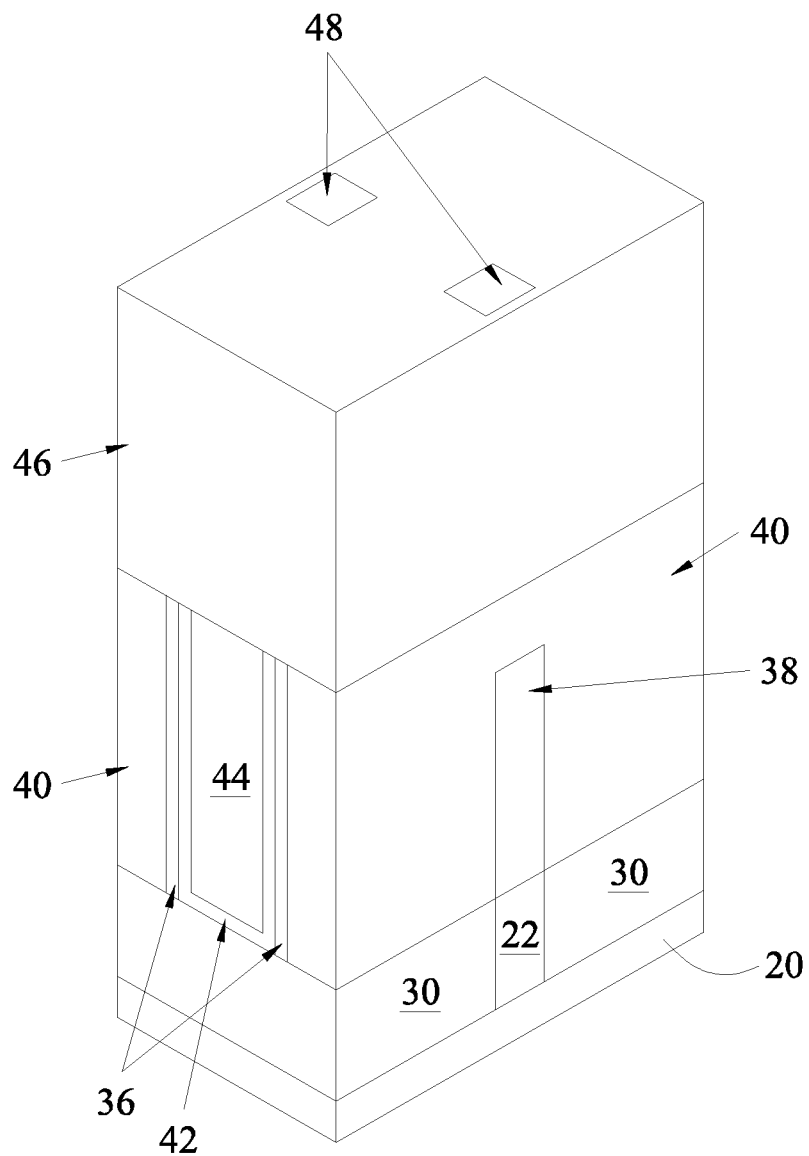
FIGS. 34A, 34B, and 34C are various 3D and cross-sectional views of a structure formed with the etch step of FIGS. 33A-C and according to the process flow chart of FIG. 20 in accordance with some embodiments.
Figure 34B:
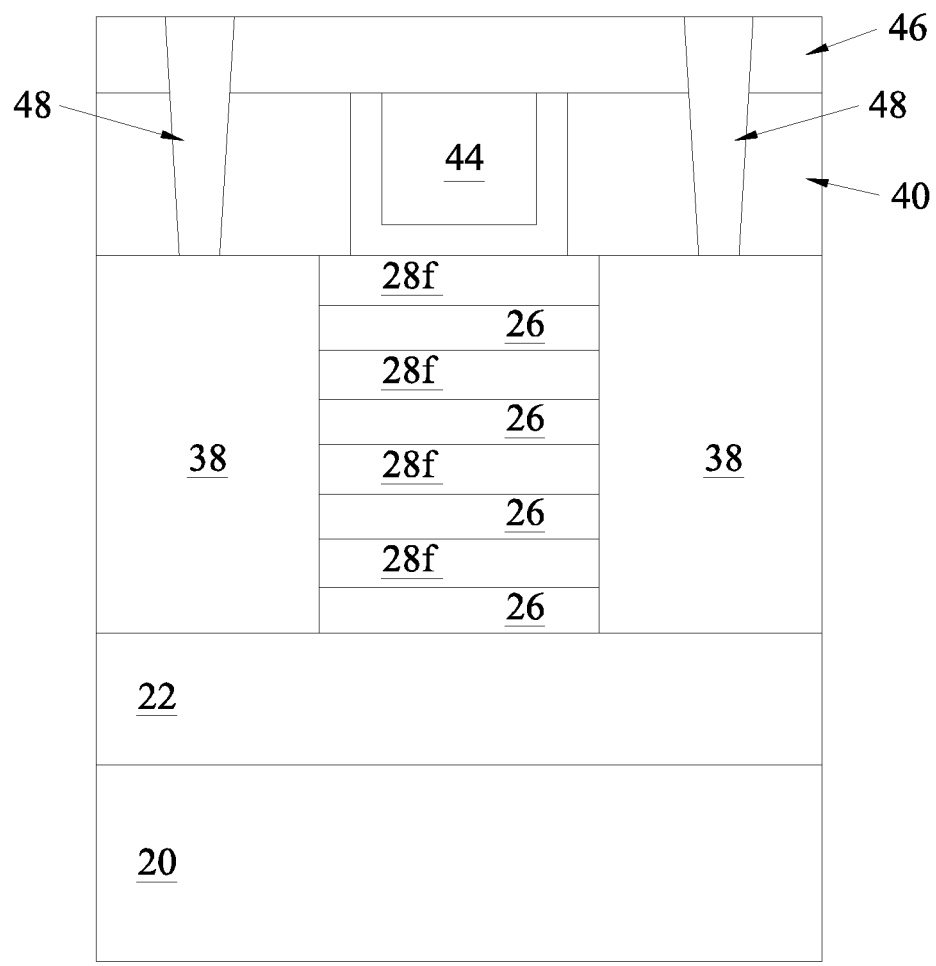
Figure 34C:
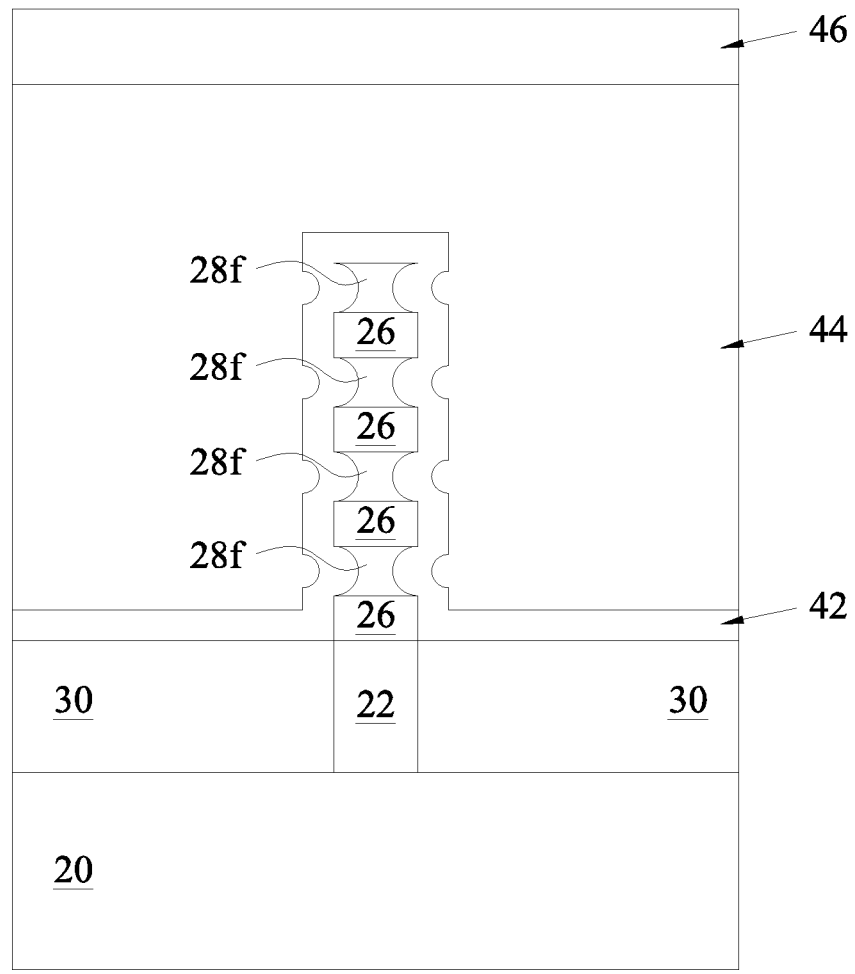

FIGS. 34A, 34B, and 34C illustrate a structure after undergoing the etch in step 170 described in FIGS. 33A, 33B, and 33C and after continuing through processing steps 158 through 162 as discussed above. As illustrate in FIG. 34C, the gate dielectric 42 is conformal to the etched sidewalls in the sixth modified superlattice 24f. Further, the gate electrode 44 can extend at least partially between or closer to surfaces of the first layers 26 because the etched second layers 28f have been etched.

Figure 35A:
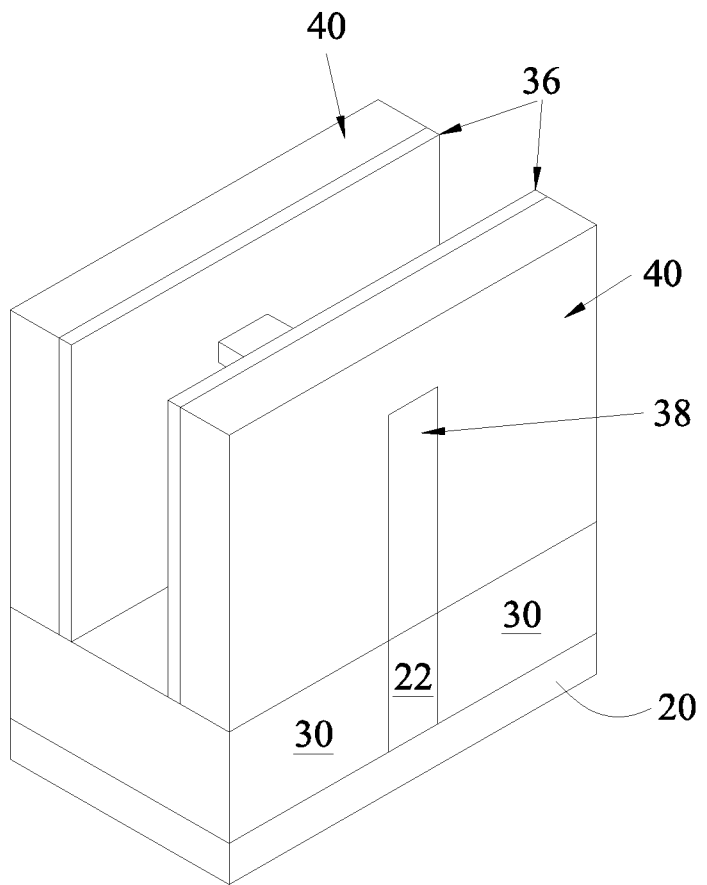
Figure 35B:
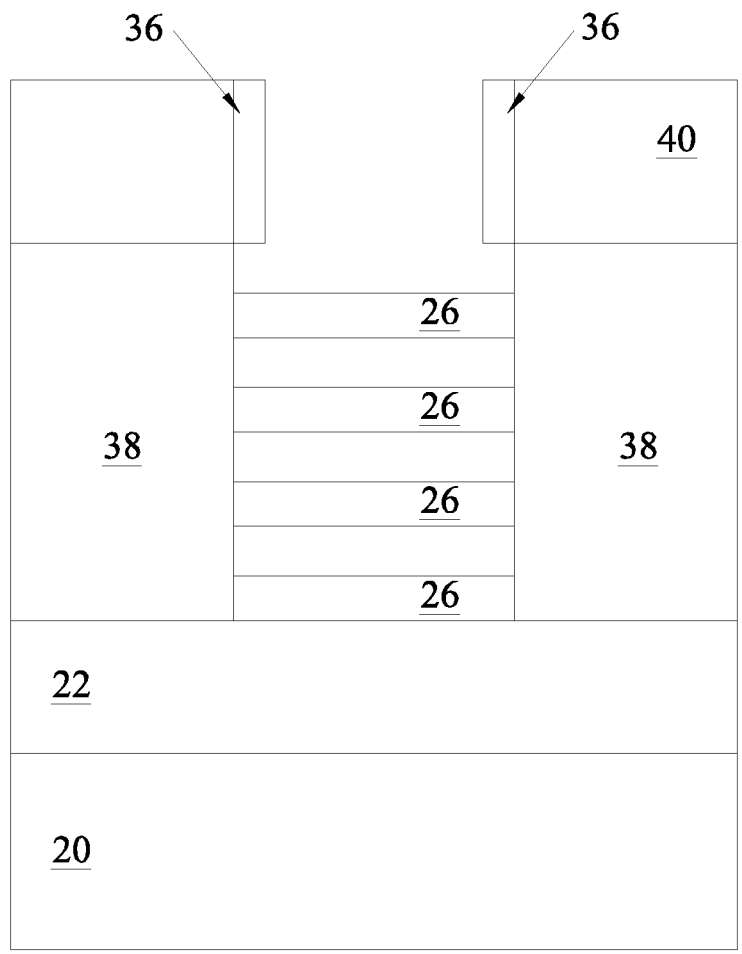
Figure 35C:
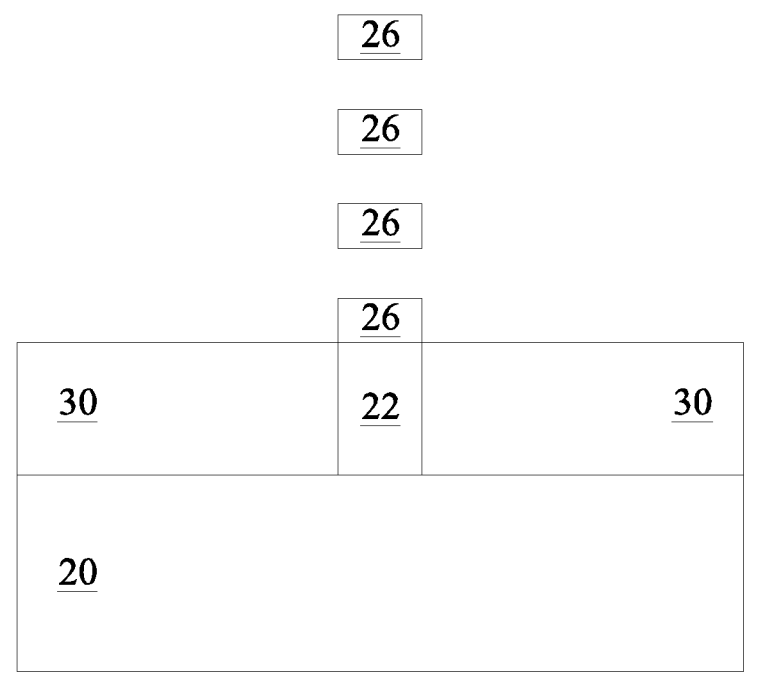

In FIGS. 35A, 35B, and 35C, substantially only the second layers 28 of the superlattice 24 are etched during step 170. As a result of this etch step 170, the second layers 28 are removed. Any of the etching examples provided above, or any other etch selective to the second layers 28, can be used at a longer duration until the second layers 28 are removed.

Figure 36A:
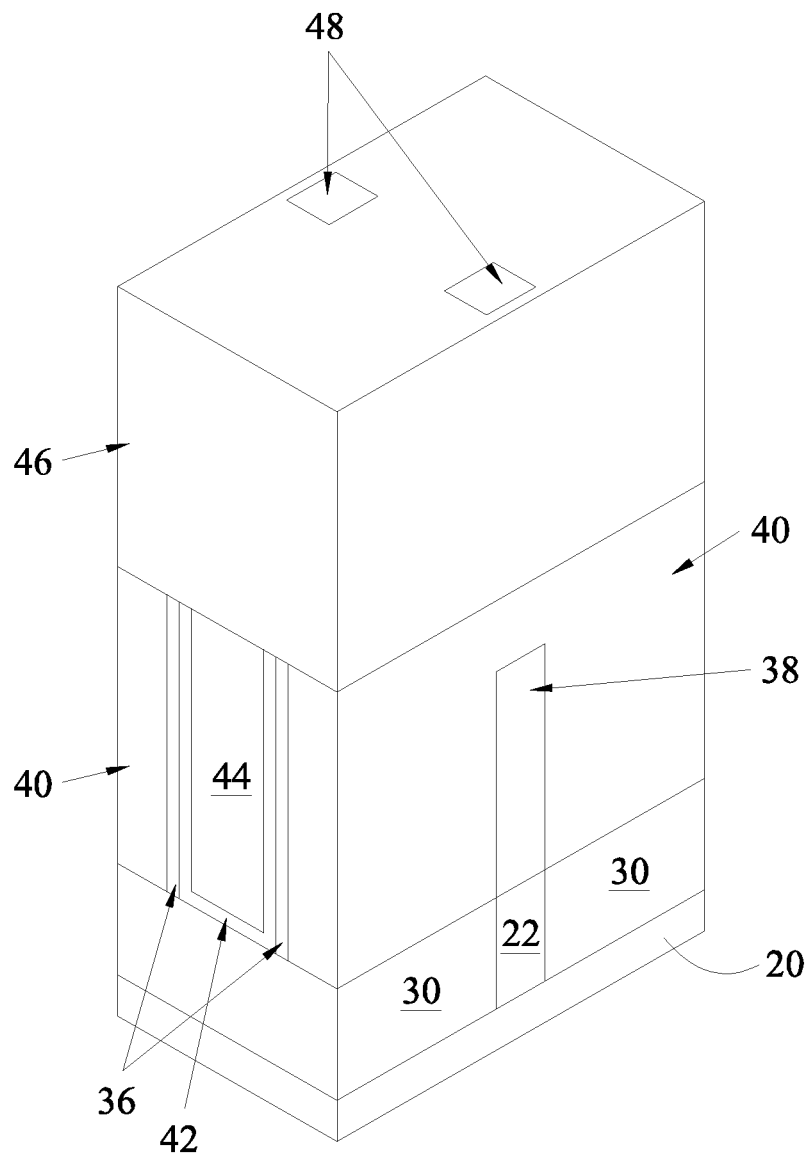
FIGS. 36A, 36B, and 36C are various 3D and cross-sectional views of a structure formed with the etch step of FIGS. 35A-C and according to the process flow chart of FIG. 20 in accordance with some embodiments.
Figure 36B:
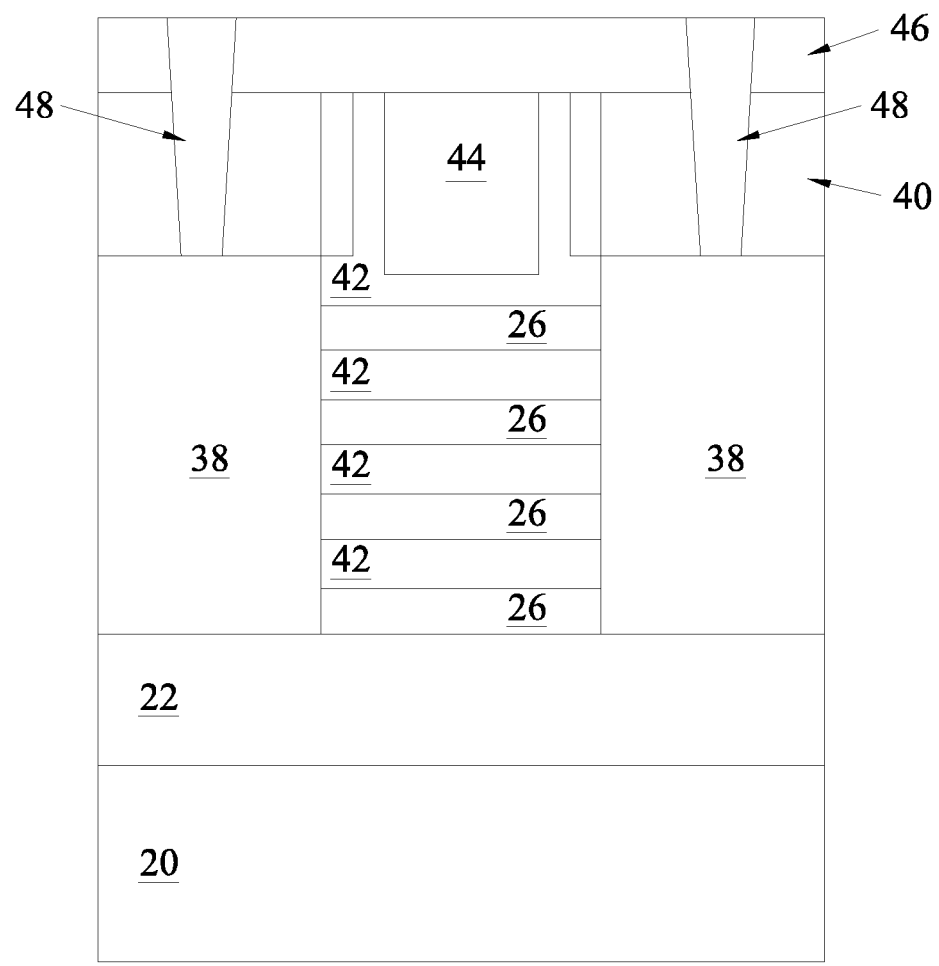
Figure 36C:
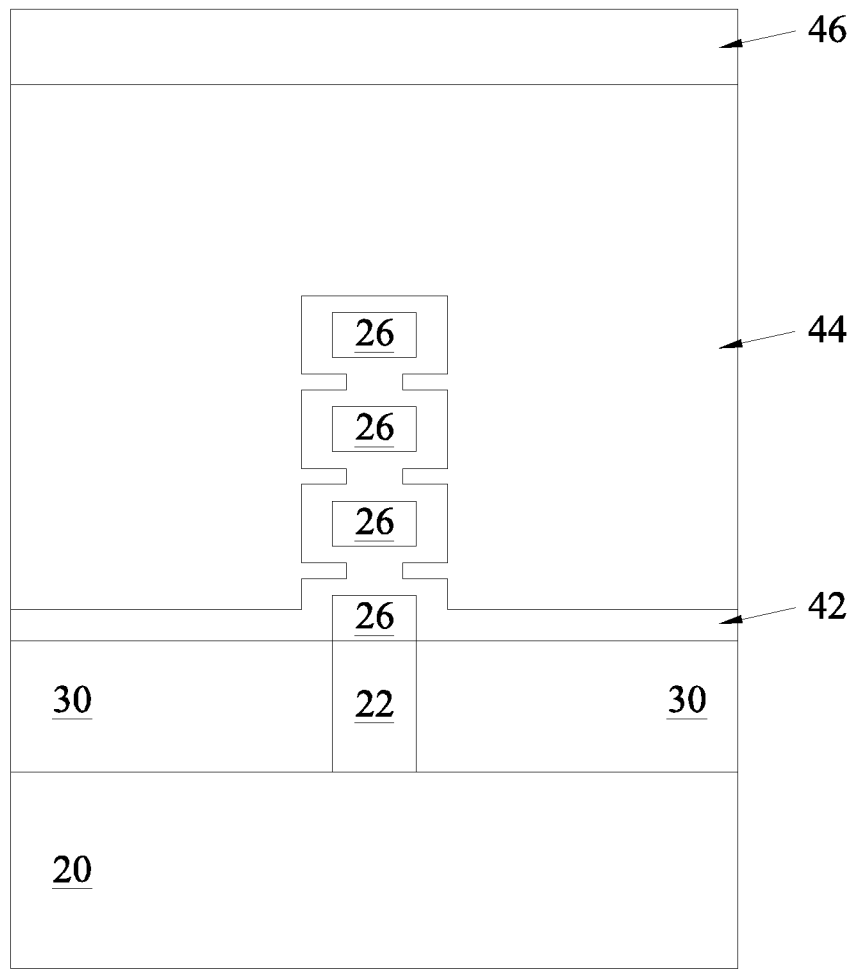

FIGS. 36A, 36B, and 36C illustrate a structure after undergoing the etch in step 170 described in FIGS. 35A, 35B, and 35C and after continuing through processing steps 158 through 162 as discussed above. As illustrate in FIG. 36C, the gate dielectric 42 is conformal to the first layers 26. Depending on the distance between neighboring first layers 26, the gate dielectric 42 may coalesce between the neighboring first layers 26, as illustrated. In other embodiments, the gate dielectric 42 may not coalesce between neighboring first layers 26. Further, the gate electrode 44 can extend at least partially between surfaces of the first layers 26 because the second layers 28 have been removed. A device according to some of these embodiments can be a GAA device.

The resulting configuration of the gate dielectric 42 and gate electrode 44 in each of FIGS. 30C, 32C, 34C, and 36C can result in a larger electrical field generated by the gate electrode 44 affecting current flow in the channel region in the first layers 26. This larger electrical field can increase short channel control even at small technology nodes, such as less than 14 nm. The specific examples discussed with respect to the different etch steps 170 in FIGS. 29A-C, 31A-C, 33A-C, and 35A-C, and the resulting respective structures in FIGS. 30A-C, 32A-C, 34A-C, and 36A-C, may be appropriate for a p-type device, e.g., p-type finFET.

Some embodiments contemplate a structure, such as a fin, that includes a stressed superlattice, where the stressed superlattice has alternating layers that have opposing strain types (e.g., tensile versus compressive). For example, the stressed superlattice can include alternating compressively strained layers and tensilely strained layers. The superlattice can have any number of these layers. By alternating compressively and tensilely strained layers, stresses in each layer may not degrade in upper portions of the structure, e.g., fin, as much as compared to a single strained layer structure. For example, some stress may be lost in an upper portion of a single strained layer fin by elastic relaxation, particularly in smaller technology nodes, but in some embodiments, the counteracting stresses in adjacent layers may prevent significant elastic relaxation in any layer. Even further, by increasing the number of these alternating layers, less stress degradation in each layer may be achieved. The inventors performed simulations where the materials of the relaxed buffer layers, compressively strained layers, and tensilely strained layers remained constant and with fin heights varying to observe stress at an upper portion of different fin structures. The simulations included a single strained layer fin, a fin with a four layer superlattice with alternating compressively strained layers and tensilely strained layers, and a fin with an eight layer superlattice with alternating compressively strained layers and tensilely strained layers. As the fin height was increased for each fin structure, the fin with the single strained layer had the most significant stress degradation at the upper portion of the fin, while the fin with the eight layer superlattice had the least amount of stress degradation at the upper portion of the fin. This can reduce the layout dependence effect, which can be attributed to the scaling of the layout of the active area fin. As a layout of a fin is scaled down to smaller technology nodes, elastic relaxation in a single strained layer can be proportionally increased. Having a stressed superlattice with alternating strained layers as discussed above can mitigate this effect.

By having layers be strained as a result of mismatching natural lattice constants and epitaxial growth, some embodiments can have an appropriate stress in a channel region that is less dependent on the pitch scaling of the device. For example, as devices are scaled to smaller technology nodes, the stress induced in a channel region by conventional embedded stressors in source and drain regions degrades. Hence, the channel stress of conventional structures can be dependent on the size of the device. Some embodiments can obviate this deficiency by inducing stress based on the mismatching of natural lattice constants of materials in the channel region, and therefore, the stress in the channel region of a device can be less dependent on the pitch scaling of the device.

Some embodiments contemplate a channel region, such as in a fin, that has irregularities, such as corners, where an electric field can be increased in the channel region such that a carrier density can be increased. As discussed above, embodiments discussed with respect to FIGS. 22C, 24C, 26C, 28C, 30C, 32C, 34C, and 36C can result in a larger electrical field generated by the gate electrode 44 affecting current flow in the channel region in the first layers 26 or second layers 28. This increased electrical field can cause an increased density of carriers proximate the corners of the un-etched layers in those embodiments. This can improve gate control of the device and can reduce the short channel effect. In simulations of some embodiments discussed above having one group of layers that is etched, it was observed that a current density of the on-current ($I_{on}$) was increased at smaller technology nodes, such as devices having a channel length of 14 nm and less, relative to a conventional fin device. Further, in other simulations of some embodiments, the subthreshold slope was reduced at smaller technology nodes, such as devices have a channel length of 14 nm and less, relative to a conventional fin device In these embodiments with irregularities in the channel region, the first layers 26 and the second layers 28 do not necessarily need to be strained. One group may be relaxed while the other is tensilely strained; one group may be relaxed with the other is compressively strained; one group may be tensilely strained while the other is compressively strained; or both groups may be relaxed. The stress may increase carrier mobility as conventionally known. In some embodiments as discussed above with alternating compressively strained layers and tensilely strained layers, etching one group of layers, e.g., either the first layers 26 or the second layers 28, can result in some degradation of stress in the other group of layers. However, the un-etched group of layers may remain strained to achieve higher carrier mobility. Further, the extent to which the etched group of layers is etched can affect the stress degradation in the un-etched group of layers. For example, increasing the amount that the etched group of layers is etched can result in increased stress degradation in the un-etched group of layers.

Figure 37:
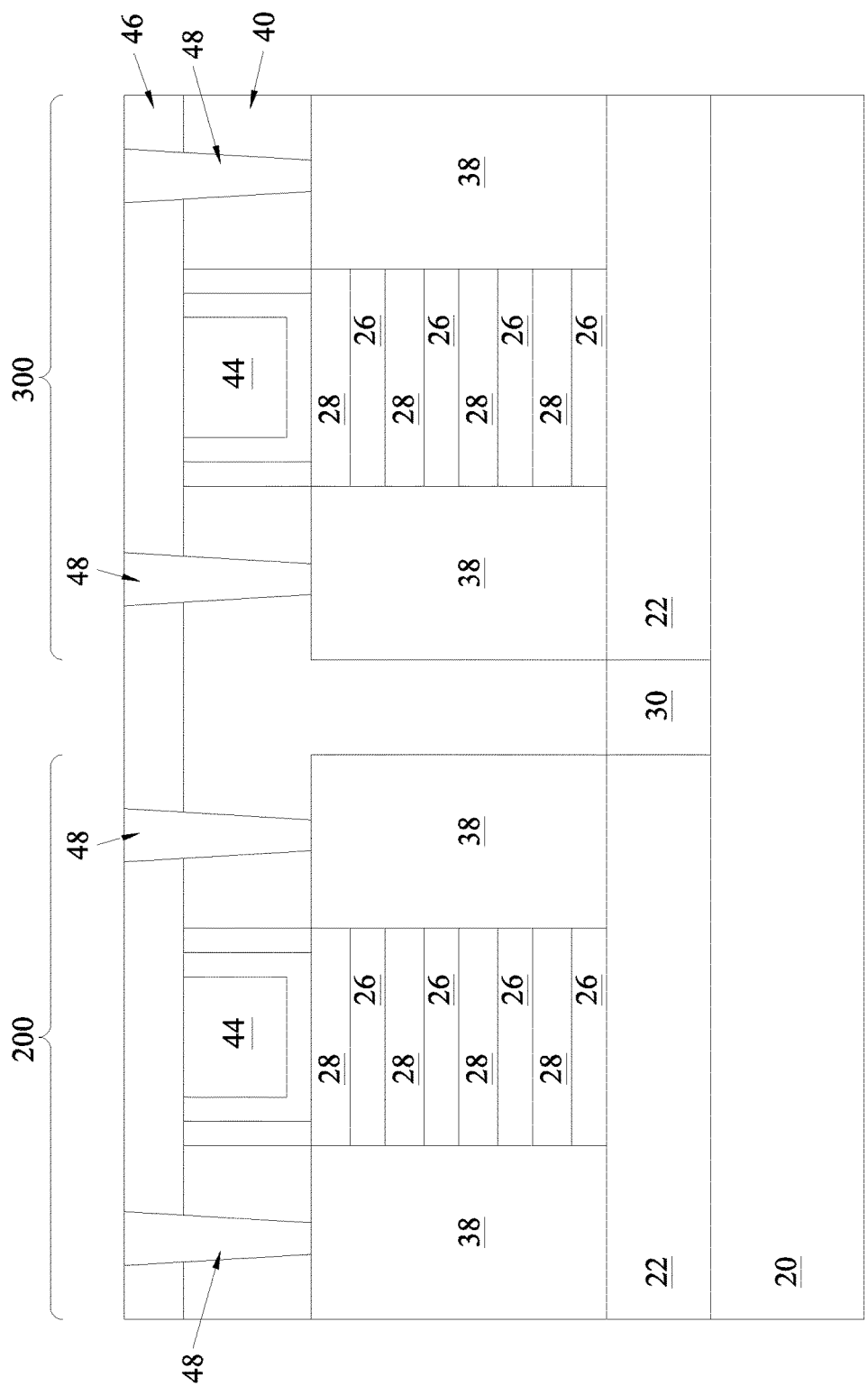
FIG. 37 is a cross-sectional view of a complementary device structure in accordance with some embodiments.

Further, some embodiments can be easily integrated into processes and devices. A same superlattice structure may be used during the manufacture of both a p-type device and an n-type device. Therefore, the same superlattice structure can be easily integrated into complementary devices. For example, FIG. 37 illustrates a cross-sectional view of a complementary device structure comprising an n-type device region 200 and a p-type device region 300 in accordance with some embodiments. Some embodiments contemplate complementary devices having any combination of the structures described above. For example, in the context of the specific examples with the $Si_{0.50}Ge_{0.50}$ first layers 26 and the Si second layers 28, and for a complementary device having both an n-type device and a p-type device, any of the structures in FIGS. 18A-C, 22A-C, 24A-C, 26A-C, and 28A-C can be used for the n-type device, e.g., n-type finFET, in the n-type device region 200, and any of the structures in FIGS. 18A-C, 30A-C, 32A-C, 34A-C, and 36A-C can be used for the p-type device, e.g., p-type finFET, in the p-type device region 300. Although the first layers 26 and the second layers 28 are illustrated in both the n-type device region 200 and the p-type device region 300, the first layer 26 may be removed or omitted from one of the regions 200 or 300, such as in FIGS. 28A-C, and/or the second layers 28 may be removed or omitted from one, e.g., in appropriate instances, the other, of the regions 200 or 300 as in FIGS. 36A-C.

An embodiment is a structure. The structure includes a channel region, a first source/drain region, a second source/drain region, a dielectric layer, and a gate electrode. The channel region includes first semiconductor layers above a substrate. Each of the first semiconductor layers is separated from neighboring ones of the first semiconductor layers, and each of the first semiconductor layers has a first sidewall and a second sidewall. The first sidewalls are aligned along a first plane extending perpendicularly to the substrate, and the second sidewalls are aligned along a second plane extending perpendicularly to the substrate. The first source/drain region and the second source/drain region are disposed on opposite sides of the channel region. Each of the first semiconductor layers extends from the first source/drain region to the second source/drain region. The dielectric layer contacts the first sidewalls and the second sidewalls of the first semiconductor layers, and the dielectric layer extends into a region between the first plane and the second plane. The gate electrode is over the dielectric layer.

Another embodiment is a structure. The structure comprises an n-type device and a p-type device. The n-type device comprises a first channel region, a first source/drain region, a second source/drain region, a first gate dielectric, and a first gate electrode. The first channel region comprises a first superlattice comprising alternating first layers and second layers. The first layers are a first semiconductor material, and the second layers are a second semiconductor material. The first source/drain region and the second source/drain region are disposed on opposite sides of the first channel region. Each of the first layers and the second layers extends from the first source/drain region to the second source/drain region. The first gate dielectric is on the first superlattice. The first gate electrode is on the first gate dielectric. The p-type device comprises a second channel region, a third source/drain region, a fourth source/drain region, a second gate dielectric, and a second gate electrode. The second channel region comprises a second superlattice comprising alternating third layers and fourth layers. The third layers are the first semiconductor material, and the fourth layers are the second semiconductor material. The first semiconductor material and the second semiconductor material are ordered in the second superlattice a same order as in the first superlattice. The third source/drain region and the fourth source/drain region are disposed on opposite sides of the second channel region. Each of the third layers and the fourth layers extends from the third source/drain region to the fourth source/drain region. The second gate dielectric is on the second superlattice. The second gate electrode is on the second gate dielectric.

A further embodiment is a method. The method comprises forming a fin comprising a superlattice, the superlattice comprising alternating first layers and second layers; after forming the fin, selectively etching the first layers; after selectively etching the first layers, forming a gate dielectric on the second layers; and forming a gate electrode on the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a first transistor comprising:
        a first channel region comprising alternating first semiconductor layers and second semiconductor layers above a substrate, each of the first semiconductor layers being separated from neighboring ones of the first semiconductor layers, each of the first semiconductor layers in the first channel region having a first sidewall and a second sidewall, the first sidewalls being aligned along a first plane extending perpendicularly to the substrate, the second sidewalls being aligned along a second plane extending perpendicularly to the substrate, sidewalls of the second semiconductor layers in the first channel region being between the first plane and the second plane;
        a first source/drain region and a second source/drain region disposed on opposite sides of the first channel region, each of the first semiconductor layers extending from the first source/drain region to the second source/drain region;
        a first dielectric layer contacting the first sidewalls and the second sidewalls of the first semiconductor layers, the first dielectric layer extending into a region between the first plane and the second plane; and
        a first gate electrode over the first dielectric layer; and
    a second transistor comprising:
        a second channel region comprising the alternating first semiconductor layers and second semiconductor layers above the substrate, each of the second semiconductor layers in the second channel region having a third sidewall and a fourth sidewall, the third sidewalls being aligned along a third plane, the fourth sidewalls being aligned along a second plane, sidewalls of the first semiconductor layers in the second channel region being between the third plane and the fourth plane;
        a third source/drain region and a fourth source/drain region disposed on opposite sides of the second channel region, each of the first semiconductor layers extending from the third source/drain region to the fourth source/drain region;
        a second dielectric layer contacting the third sidewalls and the fourth sidewalls of the first semiconductor layers; and
        a second gate electrode over the second dielectric layer.

2. The structure of claim 1, wherein each of the first semiconductor layers have a top surface and a bottom surface, the first dielectric layer contacting the top surfaces and the bottom surfaces of the first semiconductor layers.

3. The structure of claim 2, wherein each of the first semiconductor layers is compressively strained.

4. The structure of claim 2, wherein each of the first semiconductor layers is tensilely strained.

5. The structure of claim 1, wherein each of the second semiconductor layers has a notched lateral side having a surface of a crystalline plane, the notched lateral sides extending between the first plane and the second plane.

6. The structure of claim 1, wherein each of the second semiconductor layers has a notched lateral side having a surface that is not a crystalline plane, the notched lateral sides extending between the first plane and the second plane.

7. The structure of claim 1, wherein each of the first semiconductor layers is compressively strained, and wherein each of the second semiconductor layers is tensilely strained.

8. The structure of claim 1, wherein each of the first semiconductor layers is tensilely strained, and wherein each of the second semiconductor layers is compressively strained.

9. The structure of claim 1, wherein the first transistor is an n-type transistor.

10. The structure of claim 1, further comprising a buffer layer interposed between a bottommost first semiconductor layer and the substrate.

11. A structure comprising:
    an n-type device comprising:
        a first channel region comprising a first superlattice, the first superlattice comprising alternating first layers and second layers, the first layers being a first semiconductor material, the second layers being a second semiconductor material, each of the first layers has a first sidewall and a second sidewall in the first channel region, the first sidewalls being aligned along a first plane, the second sidewalls being aligned along a second plane, side surfaces of the second layers being between the first plane and the second plane,
        a first source/drain region and a second source/drain region disposed on opposite sides of the first channel region, each of the first layers and the second layers extending from the first source/drain region to the second source/drain region,
        a first gate dielectric on the first superlattice, and
        a first gate electrode on the first gate dielectric; and
    a p-type device comprising:
        a second channel region comprising a second superlattice, the second superlattice comprising alternating third layers and fourth layers, the third layers being the first semiconductor material, the fourth layers being the second semiconductor material, the first semiconductor material and the second semiconductor material being ordered in the second superlattice a same order as in the first superlattice, each of the fourth layers has a third sidewall and a fourth sidewall in the second channel region, the third sidewalls being aligned along a third plane, the fourth sidewalls being aligned along a fourth plane, side surfaces of the third layers being between the third plane and the fourth plane,
        a third source/drain region and a fourth source/drain region disposed on opposite sides of the second channel region, each of the third layers and the fourth layers extending from the third source/drain region to the fourth source/drain region, a second gate dielectric on the second superlattice, and
a second gate electrode on the second gate dielectric.

12. The structure of claim 11, wherein each of the first layers and the third layers are compressively strained, and each of the second layers and the fourth layers are tensilely strained.

13. The structure of claim 11, wherein sidewalls of the first layers are recessed from sidewalls of the second layers.

14. The structure of claim 13, wherein sidewalls of the fourth layers are recessed from sidewalls of the third layers.

15. A structure comprising:
a first fin and a second fin extending upwards from a substrate, each of the first fin and the second fin comprising alternating first layers of a first material and second layers of a second material, sidewalls of the second layers in a first channel region of the first fin being recessed from sidewalls of the first layers, sidewalls of the first layers in a second channel region of the second fin being recessed from sidewalls of the first fin;

a first gate dielectric over and extending continuously along sidewalls of the first layer and the second layer in the first channel region;
a second gate dielectric over and extending continuously along sidewalls of the first layer and the second layer in the second channel region;
a first conductive gate over the first gate dielectric; and
a second conductive gate over the second gate dielectric.

16. The structure of claim 15, wherein each of the first layers is compressively strained.

17. The structure of claim 15, wherein each of the first layers is tensilely strained.

18. The structure of claim 15, wherein sidewalls of the second layers are curved.

19. The structure of claim 15, wherein sidewalls of the second layers comprise linear sections.

20. The structure of claim 15, wherein the first channel region is a channel region of an n-type transistor.

* * * * *